US012787637B2

(12) United States Patent
Uvarov et al.

(10) Patent No.: US 12,787,637 B2
(45) Date of Patent: *Nov. 3, 2026

(54) COMPOUND, SEMICONDUCTOR LAYER COMPRISING COMPOUND AND ORGANIC ELECTRONIC DEVICE

(71) Applicant: Novaled GmbH, Dresden (DE)

(72) Inventors: Vladimir Uvarov, Dresden (DE); Steffen Willmann, Dresden (DE); Ulrich Heggemann, Dresden (DE)

(73) Assignee: Novaled GmbH, Dresden (DE)

( * ) Notice: Subject to any disclaimer, the term of this patent is extended or adjusted under 35 U.S.C. 154(b) by 0 days.

This patent is subject to a terminal disclaimer.

(21) Appl. No.: 18/692,191

(22) PCT Filed: Sep. 19, 2022

(86) PCT No.: PCT/EP2022/075943

§ 371 (c)(1),
(2) Date: Mar. 14, 2024

(87) PCT Pub. No.: WO2023/041778

PCT Pub. Date: Mar. 23, 2023

(65) Prior Publication Data

US 2024/0381760 A1 Nov. 14, 2024

(30) Foreign Application Priority Data

Sep. 20, 2021 (EP) .................................... 21197667
Sep. 20, 2021 (EP) .................................... 21197750
Sep. 20, 2021 (EP) .................................... 21197757

(51) Int. Cl.
*H01B 1/12* (2006.01)
*C07F 1/08* (2006.01)
(Continued)

(52) U.S. Cl.
CPC ............ *H10K 85/371* (2023.02); *C07F 1/08* (2013.01); *C09K 11/06* (2013.01); *H01B 1/12* (2013.01);
(Continued)

(58) Field of Classification Search
CPC .......... H01B 1/00; H01B 1/12; C07D 213/60; C09K 11/00; C07C 49/15; C07F 1/08; H10K 50/17; H10K 85/371
See application file for complete search history.

(56) References Cited

U.S. PATENT DOCUMENTS

2015/0200374 A1 7/2015 Hartmann et al.
2023/0242562 A1* 8/2023 Uvarov ................ H10K 85/331 257/40
2023/0247896 A1* 8/2023 Uvarov ................... C09B 57/10 252/519.21

FOREIGN PATENT DOCUMENTS

CN 111018921 A 4/2020
JP 2010122269 A 6/2010
(Continued)

OTHER PUBLICATIONS

Omoregie et al "Physicochemical studies of copper(II) β-diketonate: Magnetic and spectral properties of copper(II) complexes of 2-alkyl-1-phenyl-1,3-butanedione, their 2,2'-bipyridine and 1,10-phenanthroline adducts", Archives of Applied Science Research, 2010, 2 (4): 7-16.*
(Continued)

*Primary Examiner* — Mark Kopec
(74) *Attorney, Agent, or Firm* — Eversheds Sutherland (US) LLP

(57) ABSTRACT

The present invention relates to a compound represented by Formula (I) wherein M is Cu, Zn, Al, Hf; or Formula (V).
(Continued)

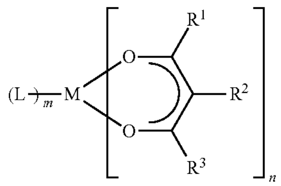

(I)

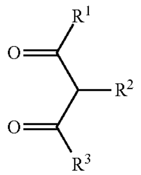

(V)

18 Claims, 3 Drawing Sheets

(51) Int. Cl.

| | |
|---|---|
| ***C09K 11/06*** | (2006.01) |
| ***H10K 85/30*** | (2023.01) |
| *H10K 50/17* | (2023.01) |

(52) U.S. Cl.

CPC ................. *C09K 2211/1007* (2013.01); *C09K 2211/1029* (2013.01); *C09K 2211/188* (2013.01); *H10K 50/17* (2023.02)

(56) References Cited

FOREIGN PATENT DOCUMENTS

| | | | |
|---|---|---|---|
| KR | 20040071363 | A | 8/2004 |
| KR | 20070065551 | A | 6/2007 |
| KR | 20230042494 | A | 3/2023 |
| KR | 20230042592 | A | 3/2023 |
| RU | 2671964 | C1 | 11/2018 |
| WO | 2016188604 | A1 | 12/2016 |

OTHER PUBLICATIONS

International Preliminary Report on Patentability issued in international application No. PCT/EP2022/075943, dated Mar. 26, 2024 (11 pages).

International Search Report and Written Opinion issued in international application No. PCT/EP2022/075943, dated Mar. 31, 2023 (15 pages).

Omoregie, H. Oluwatola et al., Synthesis, Spectroscopic Properties and Structural Studies of Copper(II) Complexes of 2-Substituted-1,3-Diphenyl-1,3-Propanedione, Their 2,2'-Bipyridine and 1,10-Phenanthroline Adducts, International Journal of Chemistry, vol. 6, No. 1, Jan. 25, 2014, pp. 71-82.

* cited by examiner

COMPOUND, SEMICONDUCTOR LAYER COMPRISING COMPOUND AND ORGANIC ELECTRONIC DEVICE

CROSS-REFERENCE TO RELATED APPLICATIONS

This application is a U.S. national phase entry of PCT/EP2022/075943, filed Sep. 19, 2022, which claims priority to European Patent Application No. 21197757.4, filed Sep. 20, 2021, and claims priority to European Patent Application No. 21197750.9, filed Sep. 20, 2021, and claims priority to European Patent Application No. 21197667.5, filed Sep. 20, 2021. The content of these applications is incorporated by reference herein.

TECHNICAL FIELD

The present invention relates to a compound, a semiconductor layer comprising the compound and an organic electronic device comprising at least one compound thereof.

BACKGROUND ART

Electronic devices, such as organic light-emitting diodes OLEDs, which are self-emitting devices, have a wide viewing angle, excellent contrast, quick response, high brightness, excellent operating voltage characteristics, and color reproduction. A typical OLED comprises an anode layer, a hole injection layer HIL, a hole transport layer HTL, an emission layer EML, an electron transport layer ETL, and a cathode layer, which are sequentially stacked on a substrate. In this regard, the HIL, the HTL, the EML, and the ETL are thin films formed from organic compounds.

When a voltage is applied to the anode and the cathode, holes injected from the anode move to the EML, via the HIL and HTL, and electrons injected from the cathode move to the EML, via the ETL. The holes and electrons recombine in the EML to generate excitons. When the excitons drop from an excited state to a ground state, light is emitted. The injection and flow of holes and electrons should be balanced, so that an OLED having the above-described structure has low operating voltage, excellent efficiency and/or a long lifetime.

Performance of an organic light emitting diode may be affected by characteristics of the hole injection layer, and among them, may be affected by characteristics of the hole transport compound and the metal complexes which are contained in the hole injection layer.

US 2015200374 A relates to a hole injection layer consisting of quadratic planar mononuclear transition metal complexes such as copper 2+ complexes, for example, which are embedded into a hole-conducting matrix.

WO 2016/188604 A1 relates to a composition at least one hole-transport or/and one hole-injection material and at least one metal complex as a p-dopant.

JP 2010122269 A relates to an electrophotographic toner which takes on a good hue, exhibits good light resistance and good humidity dependency of charging property (water resistance, charge stability), and avoids void generation in an image during image formation, and to provide a metal-containing compound therefor.

Omoregie H. Oluwatola ET AL: "Synthesis, Spectroscopic Properties and Structural Studies of Copper (II) Complexes of 2 Substituted-1,3-0iphenyl-1,3-Propanedione, Their 2,2'-Bipyridine and 1,1 O-Phenanthroline Adducts", International Journal of Chemistry, vol. 6, no. 1, 25 Jan. 2014 (2014-01-25), XP055893094, Toronto; ISSN: 1916-9698, 001:10.5539/ijc. v6n1 p71.

Performance of an organic light emitting diode may be affected by characteristics of the semiconductor layer, and among them, may be affected by characteristics of metal complexes which are also contained in the semiconductor layer.

There remains a need to improve performance of compounds, suitable for us as semiconductor materials, semiconductor layers, as well as electronic devices thereof, in particular to achieve improved operating voltage stability over time through improving the characteristics of the compounds comprised therein.

Further there remains a need to improve performance of compounds, suitable for us as semiconductor materials, with improved thermal properties and/or solubility in organic solvents.

Further there remains a need to improve performance of electronic devices by providing hole injection layers with improved performance, in particular to achieve improved operating voltage through improving the characteristics of the hole injection layer and the electronic device.

DISCLOSURE

An aspect of the present invention provides a compound selected from the group comprising:

Formula (I):

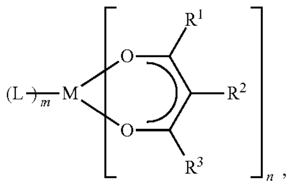

(I)

wherein

M is Cu, Zn, Al, Hf;

L is a charge-neutral ligand, which coordinates to the metal M;

n is an integer selected from 2, 3 or 4, which corresponds to the oxidation number of M;

m is an integer selected from 0 to 2;

$R^1$ is independently selected from substituted or unsubstituted $C_6$ to $C_{24}$ aryl and substituted or unsubstituted $C_2$ to $C_{24}$ heteroaryl group comprising at least 6 ring-forming atoms, wherein at least one substituent is selected from F, CN, substituted or unsubstituted $C_1$ to $C_{12}$ alkyl, partially or fully fluorinated $C_1$ to $C_{12}$ alkyl, substituted or unsubstituted $C_6$ to $C_{18}$ aryl, and substituted or unsubstituted $C_2$ to $C_{18}$ heteroaryl, wherein the substituents of the substituted or unsubstituted $C_1$ to $C_{12}$ alkyl, substituted or unsubstituted $C_6$ to $C_{18}$ aryl, and substituted or unsubstituted $C_2$ to $C_{18}$ heteroaryl are selected from halogen, F, CN, $C_1$ to $C_6$ alkyl, $CF_3$; wherein at least one substituent is selected from partially or fully fluorinated $C_1$ to $C_{12}$ alkyl, or CN;

$R^2$ is selected from CN, $C_1$ to $C_4$ alkyl, partially or perfluorinated $C_1$ to $C_4$ alkyl, or F;

$R^3$ is independently selected from substituted $C_1$ to $C_{12}$ alkyl, substituted or unsubstituted $C_6$ to $C_{24}$ aryl, and substituted or unsubstituted $C_2$ to $C_{24}$ heteroaryl group comprising at least 6 ring-forming atoms, wherein at least one substituent is selected from F, CN, substituted or unsubstituted $C_1$ to $C_{12}$ alkyl, partially or fully fluorinated $C_1$ to $C_{12}$ alkyl, substituted or unsubstituted $C_6$ to $C_{18}$ aryl, and substituted or unsubstituted $C_2$ to $C_{18}$ heteroaryl, wherein the substituents of the substituted or unsubstituted $C_1$ to $C_{12}$ alkyl, substituted or unsubstituted $C_6$ to $C_{18}$ aryl, and substituted or unsubstituted $C_2$ to $C_{18}$ heteroaryl are selected from F, CN, C to $C_6$ alkyl, $CF_3$;

or

Formula (V):

(V)

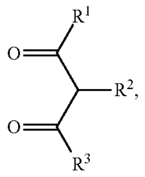

wherein $R^1$ is selected from formula D69

(D69)

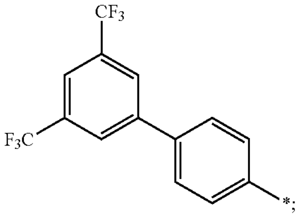

$R^2$ is selected from CN, $C_1$ to $C_4$ alkyl, partially or perfluorinated $C_1$ to $C_4$ alkyl, or F;

$R^3$ is independently selected from substituted $C_1$ to $C_{12}$ alkyl, wherein at least one substituent is selected from F, CN, substituted or unsubstituted $C_1$ to $C_{12}$ alkyl, partially or fully fluorinated $C_1$ to $C_{12}$ alkyl, substituted or unsubstituted $C_6$ to $C_{18}$ aryl, and substituted or unsubstituted $C_2$ to $C_{18}$ heteroaryl, wherein the substituents of the substituted or unsubstituted $C_1$ to $C_{12}$ alkyl, substituted or unsubstituted $C_6$ to $C_{18}$ aryl, and substituted or unsubstituted $C_2$ to $C_{18}$ heteroaryl are selected from F, CN, $C_1$ to $C_6$ alkyl, $CF_3$.

According to one embodiment, wherein the compound is selected from the group comprising:

Formula (I):

(I)

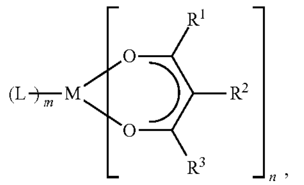

wherein

M is Cu, Zn, Al, Hf;

L is a charge-neutral ligand, which coordinates to the metal M;

n is an integer selected from 2, 3 or 4, which corresponds to the oxidation number of M;

m is an integer selected from 0 to 2;

$R^1$ is independently selected from substituted or unsubstituted $C_6$ to $C_{24}$ aryl and substituted or unsubstituted $C_2$ to $C_{24}$ heteroaryl group comprising at least 6 ring-forming atoms, wherein at least one substituent is selected from F, CN, substituted or unsubstituted $C_1$ to $C_{12}$ alkyl, partially or fully fluorinated $C_1$ to $C_{12}$ alkyl, substituted or unsubstituted $C_6$ to $C_{18}$ aryl, and substituted or unsubstituted $C_2$ to $C_{18}$ heteroaryl, wherein the substituents of the substituted or unsubstituted $C_1$ to $C_{12}$ alkyl, substituted or unsubstituted $C_6$ to $C_{18}$ aryl, and substituted or unsubstituted $C_2$ to $C_{18}$ heteroaryl are selected from halogen, F, CN, $C_1$ to $C_6$ alkyl, $CF_3$; wherein at least one substituent is selected from partially or fully fluorinated $C_1$ to $C_{12}$ alkyl, or CN;

$R^2$ is selected from CN, $C_1$ to $C_4$ alkyl, partially or perfluorinated $C_1$ to $C_4$ alkyl, or F;

$R^3$ is independently selected from substituted $C_1$ to $C_{12}$ alkyl, substituted or unsubstituted $C_6$ to $C_{24}$ aryl, and substituted or unsubstituted $C_2$ to $C_{24}$ heteroaryl group comprising at least 6 ring-forming atoms, wherein at least one substituent is selected from F, CN, substituted or unsubstituted $C_1$ to $C_{12}$ alkyl, partially or fully fluorinated $C_1$ to $C_{12}$ alkyl, substituted $C_6$ to $C_{18}$ aryl, and substituted or unsubstituted $C_2$ to $C_{18}$ heteroaryl, wherein the substituents of the substituted or unsubstituted $C_1$ to $C_{12}$ alkyl, substituted or unsubstituted $C_6$ to $C_{18}$ aryl, and substituted or unsubstituted $C_2$ to $C_{18}$ heteroaryl are selected from F, CN, $C_1$ to $C_6$ alkyl, $CF_3$;

or

Formula (V):

(V)

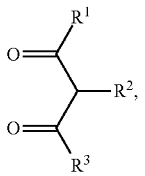

wherein $R^1$ is selected from formula D69

(D69)

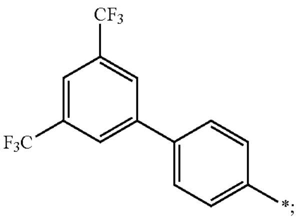

$R^2$ is selected from CN, $C_1$ to $C_4$ alkyl, partially or perfluorinated $C_1$ to $C_4$ alkyl, or F;

$R^3$ is independently selected from substituted $C_1$ to $C_{12}$ alkyl, wherein at least one substituent is selected from F, CN, substituted or unsubstituted $C_1$ to $C_{12}$ alkyl, partially or fully fluorinated $C_1$ to $C_{12}$ alkyl, substituted or unsubstituted $C_6$ to $C_{18}$ aryl, and substituted or unsubstituted $C_2$ to $C_{18}$ heteroaryl, wherein the substituents of the substituted or unsubstituted $C_1$ to $C_{12}$ alkyl, substituted or unsubstituted $C_6$ to $C_{18}$ aryl, and substituted or unsubstituted $C_2$ to $C_{18}$ heteroaryl are selected from F, CN, $C_1$ to $C_6$ alkyl, $CF_3$.

According to one embodiment $R^3$ is independently selected from substituted $C_1$ to $C_{12}$ alkyl, substituted or unsubstituted $C_6$ to $C_{24}$ aryl, and substituted or unsubstituted $C_2$ to $C_{24}$ heteroaryl group comprising at least 6 ring-forming atoms, wherein at least one substituent is selected from F, CN, substituted or unsubstituted $C_1$ to $C_{12}$ alkyl, partially or fully fluorinated $C_1$ to $C_{12}$ alkyl, substituted $C_6$ to $C_{18}$ aryl, and substituted or unsubstituted $C_2$ to $C_{18}$ heteroaryl, wherein the substituents of the substituted or unsubstituted $C_1$ to $C_{12}$ alkyl, substituted or unsubstituted $C_6$ to $C_{18}$ aryl, and substituted or unsubstituted $C_2$ to $C_{18}$ heteroaryl are selected from F, CN, $C_1$ to $C_6$ alkyl, $CF_3$.

According to one embodiment the compound can be represented by Formula (I):

(I)

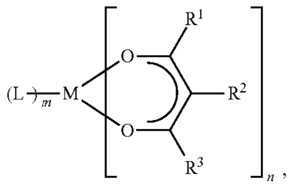

wherein

M is Cu, Zn, Al, Hf;

L is a charge-neutral ligand, which coordinates to the metal M;

n is an integer selected from 2, 3 or 4, which corresponds to the oxidation number of M;

m is an integer selected from 0 to 2;

$R^1$ is independently selected from substituted or unsubstituted $C_6$ to $C_{24}$ aryl and substituted or unsubstituted $C_2$ to $C_{24}$ heteroaryl group comprising at least 6 ring-forming atoms, wherein at least one substituent is selected from F, CN, substituted or unsubstituted $C_1$ to $C_{12}$ alkyl, partially or fully fluorinated $C_1$ to $C_{12}$ alkyl, substituted or unsubstituted $C_6$ to $C_{18}$ aryl, and substituted or unsubstituted $C_2$ to $C_{18}$ heteroaryl, wherein the substituents of the substituted or unsubstituted $C_1$ to $C_{12}$ alkyl, substituted or unsubstituted $C_6$ to $C_{18}$ aryl, and substituted or unsubstituted $C_2$ to $C_{18}$ heteroaryl are selected from halogen, F, CN, $C_1$ to $C_6$ alkyl, $CF_3$; wherein at least one substituent is selected from partially or fully fluorinated $C_1$ to $C_{12}$ alkyl, or CN;

$R^2$ is selected from CN, $C_1$ to $C_4$ alkyl, partially or perfluorinated $C_1$ to $C_4$ alkyl, or F;

$R^3$ is independently selected from substituted $C_1$ to $C_{12}$ alkyl, substituted or unsubstituted $C_6$ to $C_{24}$ aryl, and substituted or unsubstituted $C_2$ to $C_{24}$ heteroaryl group comprising at least 6 ring-forming atoms, wherein at least one substituent is selected from F, CN, substituted or unsubstituted $C_1$ to $C_{12}$ alkyl, partially or fully fluorinated $C_1$ to $C_{12}$ alkyl, substituted or unsubstituted $C_6$ to $C_{18}$ aryl, preferably substituted $C_6$ to $C_{18}$, aryl, and substituted or unsubstituted $C_2$ to $C_{18}$ heteroaryl, wherein the substituents of the substituted or unsubstituted $C_1$ to $C_{12}$ alkyl, substituted or unsubstituted $C_6$ to $C_{18}$ aryl, and substituted or unsubstituted $C_2$ to $C_{18}$ heteroaryl are selected from F, CN, $C_1$ to $C_6$ alkyl, $CF_3$.

According to one embodiment the compound can be represented by Formula (I):

(I)

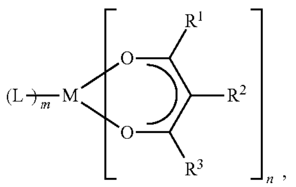

wherein

M is Cu, Zn, Al, Hf;

L is a charge-neutral ligand, which coordinates to the metal M;

n is an integer selected from 2, 3 or 4, which corresponds to the oxidation number of M;

m is an integer selected from 0 to 2;

$R^1$ is independently selected from substituted or unsubstituted $C_6$ to $C_{24}$ aryl and substituted or unsubstituted $C_2$ to $C_{24}$ heteroaryl group comprising at least 6 ring-forming atoms, wherein at least one substituent is selected from F, CN, substituted or unsubstituted $C_1$ to $C_{12}$ alkyl, partially or fully fluorinated $C_1$ to $C_{12}$ alkyl, substituted or unsubstituted $C_6$ to $C_{18}$ aryl, and substituted or unsubstituted $C_2$ to $C_{18}$ heteroaryl, wherein the substituents of the substituted or unsubstituted $C_1$ to $C_{12}$ alkyl, substituted or unsubstituted $C_6$ to $C_{18}$ aryl, and substituted or unsubstituted $C_2$ to $C_{18}$ heteroaryl are selected from halogen, F, CN, $C_1$ to $C_6$ alkyl, $CF_3$; wherein at least one substituent is selected from partially or fully fluorinated $C_1$ to $C_{12}$ alkyl, or CN;

$R^2$ is selected from CN, $C_1$ to $C_4$ alkyl, partially or perfluorinated $C_1$ to $C_4$ alkyl, or F;

$R^3$ is independently selected from substituted $C_1$ to $C_{12}$ alkyl, substituted or unsubstituted $C_6$ to $C_{24}$ aryl, and substituted or unsubstituted $C_2$ to $C_{24}$ heteroaryl group comprising at least 6 ring-forming atoms, wherein at least one substituent is selected from F, CN, substituted or unsubstituted $C_1$ to $C_{12}$ alkyl, partially or fully fluorinated $C_1$ to $C_{12}$ alkyl, substituted or unsubstituted $C_6$ to $C_{18}$ aryl, preferably substituted $C_6$ to $C_{18}$, aryl, and substituted or unsubstituted $C_2$ to $C_{18}$ heteroaryl, wherein the substituents of the substituted or unsubstituted $C_1$ to $C_{12}$ alkyl, substituted or unsubstituted $C_6$ to $C_{18}$ aryl, and substituted or unsubstituted $C_2$ to $C_{18}$ heteroaryl are selected from F, CN, $C_1$ to $C_6$ alkyl, $CF_3$;

wherein the LUMO of the compound of formula (I) is selected in the range of ≤−3.9 eV and ≥−6 eV; whereby the LUMO levels of the compounds of formula (I) may be calculated with the program package TURBOMOLE V6.5 (TURBOMOLE GmbH, Litzenhardtstrasse 19, 76135 Karlsruhe, Germany), wherein the energies of the LUMO are obtained from a geometry optimization at the TPSSh/Def2-SVP level of the theory with inclusion of solvent effects via the COSMO (COnductor-like Screening MOdel) model with a dielectric constant (ε) set to be equal to 3; wherein for M=Hf, the basis set Def-SV(P) was used instead; and wherein all the calculations were performed with TURBOMOLE; whereby if more than one conformation is viable, the conformation with the lowest total energy is selected and if more than one spin state is viable, the spin state with the lowest total energy is selected.

Definitions

It should be noted that throughout the application and the claims any $R^1$, $R^2$, $R^3$, L and M. always refer independently from each other to the same moieties according to their definition, unless otherwise noted.

In the present specification, when a definition is not otherwise provided, "substituted" refers to a substituted selected from substituted or unsubstituted $C_1$ to $C_{12}$ alkyl, partially or fully fluorinated $C_1$ to $C_{12}$ alkyl, substituted or unsubstituted $C_6$ to $C_{24}$ aryl, and substituted or unsubstituted $C_2$ to $C_{24}$ heteroaryl, wherein the substituents are selected from the substituents of the substituted or unsubstituted $C_1$ to $C_{12}$ alkyl, substituted or unsubstituted $C_6$ to $C_{18}$ aryl, and substituted or unsubstituted $C_2$ to $C_{18}$ heteroaryl are selected from selected from halogen, F, CN, $C_1$ to $C_6$ alkyl, $CF_3$.

In the present specification, "aryl group" and "aromatic rings" refers to a hydrocarbyl group which may be created by formal abstraction of one hydrogen atom from an aromatic ring in the corresponding aromatic hydrocarbon. Aromatic hydrocarbon refers to a hydrocarbon which contains at least one aromatic ring or aromatic ring system. Aromatic ring or aromatic ring system refers to a planar ring or ring system of covalently bound carbon atoms, wherein the planar ring or ring system comprises a conjugated system of delocalized electrons fulfilling Hückel's rule. Examples of aryl groups include monocyclic groups like phenyl or tolyl, polycyclic groups which comprise more aromatic rings linked by single bonds, like biphenyl, and polycyclic groups comprising fused rings, like naphthyl or fluorenyl.

Analogously, under "heteroaryl" and "heteroaromatic", it is especially where suitable understood a group derived by formal abstraction of one ring hydrogen from a heterocyclic aromatic ring in a compound comprising at least one such ring.

The term "non-heterocycle" is understood to mean a ring or ring-system comprising no hetero-atom as a ring member.

The term "heterocycle" is understood to mean that the heterocycle comprises at least one ring comprising one or more hetero-atoms. A heterocycle comprising more than one ring means that all rings comprising a hetero-atom or at least one ring comprising a hetero atom and at least one ring comprising C-atoms only and no hetero atom. A $C_2$ heteroaryl group means that an heteroaryl ring comprises two C-Atoms and the other atoms are hetero-atoms.

Under heterocycloalkyl, it is especially where suitable understood a group derived by formal abstraction of one ring hydrogen from a saturated cycloalkyl ring in a compound comprising at least one such ring.

The term "aryl" having at least 9 C-atoms may comprise at least one fused aryl ring. The term "heteroaryl" having at least 9 atoms may comprise at least one fused heteroaryl ring fused with a heteroaryl ring or fused with an aryl ring.

The term "fused aryl rings" or "condensed aryl rings" is understood the way that two aryl rings are considered fused or condensed when they share at least two common sp2-hybridized carbon atoms.

The term "fused ring system" is understood to mean a ring system wherein two or more rings share at least two atoms.

The term "5-, 6- or 7-member ring" is understood to mean a ring comprising 5, 6 or 7 atoms. The atoms may be selected from C and one or more hetero-atoms.

In the present specification, the single bond refers to a direct bond.

In the present specification, when a definition is not otherwise provided, "substituted" refers to one substituted with a H, deuterium, $C_1$ to $C_{12}$ alkyl, unsubstituted $C_6$ to $C_{18}$ aryl, and unsubstituted $C_2$ to $C_{18}$ heteroaryl.

In the present specification "substituted aryl" refers for example to a $C_6$ to $C_{24}$ aryl or $C_6$ to $C_{18}$ aryl that is substituted with one or more substituents, wherein the substituent may be substituted with none, one or more substituents.

Correspondingly, in the present specification "substituted heteroaryl substituted" refers to a substitution with one or more substituents, which themselves may be substituted with one or more substituents.

In the present specification, when a definition is not otherwise provided, a substituted heteroaryl group with at least 2 C-ring atoms may be substituted with one or more substituents. For example, a substituted $C_2$ heteroaryl group may have 1 or 2 substituents.

A substituted aryl group with at least 6 ring atoms may be substituted with 1, 2, 3, 4 or 5 substituents.

A substituted heteroaryl group may comprise at least 6 ring atoms. A substituted heteroaryl group that may comprise at least 6 ring atoms may be substituted with 1, 2, 3 or 4 substituents, if the heteroaryl group comprises one hetero atom and five C-atoms, or it may be substituted with 1, 2 or 3 substituents, if the heteroaryl group with at least 6 ring atoms comprises two hetero atom and four C-atoms, or may be substituted with 1 or 2 substituents, if the heteroaryl group with at least 6 ring atoms comprises three hetero atoms and three C-atoms, wherein the substituent is bonded to the C-ring atoms only.

In the present specification, when a definition is not otherwise provided, an "alkyl group" refers to a saturated aliphatic hydrocarbyl group. The alkyl group may be a $C_1$ to $C_{12}$ alkyl group. More specifically, the alkyl group may be a $C_1$ to $C_{10}$ alkyl group or a $C_1$ to $C_6$ alkyl group. For example, a $C_1$ to $C_4$ alkyl group includes 1 to 4 carbons in alkyl chain, and may be selected from methyl, ethyl, propyl, iso-propyl, n-butyl, iso-butyl, sec-butyl, tert-butyl, cyclohexyl.

Specific examples of the alkyl group may be a methyl group, an ethyl group, a propyl group, an iso-propyl group, a butyl group, an iso-butyl group, a sec-butyl group, a tert-butyl group, a pentyl group, a branched pentyl group, a hexyl group, a cyclopropyl group, a cyclobutyl group, a cyclopentyl group, a cyclohexyl group, an adamantly group and the like.

In the present specification, when a definition is not otherwise provided, a "substituted alkyl group" may refer to a linear, branched or cyclic substituted saturated aliphatic hydrocarbyl group. The substituted alkyl group may be a linear, branched or cyclic $C_1$ to $C_{12}$ alkyl group. More specifically, the substituted alkyl group may be a linear, branched or cyclic substituted $C_1$ to $C_{10}$ alkyl group or a linear, branched or cyclic substituted $C_1$ to $C_6$ alkyl group. For example, a linear, branched or cyclic substituted $C_1$ to $C_4$ alkyl group includes 1 to 4 carbons in the alkyl chain, and may be selected from methyl, ethyl, propyl, iso-propyl, n-butyl, iso-butyl, sec-butyl, tert-butyl and cyclohexyl. The substituents may be selected from halogen, F, Cl, CN, $OCH_3$, $OCF_3$.

The term "hetero" is understood the way that at least one carbon atom, in a structure which may be formed by covalently bound carbon atoms, is replaced by another polyvalent atom.

Preferably, the heteroatoms are selected from B, Si, N, P, O, S; further preferred from N, P, O, S and most preferred N.

In the present specification, when a substituent is not named, the substituent may be a H.

The term "charge-neutral" means that the group L is overall electrically neutral.

In the context of the present invention, "different" means that the compounds do not have an identical chemical structure.

The term "free of", "does not contain", "does not comprise" does not exclude impurities which may be present in the compounds prior to deposition. Impurities have no technical effect with respect to the object achieved by the present invention.

The term "contacting sandwiched" refers to an arrangement of three layers whereby the layer in the middle is in direct contact with the two adjacent layers.

The terms "light-absorbing layer" and "light absorption layer" are used synonymously.

The terms "light-emitting layer", "light emission layer" and "emission layer" are used synonymously.

The terms "OLED", "organic light-emitting diode" and "organic light-emitting device" are used synonymously.

The terms anode, anode layer and anode electrode are used synonymously.

The term "at least two anode sub-layers" is understood to mean two or more anode sub-layers, for example two or three anode sub-layers.

The terms cathode, cathode layer and cathode electrode are used synonymously.

The term "hole injection layer" is understood to mean a layer which improves charge injection from the anode layer into further layers in the electronic device or from further layers of the electronic device into the anode.

The term "hole transport layer" is understood to mean a layer which transports holes between the hole injection layer and further layers arranged between the hole injection layer and the cathode layer.

The operating voltage U is measured in Volt.

In the context of the present specification the term "essentially non-emissive" or "non-emissive" means that the contribution of the compound of formula (I) or the hole injection layer comprising a compound of formula (I), to the visible emission spectrum from an electronic device, such as OLED or display device, is less than 10%, preferably less than 5% relative to the visible emission spectrum. The visible emission spectrum is an emission spectrum with a wavelength of about ≥380 nm to about ≤780 nm.

In the context of the present invention, the term "sublimation" may refer to a transfer from solid state to gas phase or from liquid state to gas phase.

In the specification, hole characteristics refer to an ability to donate an electron to form a hole when an electric field is applied and that a hole formed in the anode may be easily injected into the emission layer and transported in the emission layer due to conductive characteristics according to a highest occupied molecular orbital (HOMO) level.

In addition, electron characteristics refer to an ability to accept an electron when an electric field is applied and that electrons formed in the cathode may be easily injected into the emission layer and transported in the emission layer due to conductive characteristics according to a lowest unoccupied molecular orbital (LUMO) level.

The term "HOMO level" is understood to mean the highest occupied molecular orbital and is determined in eV (electron volt).

The term "HOMO level further away from vacuum level" is understood to mean that the absolute value of the HOMO level is higher than the absolute value of the HOMO level of the reference compound. For example, the term "further away from vacuum level than the HOMO level of N2,N2,N2',N2',N7,N7,N7',N7'-octakis(4-methoxyphenyl)-9,9'-spirobi[fluorene]-2,2',7,7'-tetraamine is understood to mean that the absolute value of the HOMO level of the matrix compound of the hole injection layer is higher than the HOMO level of N2,N2,N2',N2',N7,N7,N7',N7'-octakis(4-methoxyphenyl)-9,9'-spirobi[fluorene]-2,2',7,7'-tetraamine.

The term "absolute value" is understood to mean the value without the "-" symbol. According to one embodiment of the present invention, the HOMO level of the matrix compound of the hole injection layer may be calculated by quantum mechanical methods.

The term "LUMO level" is understood to mean the lowest unoccupied molecular orbital and is determined in eV (electron volt).

The term "LUMO level further away from vacuum level" is understood to mean that the absolute value of the LUMO level is higher than the absolute value of the LUMO level of the reference compound.

Advantageous Effects

Surprisingly, it was found that the electronic device according to the invention solves the problem underlying the present invention by enabling electronic devices, such as organic light-emitting diodes, in various aspects superior over the electronic devices known in the art, in particular with respect to operating voltage.

Additionally, it was found that the problem underlying the present invention may be solved by providing compounds which may be suitable for deposition through vacuum thermal evaporation under conditions suitable for mass production. In particular, the rate onset temperature of the compound of formula (I) of the present invention may be in a range suitable for mass production. In addition the compounds of formula (I) of the present invention shows improved thermal properties and/or solubility in organic solvents.

The compound of Formula (I) is non-emissive. In the context of the present specification the term "essentially non-emissive" or "non-emissive" means that the contribution of the compound of formula (I) to the visible emission spectrum from an electronic device, such as OLED or display device, is less than 10%, preferably less than 5% relative to the visible emission spectrum. The visible emission spectrum is an emission spectrum with a wavelength of about ≥380 nm to about ≤780 nm.

M of the Compound of Formula (I)

The term "M" represents a metal. According to one embodiment, the metal M may be selected from Cu, Zn, Al, Hf; preferably the metal M is selected from Cu(II), Zn(II), Al(III), Hf(IV), more preferred M is Cu(II) or Zn(II), and further more preferred M is Cu(II).

Ligand L of formula (I)

The term "L" represents a charge-neutral ligand, which coordinates to the metal M.

According to one embodiment L is selected from the group comprising $H_2O$, $C_2$ to $C_{40}$mono-or multi-dentate ethers and $C_2$ to $C_{40}$ thioethers, $C_2$ to $C_{40}$ amines, $C_2$ to $C_{40}$ phosphine, $C_2$ to $C_{20}$ alkyl nitrile or $C_2$ to $C_{40}$ aryl nitrile, or a compound according to Formula (II);

(II)

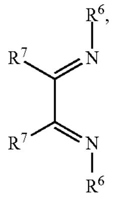

wherein $R^6$ and $R^7$ are independently selected from $C_1$ to $C_{20}$ alkyl, $C_1$ to $C_{20}$ heteroalkyl, $C_6$ to $C_{20}$ aryl, heteroaryl with 5 to 20 ring-forming atoms, halogenated or perhalogenated $C_1$ to $C_{20}$ alkyl, halogenated or perhalogenated $C_1$ to $C_{20}$ heteroalkyl, halogenated or perhalogenated $C_6$ to $C_{20}$ aryl, halogenated or perhalogenated heteroaryl with 5 to 20 ring-forming atoms, or at least one $R^6$ and $R^7$ are bridged and form a 5 to 20 member ring, or the two $R^6$ and/or the two $R^7$ are bridged and form a 5 to 40 member ring or form a 5 to 40 member ring comprising an unsubstituted or $C_1$ to $C_{12}$ substituted phenanthroline.

According to one embodiment, wherein the ligand L in compound of Formula (I) may be selected from a group comprising:

at least three carbon atoms, alternatively at least four carbon atoms, and/or at least two oxygen atoms or one oxygen and one nitrogen atom, two to four oxygen atoms, two to four oxygen atoms and zero to two nitrogen atoms, and/or at least one or more groups selected from halogen, F, CN, substituted or unsubstituted $C_1$ to $C_6$ alkyl, alternatively two or more groups selected from halogen, F, CN, substituted or unsubstituted $C_1$ to $C_6$ alkyl, at least one or more groups selected from halogen, F, CN, substituted $C_1$ to $C_6$ alkyl, alternatively two or more groups selected from halogen, F, CN, perfluorinated $C_1$ to $C_6$ alkyl, one or more groups selected from substituted or unsubstituted $C_1$ to $C_6$ alkyl, substituted or unsubstituted $C_6$ to $C_{12}$ aryl, and/or substituted or unsubstituted $C_3$ to $C_{12}$ heteroaryl, wherein the substituents are selected from D, $C_6$ aryl, $C_3$ to $C_9$ heteroaryl, $C_1$ to $C_6$ alkyl, $C_3$ to $C_6$ branched alkyl, $C_3$ to $C_6$ cyclic alkyl, partially or perfluorinated $C_1$ to $C_{16}$ alkyl, partially or perdeuterated $C_1$ to $C_6$ alkyl, partially or perdeuterated $COR^3$, $COOR^3$, halogen, F or CN;

wherein $R^3$ may be selected from $C_6$ aryl, $C_3$ to $C_9$ heteroaryl, $C_1$ to $C_6$ alkyl, $C_3$ to $C_6$ branched alkyl, $C_3$ to $C_6$ cyclic alkyl, partially or perfluorinated $C_1$ to $C_{16}$ alkyl, partially or perdeuterated $C_1$ to $C_6$ alkyl.

The Term "n"

The term "n" is an integer selected from 2 to 4, which corresponds to the oxidation number of M. According to one embodiment "n" is an integer selected from 2, 3 and 4, which corresponds to the oxidation number of M. According to one embodiment "n" is an integer selected from 2 or 3, which corresponds to the oxidation number of M. According to one embodiment "n" is selected 2. According to another embodiment "n" is selected 4. According to another embodiment "n" is selected 3. Preferably "n" may be selected 2.

The Term "m"

The term "m" is an integer selected from 0 to 2, which corresponds to the oxidation number of M. According to one embodiment "m" is an integer selected from 0 or 1. According to another embodiment "m" is an integer selected from 1. According to another embodiment "m" is an integer selected from 2. Preferably "m" is an integer and may be selected from 0.

Embodiments

The compound represented by Formula (I) can be also named metal complex or metal acetylacetonate complex.

According to one embodiment, the compound of Formula (I) may have a molecular weight Mw of ≥287 g/mol and ≤2000 g/mol, preferably a molecular weight Mw of ≥400 g/mol and ≤1500 g/mol, further preferred a molecular weight Mw of ≥580 g/mol and ≤1500 g/mol, in addition preferred a molecular weight Mw of ≥580 g/mol and ≤1400 g/mol, in addition preferred a molecular weight Mw of ≥580 g/mol and ≤1100 g/mol.

According to one embodiment the compounds A1 to A12 are excluded from Formula (I):

(A1)

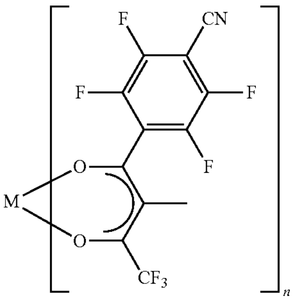

, (A2)

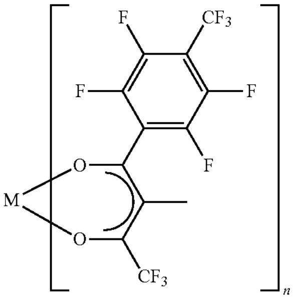

,

-continued
(A3)
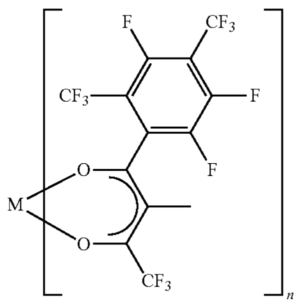
,
(A4)
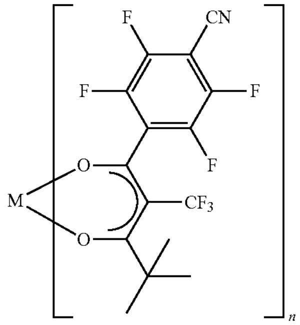
,
(A5)
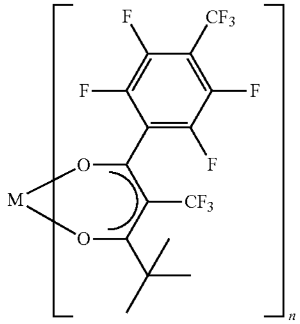
,
(A6)
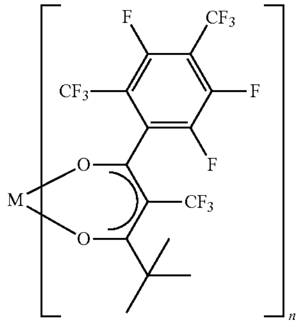
,
(A7)
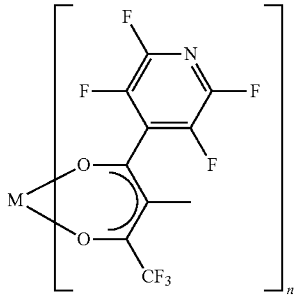
,
-continued
(A8)
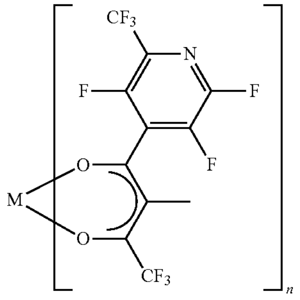
,
(A9)
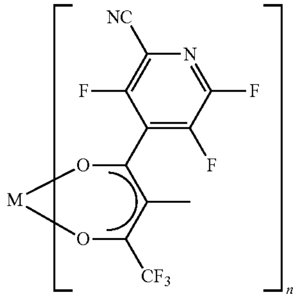
,
(A10)
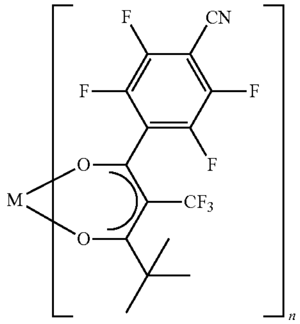
,
(A11)
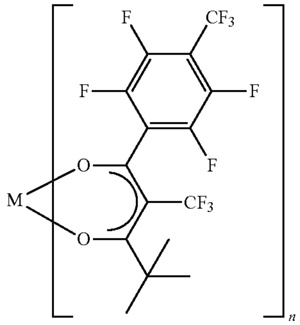
,
(A12)
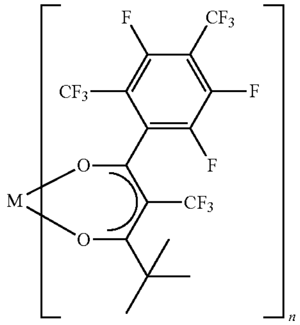
.

According to one embodiment of formula (I), wherein for $R^3$ unsubstituted branched alkyl and/or $CF_3$ are excluded.

According to one embodiment, wherein the compound has the formula (I):

(I)

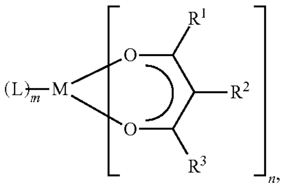

wherein

M is Cu, Zn, Al, Hf;

L is a charge-neutral ligand, which coordinates to the metal M;

n is an integer selected from 2, 3 or 4, which corresponds to the oxidation number of M;

m is an integer selected from 0 to 2;

$R^1$ is independently selected from substituted or unsubstituted $C_6$ to $C_{24}$ aryl and substituted or unsubstituted $C_2$ to $C_{24}$ heteroaryl group comprising at least 6 ring-forming atoms, wherein at least one substituent is selected from F, CN, substituted or unsubstituted $C_1$ to $C_{12}$ alkyl, partially or fully fluorinated $C_1$ to $C_{12}$ alkyl, substituted or unsubstituted $C_6$ to $C_{18}$ aryl, and substituted or unsubstituted $C_2$ to $C_{18}$ heteroaryl, wherein the substituents of the substituted or unsubstituted $C_1$ to $C_{12}$ alkyl, substituted or unsubstituted $C_6$ to $C_{18}$ aryl, and substituted or unsubstituted $C_2$ to $C_{18}$ heteroaryl are selected from halogen, F, CN, $C_1$ to $C_6$ alkyl, $CF_3$; wherein at least one substituent is selected from partially or fully fluorinated $C_1$ to $C_{12}$ alkyl, or CN;

$R^2$ is selected from CN, $C_1$ to $C_4$ alkyl, partially or perfluorinated $C_1$ to $C_4$ alkyl, or F;

$R^3$ is independently selected from substituted $C_1$ to $C_{12}$ alkyl, substituted or unsubstituted $C_6$ to $C_{24}$ aryl, and substituted or unsubstituted $C_2$ to $C_{24}$ heteroaryl group comprising at least 6 ring-forming atoms, wherein at least one substituent is selected from F, CN, substituted or unsubstituted $C_1$ to $C_{12}$ alkyl, partially or fully fluorinated $C_1$ to $C_{12}$ alkyl, substituted or unsubstituted $C_6$ to $C_{18}$ aryl, preferably substituted $C_6$ to $C_{18}$ aryl, and substituted or unsubstituted $C_2$ to $C_{18}$ heteroaryl, wherein the substituents of the substituted or unsubstituted $C_1$ to $C_{12}$ alkyl, substituted or unsubstituted $C_6$ to $C_{18}$ aryl, and substituted or unsubstituted $C_2$ to $C_{18}$ heteroaryl are selected from F, CN, $C_1$ to $C_6$ alkyl, $CF_3$;

and wherein the compounds A1 to A12 are excluded.

According to one embodiment, wherein the compound has the formula (I):

(I)

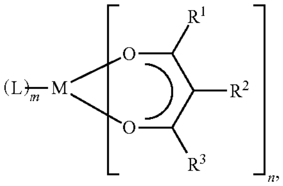

wherein

M is Cu, Zn, Al, Hf;

L is a charge-neutral ligand, which coordinates to the metal M;

n is an integer selected from 2, 3 or 4, which corresponds to the oxidation number of M;

m is an integer selected from 0 to 2;

$R^1$ is independently selected from substituted or unsubstituted $C_6$ to $C_{24}$ aryl and substituted or unsubstituted $C_2$ to $C_{24}$ heteroaryl group comprising at least 6 ring-forming atoms, wherein at least one substituent is selected from F, CN, substituted or unsubstituted $C_1$ to $C_{12}$ alkyl, partially or fully fluorinated $C_1$ to $C_{12}$ alkyl, substituted or unsubstituted $C_6$ to $C_{18}$ aryl, and substituted or unsubstituted $C_2$ to $C_{18}$ heteroaryl, wherein the substituents of the substituted or unsubstituted $C_1$ to $C_{12}$ alkyl, substituted or unsubstituted $C_6$ to $C_{18}$ aryl, and substituted or unsubstituted $C_2$ to $C_{18}$ heteroaryl are selected from halogen, F, CN, $C_1$ to $C_6$ alkyl, $CF_3$; wherein at least one substituent is selected from partially or fully fluorinated $C_1$ to $C_{12}$ alkyl, or CN;

$R^2$ is selected from CN, $C_1$ to $C_4$ alkyl, partially or perfluorinated $C_1$ to $C_4$ alkyl, or F;

$R^3$ is independently selected from substituted $C_1$ to $C_{12}$ alkyl, substituted or unsubstituted $C_6$ to $C_{24}$ aryl, and substituted or unsubstituted $C_2$ to $C_{24}$ heteroaryl group comprising at least 6 ring-forming atoms, wherein at least one substituent is selected from F, CN, partially or fully fluorinated $C_1$ to $C_{12}$ alkyl, substituted or unsubstituted $C_6$ to $C_{18}$ aryl, preferably substituted $C_6$ to $C_{18}$ aryl, and substituted or unsubstituted $C_2$ to $C_{18}$ heteroaryl, wherein the substituents of the substituted or unsubstituted $C_6$ to $C_{18}$ aryl, and substituted or unsubstituted $C_2$ to $C_{18}$ heteroaryl are selected from F, CN, $C_1$ to $C_6$ alkyl, $CF_3$.

According to one embodiment, wherein the compound has the formula (I):

(I)

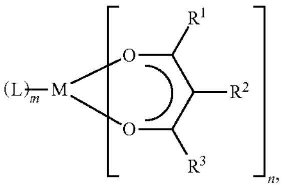

wherein

M is Cu, Zn, Al, Hf;

L is a charge-neutral ligand, which coordinates to the metal M;

n is an integer selected from 2, 3 or 4, which corresponds to the oxidation number of M;

m is an integer selected from 0 to 2;

$R^1$ is independently selected from substituted or unsubstituted $C_6$ to $C_{24}$ aryl and substituted or unsubstituted $C_2$ to $C_{24}$ heteroaryl group comprising at least 6 ring-forming atoms, wherein at least one substituent is selected from F, CN, substituted or unsubstituted $C_1$ to $C_{12}$ alkyl, partially or fully fluorinated $C_1$ to $C_{12}$ alkyl, substituted or unsubstituted $C_6$ to $C_{18}$ aryl, and substituted or unsubstituted $C_2$ to $C_{18}$ heteroaryl, wherein the substituents of the substituted or unsubstituted $C_1$ to $C_{12}$ alkyl, substituted or unsubstituted $C_6$ to $C_{18}$ aryl, and substituted or unsubstituted $C_2$ to $C_{18}$ heteroaryl are selected from halogen, F, CN, $C_1$ to $C_6$ alkyl, $CF_3$; wherein at least one substituent is selected from partially or fully fluorinated $C_1$ to $C_{12}$ alkyl, or CN;

$R^2$ is selected from CN, $C_1$ to $C_4$ alkyl, partially or perfluorinated $C_1$ to $C_4$ alkyl, or F;

$R^3$ is independently selected from substituted $C_1$ to $C_{12}$ alkyl, substituted or unsubstituted $C_6$ to $C_{24}$ aryl, and substituted or unsubstituted $C_2$ to $C_{24}$ heteroaryl group comprising at least 6 ring-forming atoms, wherein at least one substituent is selected from F, CN, substituted or unsubstituted $C_1$ to $C_{12}$ alkyl, partially or fully fluorinated $C_1$ to $C_{12}$ alkyl, substituted or unsubstituted $C_6$ to $C_{18}$ aryl, and substituted or unsubstituted $C_2$ to $C_{18}$ heteroaryl, wherein the substituents of the substituted or unsubstituted $C_1$ to $C_{12}$ alkyl, substituted or unsubstituted $C_6$ to $C_{18}$ aryl, preferably substituted $C_6$ to $C_{18}$ aryl, and substituted or unsubstituted $C_2$ to $C_{18}$ heteroaryl are selected from F, CN, $C_1$ to $C_6$ alkyl, $CF_3$;

and wherein for $R^3$ unsubstituted branched alkyl and/or $CF_3$ are excluded.

According to one embodiment, wherein the compound has the formula (I):

(I)

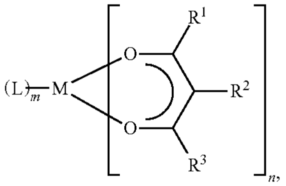

wherein

M is Cu, Zn, Al, Hf;

L is a charge-neutral ligand, which coordinates to the metal M;

n is an integer selected from 2, 3 or 4, which corresponds to the oxidation number of M;

m is an integer selected from 0 to 2;

$R^1$ is independently selected from substituted or unsubstituted $C_6$ to $C_{24}$ aryl and substituted or unsubstituted $C_2$ to $C_{24}$ heteroaryl group comprising at least 6 ring-forming atoms, wherein at least one substituent is selected from F, CN, substituted or unsubstituted $C_1$ to $C_{12}$ alkyl, partially or fully fluorinated $C_1$ to $C_{12}$ alkyl, substituted or unsubstituted $C_6$ to $C_{18}$ aryl, and substituted or unsubstituted $C_2$ to $C_{18}$ heteroaryl, wherein the substituents of the substituted or unsubstituted $C_1$ to $C_{12}$ alkyl, substituted or unsubstituted $C_6$ to $C_{18}$ aryl, and substituted or unsubstituted $C_2$ to $C_{18}$ heteroaryl are selected from halogen, F, CN, $C_1$ to $C_6$ alkyl, $CF_3$; wherein at least one substituent is selected from partially or fully fluorinated $C_1$ to $C_{12}$ alkyl, or CN;

$R^2$ is selected from CN, $CH_3$, $CF_3$, $C_2F_5$, $C_3F_7$ or F, preferably CN, $CH_3$, $CF_3$, $C_2F_5$ or $C_3F_7$; more preferred CN, $CH_3$ or $CF_3$;

$R^3$ is independently selected from substituted $C_1$ to $C_{12}$ alkyl, substituted or unsubstituted $C_6$ to $C_{24}$ aryl, and substituted or unsubstituted $C_2$ to $C_{24}$ heteroaryl group comprising at least 6 ring-forming atoms, wherein at least one substituent is selected from F, CN, substituted or unsubstituted $C_1$ to $C_{12}$ alkyl, partially or fully fluorinated $C_1$ to $C_{12}$ alkyl, substituted or unsubstituted $C_6$ to $C_{18}$ aryl, preferably substituted $C_6$ to $C_{18}$ aryl, and substituted or unsubstituted $C_2$ to $C_{18}$ heteroaryl, wherein the substituents of the substituted or unsubstituted $C_1$ to $C_{12}$ alkyl, substituted or unsubstituted $C_6$ to $C_{18}$ aryl, and substituted or unsubstituted $C_2$ to $C_{18}$ heteroaryl are selected from F, CN, $C_1$ to $C_6$ alkyl, $CF_3$;

and optional for $R^3$ unsubstituted branched alkyl and/or $CF_3$ are excluded.

An aspect of the present invention provides a compound represented by Formula (I):

(I)

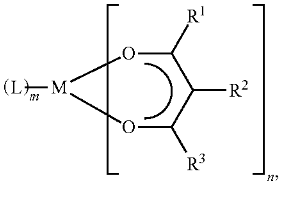

wherein

M is Cu, Zn, Al, Hf;

L is a charge-neutral ligand, which coordinates to the metal M;

n is an integer selected from 2, 3 or 4, which corresponds to the oxidation number of M;

m is an integer selected from 0 to 2;

$R^1$ is independently selected from substituted or unsubstituted $C_6$ to $C_{24}$ aryl and substituted or unsubstituted $C_2$ to $C_{24}$ heteroaryl group comprising at least 6 ring-forming atoms, wherein at least one substituent is selected from F, CN, substituted or unsubstituted $C_1$ to $C_{12}$ alkyl, partially or fully fluorinated $C_1$ to $C_{12}$ alkyl, substituted or unsubstituted $C_6$ to $C_{18}$ aryl, and substituted or unsubstituted $C_2$ to $C_{18}$ heteroaryl, wherein the substituents of the substituted or unsubstituted $C_1$ to $C_{12}$ alkyl, substituted or unsubstituted $C_6$ to $C_{18}$ aryl, and substituted or unsubstituted $C_2$ to $C_{18}$ heteroaryl are selected from halogen, F, CN, $C_1$ to $C_6$ alkyl, $CF_3$; wherein at least one substituent is selected from partially or fully fluorinated $C_1$ to $C_{12}$ alkyl, or CN;

$R^2$ is selected from CN, $C_1$ to $C_4$ alkyl, partially or perfluorinated $C_1$ to $C_4$ alkyl, or F;

$R^3$ is independently selected from substituted $C_1$ to $C_{12}$ alkyl, substituted or unsubstituted $C_6$ to $C_{24}$ aryl, and substituted or unsubstituted $C_2$ to $C_{24}$ heteroaryl group comprising at least 6 ring-forming atoms, wherein at least one substituent is selected from F, CN, substituted or unsubstituted $C_1$ to $C_{12}$ alkyl, partially or fully fluorinated $C_1$ to $C_{12}$ alkyl, substituted or unsubstituted $C_6$ to $C_{18}$ aryl, preferably substituted $C_6$ to $C_{18}$ aryl, and substituted or unsubstituted $C_2$ to $C_{18}$ heteroaryl, wherein the substituents of the substituted or unsubstituted $C_1$ to $C_{12}$ alkyl, substituted or unsubstituted $C_6$ to $C_{18}$ aryl, and substituted or unsubstituted $C_2$ to $C_{18}$ heteroaryl are selected from F, CN, $C_1$ to $C_6$ alkyl, $CF_3$; and wherein at least one $R^1$ and/or $R^3$ is selected from a substituted $C_6$ to $C_{24}$ aryl or substituted $C_2$ to $C_{24}$ heteroaryl group, wherein at least one substituent or at least two substituents of the substituted $C_6$ to $C_{24}$ aryl or substituted $C_2$ to $C_{24}$ heteroaryl group is selected from CN or partially or fully fluorinated $C_1$ to $C_{12}$ alkyl, preferably partially or fully fluorinated $C_1$ to $C_4$ alkyl.

According to one embodiment of the compound represented by Formula (I), wherein $R^2$ is selected from CN, $CH_3$, $CF_3$, $C_2F_5$, $C_3F_7$ or F, preferably CN, $CH_3$, $CF_3$, $C_2F_5$ or $C_3F_7$; and more preferred CN, $CH_3$ or $CF_3$.

According to one embodiment of the compound represented by Formula (I), wherein at least one $R^1$ and/or $R^3$ is selected from a substituted $C_6$ to $C_{24}$ aryl or substituted $C_2$ to $C_{24}$ heteroaryl group, wherein at least one substituent of the substituted $C_6$ to $C_{24}$ aryl or substituted $C_2$ to $C_{24}$ heteroaryl group is selected from CN or partially or fully fluorinated $C_1$ to $C_{12}$ alkyl, preferably partially or fully fluorinated $C_1$ to $C_4$ alkyl.

According to one embodiment of the compound represented by Formula (I), wherein at least one $R^1$ and/or $R^3$ is selected from a substituted $C_6$ to $C_{24}$ aryl or substituted $C_2$ to $C_{24}$ heteroaryl group, wherein at least two substituent of the substituted $C_6$ to $C_{24}$ aryl or substituted $C_2$ to $C_{24}$ heteroaryl group is selected from CN or partially or fully fluorinated $C_1$ to $C_{12}$ alkyl, preferably partially or fully fluorinated $C_1$ to $C_4$ alkyl.

According to one embodiment of the compound represented by Formula (I), wherein the compound of formula (I) comprises at least one $CF_3$ group, preferably at least two $CF_3$ groups, further preferred at least three $CF_3$ groups, in addition preferred at least four $CF_3$ groups, or at least two $CF_3$ groups and at least one $C_2F_5$, or at least two $CF_3$ groups and at least one group selected from CN, F or $CH_3$.

According to one embodiment of the compound represented by Formula (I), wherein at least one $R^1$ or $R^3$ are selected from a substituted $C_2$ to $C_{24}$ heteroaryl group comprising at least 6 ring-forming atoms, wherein the substituted heteroaryl group comprises at least 1 to 6 N atoms, preferably 1 to 3 N atoms, and more preferred 1 N atom; and/or the heteroaryl group of the substituted heteroaryl group is a six-membered ring, comprise 1, 2 or 3 hetero atoms, wherein preferably the hetero atom is N.

According to one embodiment of the compound represented by Formula (I), wherein at least one $R^1$ and $R^3$ are selected from a substituted $C_2$ to $C_{24}$ heteroaryl group comprising at least 6 ring-forming atoms, wherein the substituted heteroaryl group comprises at least 1 to 6 N atoms, preferably 1 to 3 N atoms, and more preferred 1 N atom; and/or the heteroaryl group of the substituted heteroaryl group is a six-membered ring, comprise 1, 2 or 3 hetero atoms, wherein preferably the hetero atom is N.

According to one embodiment, wherein at least one $R^1$ or $R^3$ is selected from a substituted $C_2$ to $C_{24}$ heteroaryl group, wherein the heteroaryl group is selected from pyridyl, pyrimidinyl pyrazinyl, or triazinyl.

According to one embodiment, wherein at least one $R^1$ and at least one $R^3$ are selected from a substituted $C_2$ to $C_{24}$ heteroaryl group, wherein the $C_2$ to $C_{24}$ heteroaryl group is selected from pyridyl, pyrimidinyl, pyrazinyl, triazinyl.

According to one embodiment, wherein at least one $R^1$ and/or $R^3$ is selected from a substituted $C_2$ to $C_{24}$ heteroaryl group, wherein the at least one substituent of the substituted heteroaryl group is selected from the group comprising halogen, F, Cl, CN, partially or fully fluorinated $C_1$ to $C_6$ alkyl, preferably from the group comprising halogen, F, Cl, CN, partially or fully fluorinated $C_1$ to $C_6$ alkyl, further preferred from the group comprising halogen, F, Cl, CN, partially or fully fluorinated $C_1$ to $C_4$ alkyl; and more preferred from the group comprising F, CN, partially or fully fluorinated $C_1$ to $C_6$ alkyl; also preferred F, CN, partially or fully fluorinated $C_1$ to $C_6$ alkyl, also preferred halogen, F, Cl, CN, partially or fully fluorinated $C_1$ to $C_4$ alkyl; and more preferred from the group comprising at least one CN, at least one $CF_3$ group, and/or at least two F atoms.

According to one embodiment, wherein at least one $R^1$ or $R^3$, or $R^1$ and $R^3$ are selected from a substituted $C_2$ to $C_{24}$ heteroaryl group, wherein at least one substituent is selected from halogen, F, Cl, CN, partially or fully fluorinated $C_1$ to $C_6$ alkyl, and one $R^1$, $R^2$ or $R^3$ is selected from substituted or unsubstituted $C_1$ to $C_{12}$ alkyl, wherein the at least one substituent is selected from halogen, F, Cl, CN, partially or fully fluorinated $C_1$ to $C_6$ alkyl.

According to one embodiment, wherein one $R^1$ is selected from a substituted $C_2$ to $C_{24}$ heteroaryl group, wherein at least one, two or three substituents are selected from $CF_3$ group.

According to one embodiment, wherein $R^3$ is selected from a substituted $C_2$ to $C_{24}$ heteroaryl group, wherein at least one, two or three substituents are selected from $CF_3$ group and/or CN group.

According to one embodiment, wherein $R^1$ is selected from a substituted $C_6$ to $C_{24}$ aryl group, wherein at least one, two or three substituents are selected from $CF_3$ group.

According to one embodiment, wherein $R^3$ is selected from a substituted $C_6$ to $C_{24}$ aryl group, wherein at least one, two or three substituents are selected from $CF_3$ group and/or CN group.

According to one embodiment, wherein $R^1$ is selected from a substituted pyridine group, wherein at least one, two or three substituents are selected from $CF_3$ group.

According to one embodiment, wherein $R^3$ is selected from a substituted pyridine group, wherein at least one, two or three substituents are selected from $CF_3$ group and/or CN group.

According to one embodiment, wherein $R^1$ is selected from a substituted phenyl group, wherein at least one, two or three substituents are selected from $CF_3$ group.

According to one embodiment, wherein $R^3$ is selected from a substituted phenyl group, wherein at least one, two or three substituents are selected from $CF_3$ group and/or CN group.

According to one embodiment, wherein $R^1$ is selected from a substituted phenyl group, wherein at least one, two or three substituents are selected from $CF_3$ group; and wherein $R^3$ is selected from a substituted phenyl group, wherein at least one, two or three substituents are selected from $CF_3$ group and/or CN group.

According to one embodiment, wherein $R^1$, $R^2$, $R^3$ may be not selected from a substituted or unsubstituted $C_6$ to $C_{24}$ aryl group or a substituted or unsubstituted $C_6$ to $C_{18}$ aryl group.

According to one embodiment, wherein $R^1$ and $R^3$ may be not selected from a unsubstituted aryl and/or unsubstituted heteroaryl group.

According to one embodiment, wherein Formula I may not comprise an unsubstituted aryl and/or unsubstituted heteroaryl group.

According to one embodiment, wherein Formula I may not comprises a substituted aryl group.

According to one embodiment, wherein Formula I may not comprise a substituted heteroaryl group.

According to one embodiment of Formula (I), wherein at least at least one of $R^1$ and/or $R^3$ is a substituted or unsubstituted $C_6$ to $C_{24}$ aryl or a substituted $C_2$ to $C_{24}$ heteroaryl group comprising at least 6 ring-forming atoms, and is selected from the following Formulas D1 to D71 and/or $R^3$ is can be optional selected from the following Formulas D1 to D34 and D36 to D71:

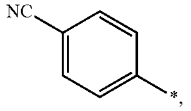
(D1)

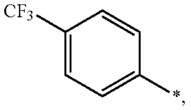
(D2)

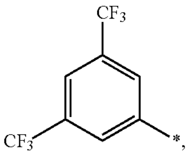
(D3)

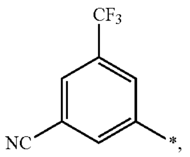
(D4)

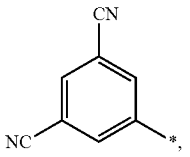
(D5)

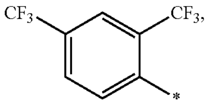
(D6)

-continued

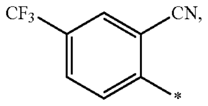
(D7)

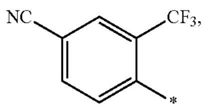
(D8)

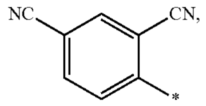
(D9)

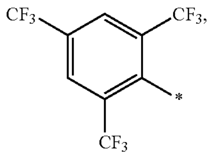
(D10)

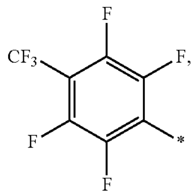
(D11)

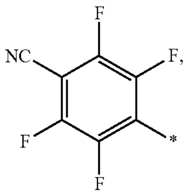
(D12)

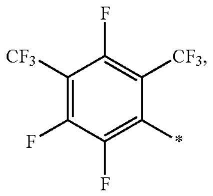
(D13)

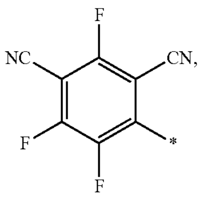
(D14)

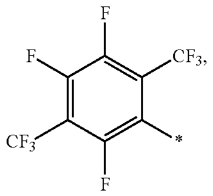
(D15)

-continued
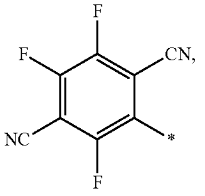
(D16)
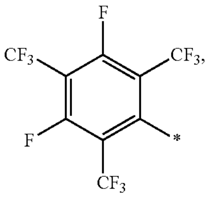
(D17)
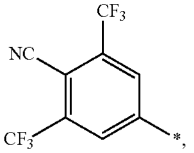
(D18)
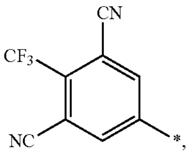
(D19)
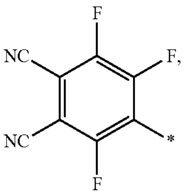
(D20)
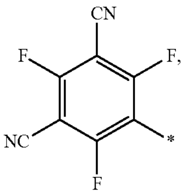
(D21)
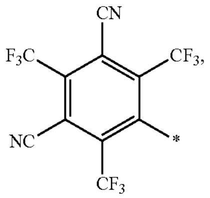
(D22)
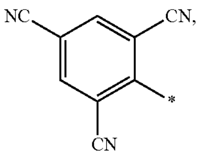
(D23)
-continued
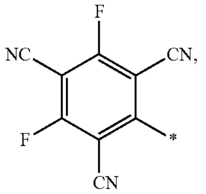
(D24)
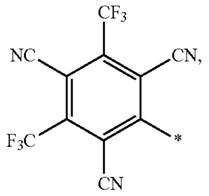
(D25)
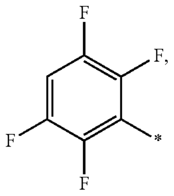
(D26)
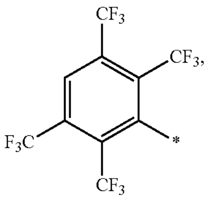
(D27)
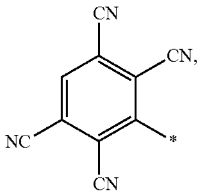
(D28)
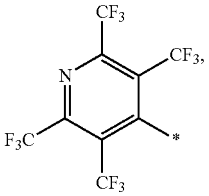
(D29)
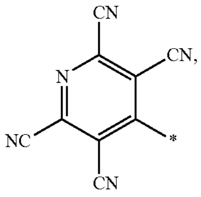
(D30)
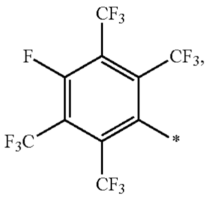
(D31)

-continued
(D32)
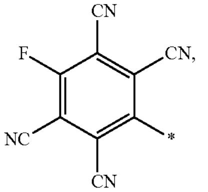
(D33)
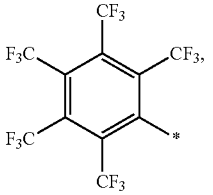
(D34)
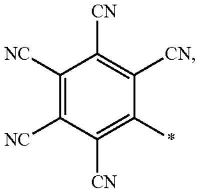
(D35)
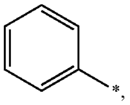
(D36)
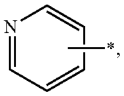
(D37)
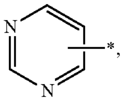
(D38)
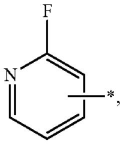
(D39)
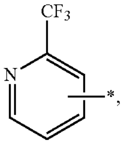
(D40)
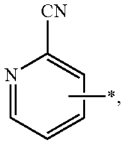
(D41)
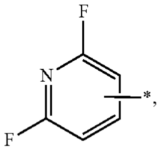
-continued
(D42)
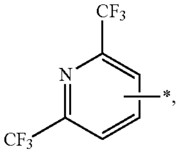
(D43)
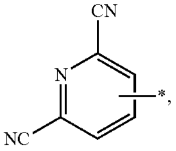
(D44)
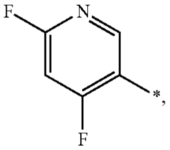
(D45)
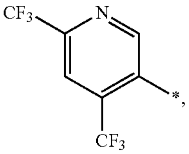
(D46)
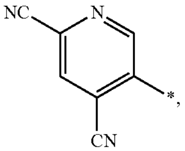
(D47)
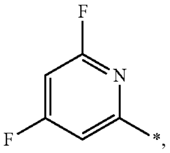
(D48)
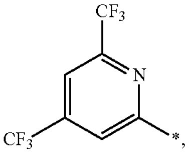
(D49)
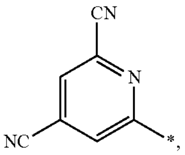
(D50)
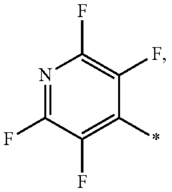

-continued
(D51)
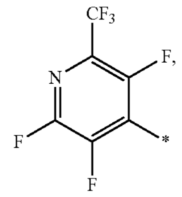
(D52)
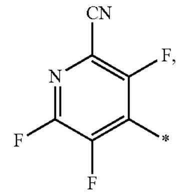
(D53)
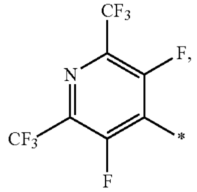
(D54)
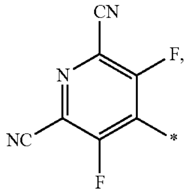
(D56)
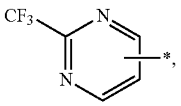
(D57)
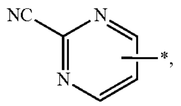
(D58)
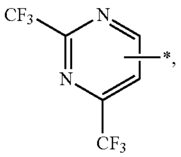
(D59)
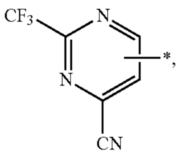
(D60)
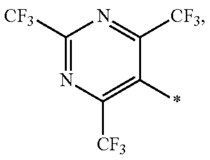
-continued
(D61)
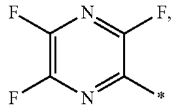
(D62)
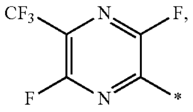
(D63)
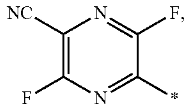
(D64)
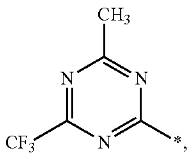
(D65)
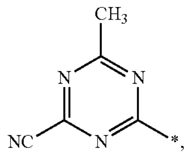
(D67)
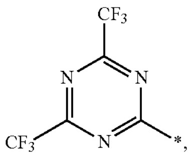
(D68)
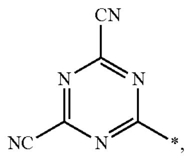
(D69)
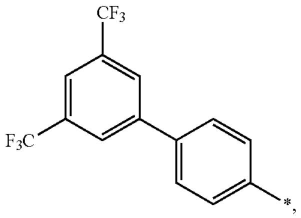
(D70)
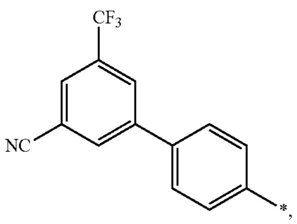

-continued
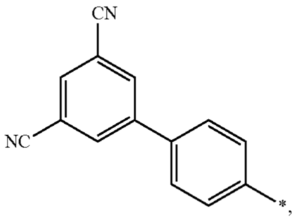
(D71)
wherein the "*" denotes the binding position.
According to one embodiment of Formula (I), wherein the compound represented by Formula (I) is selected from the following Formulas E1 to E20:
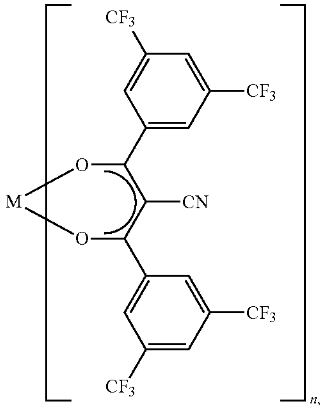
(E1)
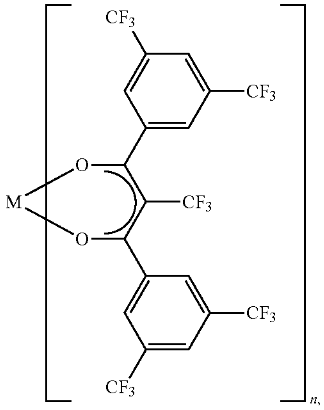
(E2)
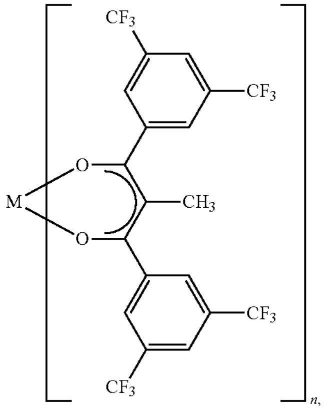
(E3)
-continued
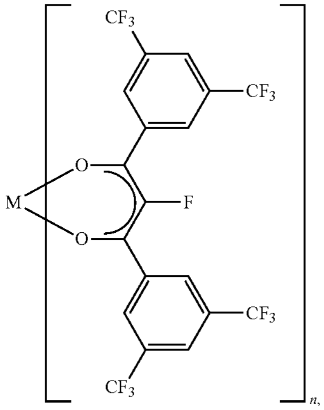
(E4)
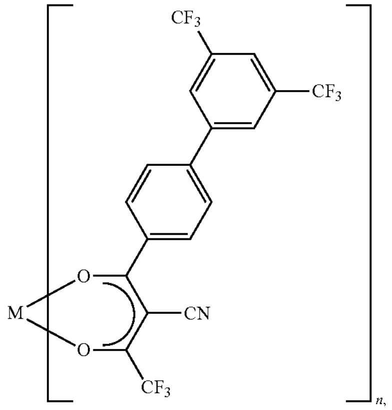
(E5)
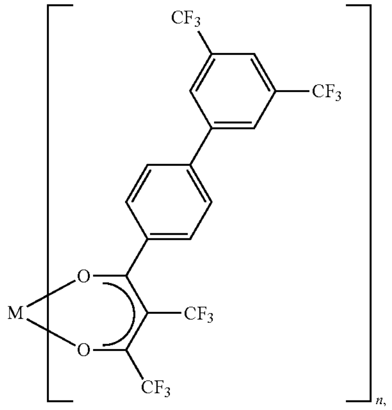
(E6)
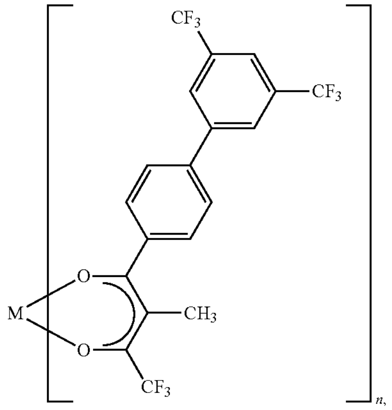
(E7)

-continued
(E8)
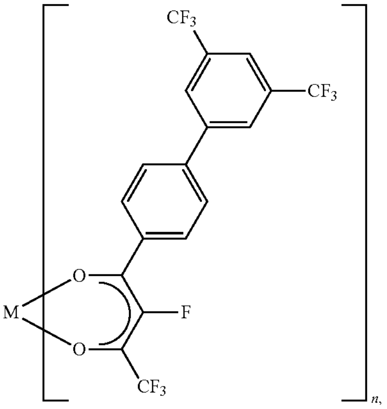
(E9)
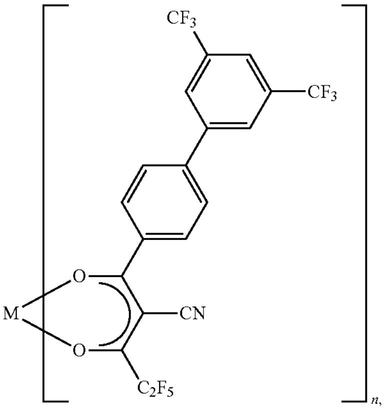
(E10)
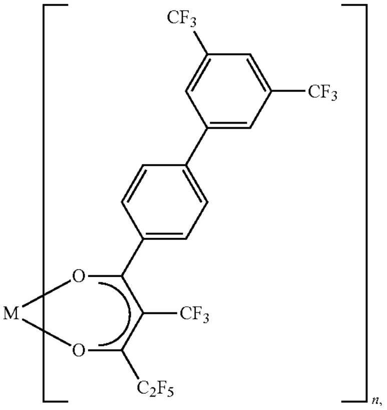
(E11)
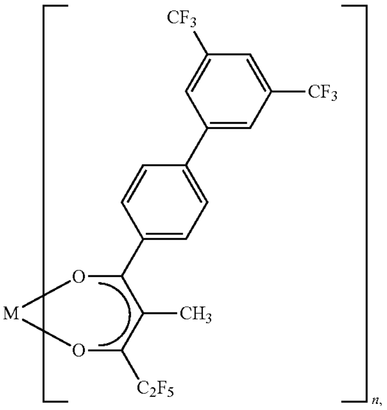
-continued
(E12)
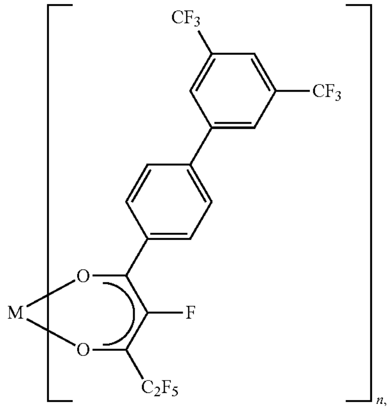
(E13)
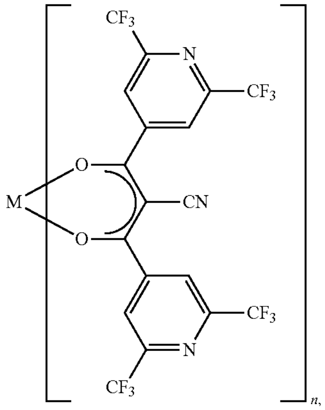
(E14)
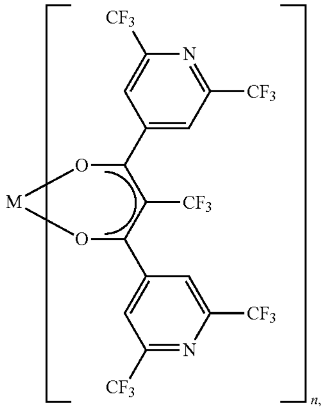
(E15)
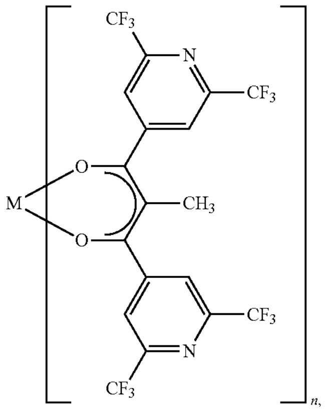

-continued
(E16)
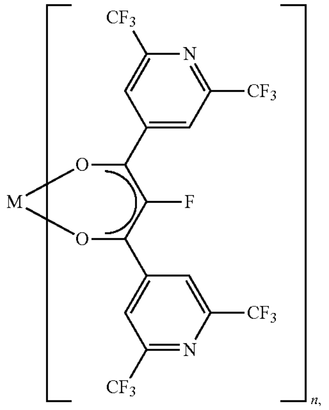
(E17)
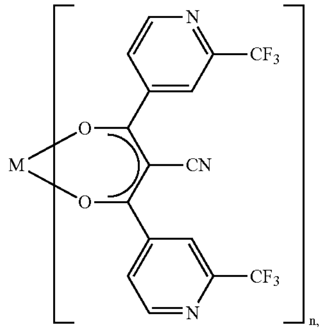
(E18)
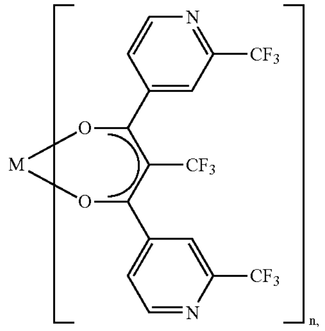
(E19)
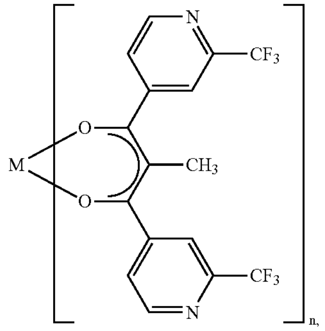
-continued
(E20)
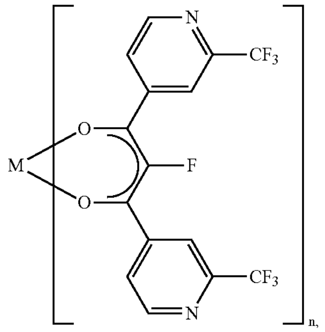
and more preferred wherein M is Cu(II) or Al(III), more preferred Cu(II).
According to one embodiment, wherein the compound represented by Formula I is selected from Formulas E1 to E12 and/or E17 to E20.
According to one embodiment, wherein the compound represented by Formula I is selected from the following Formulas G1 to G8:
(G1)
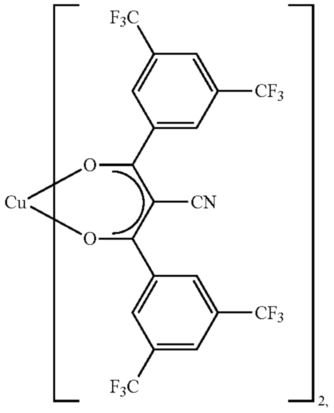
(G2)
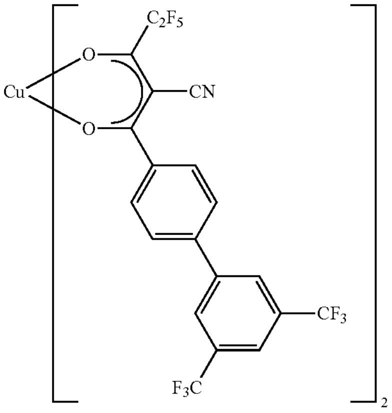

-continued (G3)

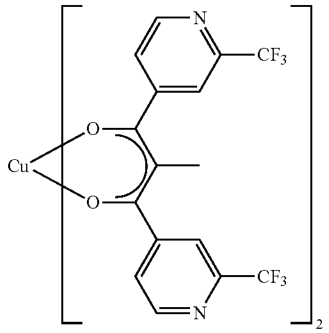

(G4)

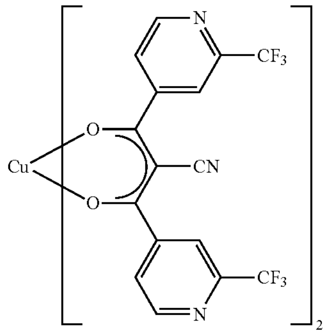

(G5)

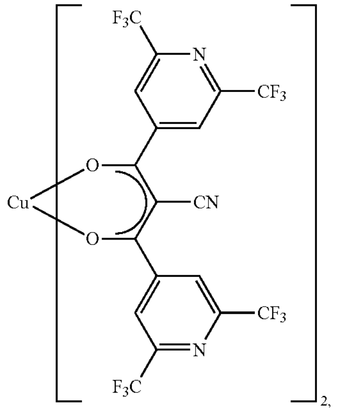

(G6)

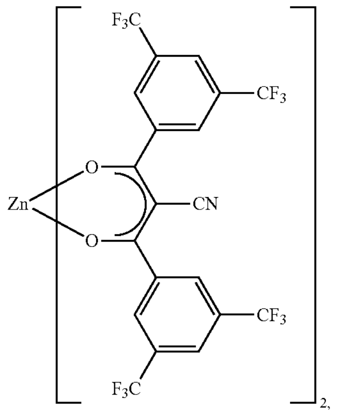

-continued (G7)

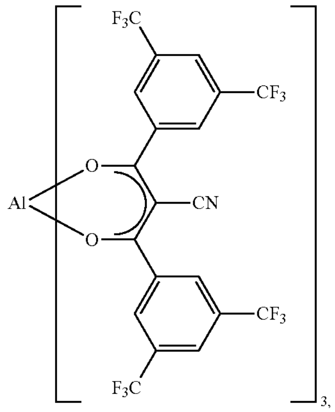

(G8)

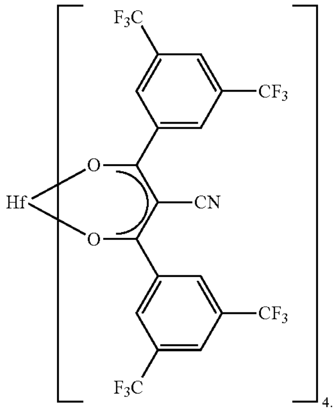

According to one embodiment, wherein the compound represented by Formula I is selected preferably from the Formulas G1 to G4.

Semiconductor Material

According to another aspect, wherein a semiconductor material comprises at least one compound of Formula I according to the present invention.

According to one embodiment, wherein the semiconductor material comprises in addition at least one covalent matrix compound or at least one substantially covalent matrix compound.

According to another aspect, wherein a semiconductor material comprises at least one compound of Formula I according to the present invention and in addition at least one covalent matrix compound or at least one substantially covalent matrix compound.

Substantially Covalent Matrix Compound/Covalent Matrix Compound

The substantially covalent matrix compound, also named matrix compound, may be an organic aromatic matrix compounds, which comprises organic aromatic covalent bonded carbon atoms. The substantially covalent matrix compound may be an organic compound, consisting substantially from covalently bound C, H, O, N, S, which may optionally comprise also covalently bound B, Por Si. The substantially covalent matrix compound may be an organic aromatic covalent bonded compound, which is free of metal atoms, and the majority of its skeletal atoms may be selected from C, O, S, N and preferably from C, O and N, wherein the majority of atoms are C-atoms. Alternatively, the covalent matrix compound is free of metal atoms and majority of its skeletal atoms may be selected from C and N, preferably the covalent matrix compound is free of metal atoms and majority of its skeletal atoms may be selected from C and the minority of its skeletal atoms may be N.

According to one embodiment, the substantially covalent matrix compound may have a molecular weight Mw of ≥400 and ≤2000 g/mol, preferably a molecular weight Mw of ≥450 and ≤1500 g/mol, further preferred a molecular weight Mw of ≥500 and ≤1000 g/mol, in addition preferred a molecular weight Mw of ≥550 and ≤900 g/mol, also preferred a molecular weight Mw of ≥600 and ≤800 g/mol.

In one embodiment, the HOMO level of the substantially covalent matrix compound may be more negative than the HOMO level of N2,N2,N2',N2',N7,N7,N7',N7'-octakis(4-methoxyphenyl)-9,9'-spirobi[fluorene]-2,2',7,7'-tetraamine (CAS 207739-72-8) when determined under the same conditions.

In one embodiment of the present invention, the substantially covalent matrix compound may be free of alkoxy groups.

Preferably, the substantially covalent matrix compound comprises at least one arylamine moiety, alternatively a diarylamine moiety, alternatively a triarylamine moiety.

Preferably, the substantially covalent matrix compound is free of TPD or NPB.

Compound of Formula (III) or a Compound of Formula (IV)

According to the present invention, the substantially covalent matrix compound or covalent matrix compound, also referred to as matrix compound herein, may comprises at least one arylamine compound, diarylamine compound, triarylamine compound, a compound of formula (III) or a compound of formula (IV):

(III)

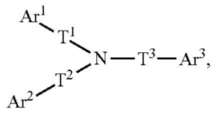

(IV)

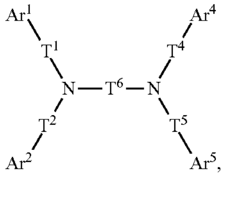

wherein:

$T^1$, $T^2$, $T^3$, $T^4$ and $T^5$ are independently selected from a single bond, phenylene, biphenylene, terphenylene or naphthenylene, preferably a single bond or phenylene;

$T^6$ is phenylene, biphenylene, terphenylene or naphthenylene;

$Ar^1$, $Ar^2$, $Ar^3$, $Ar^4$ and $Ar^5$ are independently selected from substituted or unsubstituted $C_6$ to $C_{20}$ aryl, or substituted or unsubstituted $C_3$ to $C_{20}$ heteroarylene, substituted or unsubstituted biphenylene, substituted or unsubstituted fluorene, substituted 9-fluorene, substituted 9,9-fluorene, substituted or unsubstituted naphthalene, substituted or unsubstituted anthracene, substituted or unsubstituted phenanthrene, substituted or unsubstituted pyrene, substituted or unsubstituted perylene, substituted or unsubstituted triphenylene, substituted or unsubstituted tetracene, substituted or unsubstituted tetraphene, substituted or unsubstituted dibenzofurane, substituted or unsubstituted dibenzothiophene, substituted or unsubstituted xanthene, substituted or unsubstituted carbazole, substituted 9-phenylcarbazole, substituted or unsubstituted azepine, substituted or unsubstituted dibenzo[b,f]azepine, substituted or unsubstituted 9,9'-spirobi[fluorene], substituted or unsubstituted spiro[fluorene-9,9'-xanthene], or a substituted or unsubstituted aromatic fused ring system comprising at least three substituted or unsubstituted aromatic rings selected from the group comprising substituted or unsubstituted non-hetero, substituted or unsubstituted hetero 5-member rings, substituted or unsubstituted 6-member rings and/or substituted or unsubstituted 7-member rings, substituted or unsubstituted fluorene, or a fused ring system comprising 2 to 6 substituted or unsubstituted 5- to 7-member rings and the rings are selected from the group comprising (i) unsaturated 5- to 7-member ring of a heterocycle, (ii) 5- to 6-member of an aromatic heterocycle, (iii) unsaturated 5- to 7-member ring of a non-heterocycle, (iv) 6-member ring of an aromatic non-heterocycle;

wherein the substituents of $Ar^1$, $Ar^2$, $Ar^3$, $Ar^4$ and $Ar^5$ are selected the same or different from the group comprising H, D, F, C(—O)$R^2$, CN, Si$(R^2)_3$, P(—O)$(R^2)_2$, O$R^2$, S(—O)$R^2$, S$(—O)_2R^2$, substituted or unsubstituted straight-chain alkyl having 1 to 20 carbon atoms, substituted or unsubstituted branched alkyl having 1 to 20 carbon atoms, substituted or unsubstituted cyclic alkyl having 3 to 20 carbon atoms, substituted or unsubstituted alkenyl or alkynyl groups having 2 to 20 carbon atoms, substituted or unsubstituted substituted or unsubstituted aromatic ring systems having 6 to 40 aromatic ring atoms, and substituted or unsubstituted heteroaromatic ring systems having 5 to 40 aromatic ring atoms, unsubstituted $C_6$ to $C_{18}$ aryl, unsubstituted $C_3$ to $C_{18}$ heteroaryl, a fused ring system comprising 2 to 6 unsubstituted 5- to 7-member rings and the rings are selected from the group comprising unsaturated 5- to 7-member ring of a heterocycle, 5- to 6-member of an aromatic heterocycle, unsaturated 5- to 7-member ring of a non-heterocycle, and 6-member ring of an aromatic non-heterocycle, wherein $R^2$ may be selected from H, D, straight-chain alkyl having 1 to 6 carbon atoms, branched alkyl having 1 to 6 carbon atoms, cyclic alkyl having 3 to 6 carbon atoms, alkenyl or alkynyl groups having 2 to 6 carbon atoms, $C_6$ to $C_{18}$ aryl or $C_3$ to $C_{18}$ heteroaryl.

According to an embodiment of the electronic device, wherein the substantially covalent matrix compound comprises a compound of formula (III) or formula (IV):

(III)

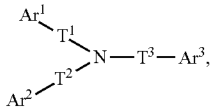

-continued (IV)

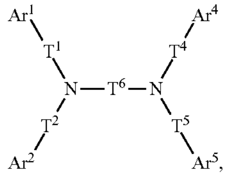

wherein $T^1$, $T^2$, $T^3$, $T^4$ and $T^5$ may be independently selected from a single bond, phenylene, biphenylene, terphenylene or naphthenylene, preferably a single bond or phenylene;

$T^6$ is phenylene, biphenylene, terphenylene or naphthenylene;

$Ar^1$, $Ar^2$, $Ar^3$, $Ar^4$ and $Ar^5$ may be independently selected from substituted or unsubstituted $C_6$ to $C_{20}$ aryl, or substituted or unsubstituted $C_3$ to $C_{20}$ heteroarylene, substituted or unsubstituted biphenylene, substituted or unsubstituted fluorene, substituted 9-fluorene, substituted 9,9-fluorene, substituted or unsubstituted naphthalene, substituted or unsubstituted anthracene, substituted or unsubstituted phenanthrene, substituted or unsubstituted pyrene, substituted or unsubstituted perylene, substituted or unsubstituted triphenylene, substituted or unsubstituted tetracene, substituted or unsubstituted tetraphene, substituted or unsubstituted dibenzofurane, substituted or unsubstituted dibenzothiophene, substituted or unsubstituted xanthene, substituted or unsubstituted carbazole, substituted 9-phenylcarbazole, substituted or unsubstituted azepine, substituted or unsubstituted dibenzo[b,f]azepine, substituted or unsubstituted 9,9'-spirobi[fluorene], substituted or unsubstituted spiro[fluorene-9,9'-xanthene], or a substituted or unsubstituted aromatic fused ring system comprising at least three substituted or unsubstituted aromatic rings selected from the group comprising substituted or unsubstituted non-hetero, substituted or unsubstituted hetero 5-member rings, substituted or unsubstituted 6-member rings and/or substituted or unsubstituted 7-member rings, substituted or unsubstituted fluorene, or a fused ring system comprising 2 to 6 substituted or unsubstituted 5- to 7-member rings and the rings are selected from the group comprising (i) unsaturated 5- to 7-member ring of a heterocycle, (ii) 5- to 6-member of an aromatic heterocycle, (iii) unsaturated 5- to 7-member ring of a non-heterocycle, (iv) 6-member ring of an aromatic non-heterocycle;

wherein the substituents of $Ar^1$, $Ar^2$, $Ar^3$, $Ar^4$ and $Ar^5$ are selected the same or different from the group comprising H, straight-chain alkyl having 1 to 20 carbon atoms, branched alkyl having 1 to 20 carbon atoms, cyclic alkyl having 3 to 20 carbon atoms, alkenyl or alkynyl groups having 2 to 20 carbon atoms, $C_6$ to $C_{18}$ aryl, $C_3$ to $C_{18}$ heteroaryl, a fused ring system comprising 2 to 6 unsubstituted 5- to 7-member rings and the rings are selected from the group comprising unsaturated 5- to 7-member ring of a heterocycle, 5- to 6-member of an aromatic heterocycle, unsaturated 5- to 7-member ring of a non-heterocycle, and 6-member ring of an aromatic non-heterocycle.

Preferably, the substituents of $Ar^1$, $Ar^2$, $Ar^3$, $Ar^4$ and $Ar^5$ are selected the same or different from the group comprising H, straight-chain alkyl having 1 to 6 carbon atoms, branched alkyl having 1 to 6 carbon atoms, cyclic alkyl having 3 to 6 carbon atoms, alkenyl or alkynyl groups having 2 to 6 carbon atoms, $C_6$ to $C_{18}$ aryl, $C_3$ to $C_{18}$ heteroaryl, a fused ring system comprising 2 to 4 unsubstituted 5- to 7-member rings and the rings are selected from the group comprising unsaturated 5- to 7-member ring of a heterocycle, 5- to 6-member of an aromatic heterocycle, unsaturated 5- to 7-member ring of a non-heterocycle, and 6-member ring of an aromatic non-heterocycle; more preferred the substituents are selected the same or different from the group consisting of H, straight-chain alkyl having 1 to 4 carbon atoms, branched alkyl having 1 to 4 carbon atoms, cyclic alkyl having 3 to 4 carbon atoms and/or phenyl.

Thereby, the compound of formula (III) or (IV) may have a rate onset temperature suitable for mass production.

According to an embodiment of the electronic device, wherein the substantially covalent matrix compound comprises a compound of formula (III) or formula (IV):

(III)

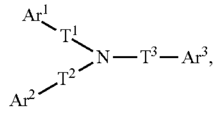

(IV)

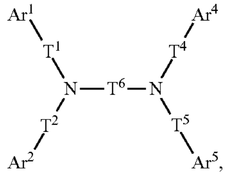

wherein $T^1$, $T^2$, $T^3$, $T^4$ and $T^5$ may be independently selected from a single bond, phenylene, biphenylene, terphenylene or naphthenylene, preferably a single bond or phenylene;

$T^6$ is phenylene, biphenylene, terphenylene or naphthenylene;

$Ar^1$, $Ar^2$, $Ar^3$, $Ar^4$ and $Ar^5$ may be independently selected from unsubstituted $C_6$ to $C_{20}$ aryl, or unsubstituted $C_3$ to $C_{20}$ heteroarylene, unsubstituted biphenylene, unsubstituted fluorene, substituted 9-fluorene, substituted 9,9-fluorene, unsubstituted naphthalene, unsubstituted anthracene, unsubstituted phenanthrene, unsubstituted pyrene, unsubstituted perylene, unsubstituted triphenylene, unsubstituted tetracene, unsubstituted tetraphene, unsubstituted dibenzofurane, unsubstituted dibenzothiophene, unsubstituted xanthene, unsubstituted carbazole, substituted 9-phenylcarbazole, unsubstituted azepine, unsubstituted dibenzo[b,f]azepine, unsubstituted 9,9'-spirobi[fluorene], unsubstituted spiro[fluorene-9,9'-xanthene], or a unsubstituted aromatic fused ring system comprising at least three unsubstituted aromatic rings selected from the group comprising unsubstituted non-hetero, unsubstituted hetero 5-member rings, unsubstituted 6-member rings and/or unsubstituted 7-member rings, unsubstituted fluorene, or a fused ring system comprising 2 to 6 unsubstituted 5- to 7-member rings and the rings are selected from the group comprising (i) unsaturated 5- to 7-member ring of a heterocycle, (ii) 5- to 6-member of an aromatic heterocycle, (iii) unsaturated 5- to 7-member ring of a non-heterocycle, (iv) 6-member ring of an aromatic non-heterocycle.

According to an embodiment of the electronic device, wherein the substantially covalent matrix compound comprises a compound of formula (III) or formula (IV):

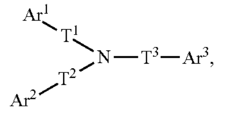

(III)

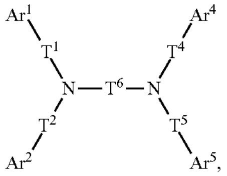

(IV)

wherein $T^1$, $T^2$, $T^3$, $T^4$ and $T^5$ may be independently selected from a single bond, phenylene, biphenylene, terphenylene or naphthenylene, preferably a single bond or phenylene;

$T^6$ is phenylene, biphenylene, terphenylene or naphthenylene;

$Ar^1$, $Ar^2$, $Ar^3$, $Ar^4$ and $Ar^5$ may be independently selected from unsubstituted $C_6$ to $C_{20}$ aryl, or unsubstituted $C_3$ to $C_{20}$ heteroarylene, unsubstituted biphenylene, unsubstituted fluorene, substituted 9-fluorene, substituted 9,9-fluorene, unsubstituted naphthalene, unsubstituted anthracene, unsubstituted phenanthrene, unsubstituted pyrene, unsubstituted perylene, unsubstituted triphenylene, unsubstituted tetracene, unsubstituted tetraphene, unsubstituted dibenzofurane, unsubstituted dibenzothiophene, unsubstituted xanthene, unsubstituted carbazole, substituted 9-phenylcarbazole, unsubstituted azepine, unsubstituted dibenzo[b,f]azepine, unsubstituted 9,9'-spirobi[fluorene], unsubstituted spiro[fluorene-9,9'-xanthene].

Thereby, the compound of formula (III) or (IV) may have a rate onset temperature suitable for mass production.

According to an embodiment wherein $T^1$, $T^2$, $T^3$, $T^4$ and $T^5$ may be independently selected from a single bond, phenylene, biphenylene or terphenylene. According to an embodiment wherein $T^1$, $T^2$, $T^3$, $T^4$ and $T^5$ may be independently selected from phenylene, biphenylene or terphenylene and one of $T^1$, $T^2$, $T^3$, $T^4$ and $T^5$ are a single bond. According to an embodiment wherein $T^1$, $T^2$, $T^3$, $T^4$ and $T^5$ may be independently selected from phenylene or biphenylene and one of $T^1$, $T^2$, $T^3$, $T^4$ and $T^5$ are a single bond. According to an embodiment wherein $T^1$, $T^2$, $T^3$, $T^4$ and $T^5$ may be independently selected from phenylene or biphenylene and two of $T^1$, $T^2$, $T^3$, $T^4$ and $T^5$ are a single bond.

According to an embodiment wherein $T^1$, $T^2$ and $T^3$ may be independently selected from phenylene and one of $T^1$, $T^2$ and $T^3$ are a single bond. According to an embodiment wherein $T^1$, $T^2$ and $T^3$ may be independently selected from phenylene and two of $T^1$, $T^2$ and $T^3$ are a single bond.

According to an embodiment wherein $T^6$ may be phenylene, biphenylene, terphenylene. According to an embodiment wherein $T^6$ may be phenylene. According to an embodiment wherein $T^6$ may be biphenylene. According to an embodiment wherein $T^6$ may be terphenylene.

According to an embodiment wherein $Ar^1$, $Ar^2$, $Ar^3$, $Ar^4$ and $Ar^5$ may be independently selected from B1 to B16:

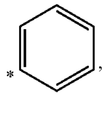

(B1)

-continued

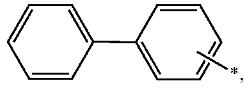

(B2)

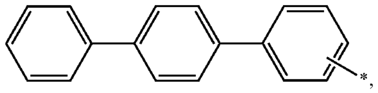

(B3)

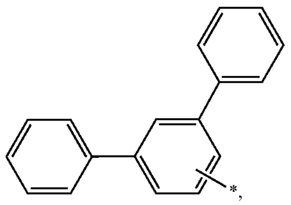

(B4)

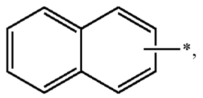

(B5)

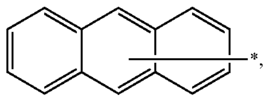

(B6)

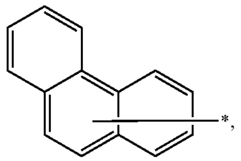

(B7)

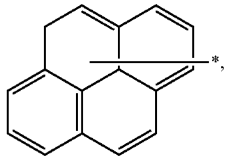

(B8)

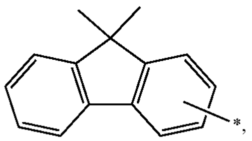

(B9)

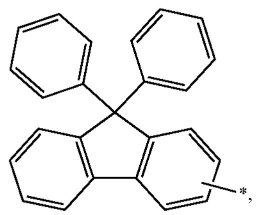

(B10)

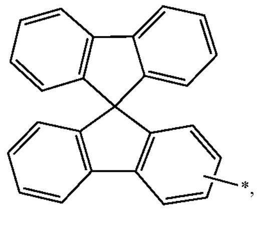

(B11)

-continued (B12)

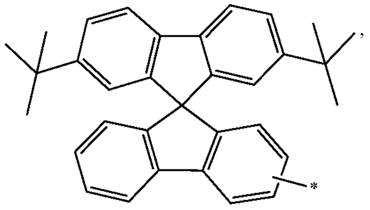

(B13)

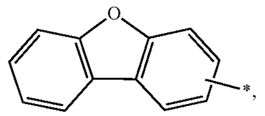

(B14)

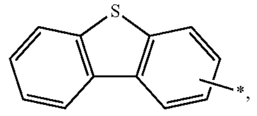

(B15)

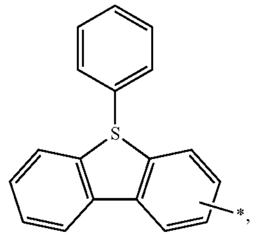

(B16)

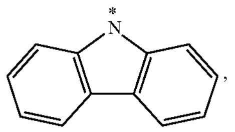

wherein the asterix "*" denotes the binding position.

According to an embodiment, wherein $Ar^1$, $Ar^2$, $Ar^3$, $Ar^4$ and $Ar^5$ may be independently selected from B1 to B15; alternatively selected from B1 to B10 and B13 to B15.

According to an embodiment, wherein $Ar^1$, $Ar^2$, $Ar^3$, $Ar^4$ and $Ar^5$ may be independently selected from the group consisting of B1, B2, B5, B7, B9, B10, B13 to B16.

The rate onset temperature may be in a range particularly suited to mass production, when $Ar^1$, $Ar^2$, $Ar^3$, $Ar^4$ and $Ar^5$ are selected in this range.

The "matrix compound of formula (III) or formula (IV)" may be also referred to as "hole transport compound".

According to one embodiment the compound of formula (III) or formula (IV) may comprises at least ≥1 to ≤6 substituted or unsubstituted aromatic fused ring systems comprising heteroaromatic rings.

According to one embodiment the compound of formula (III) or formula (IV) may comprises at least ≥1 to ≤6 substituted or unsubstituted aromatic fused ring systems comprising heteroaromatic rings and at least ≥1 to ≤3 substituted or unsubstituted unsaturated 5- to 7-member ring of a heterocycle, preferably ≥2 to ≤5 substituted or unsubstituted aromatic fused ring systems comprising heteroaromatic rings.

According to one embodiment the compound of formula (III) or formula (IV) may comprises at least ≥1 to ≤6 substituted or unsubstituted aromatic fused ring systems comprising heteroaromatic rings and at least ≥1 to ≤3 substituted or unsubstituted unsaturated 5- to 7-member ring of a heterocycle, preferably ≥2 to ≤5 substituted or unsubstituted aromatic fused ring systems comprising heteroaromatic rings, and at least ≥1 to ≤3 substituted or unsubstituted unsaturated 5- to 7-member ring of a heterocycle, further preferred 3 or 4 substituted or unsubstituted aromatic fused ring systems comprising heteroaromatic rings and optional at least ≥1 to ≤3 substituted or unsubstituted unsaturated 5- to 7-member ring of a heterocycle, and additional preferred wherein the aromatic fused ring systems comprising heteroaromatic rings are unsubstituted and optional at least ≥1 to ≤3 unsubstituted unsaturated 5- to 7-member ring of a heterocycle.

According to one embodiment the compound of formula (III) or formula (IV) may comprises at least ≥1 to ≤6 substituted or unsubstituted aromatic fused ring systems, preferably ≥2 to ≤5 substituted or unsubstituted aromatic fused ring systems, and further preferred 3 or 4 substituted or unsubstituted aromatic fused ring systems.

According to one embodiment the compound of formula (III) or formula (IV) may comprises at least ≥1 to ≤6 substituted or unsubstituted aromatic fused ring systems, preferably ≥2 to ≤5 substituted or unsubstituted aromatic fused ring systems, and further preferred 3 or 4 substituted or unsubstituted aromatic fused ring systems, which comprises substituted or unsubstituted heteroaromatic rings.

According to one embodiment the compound of formula (III) or formula (IV) may comprises at least ≥1 to ≤3 or 2 substituted or unsubstituted unsaturated 5- to 7-member ring of a heterocycle.

According to one embodiment the compound of formula (III) or formula (IV) may comprises at least ≥1 to ≤3 or 2 substituted or unsubstituted unsaturated 7-member ring of a heterocycle.

According to one embodiment substituted or unsubstituted aromatic fused ring systems of the compound of formula (III) or formula (IV) may comprises at least ≥1 to ≤3 or 2 substituted or unsubstituted unsaturated 5- to 7-member ring of a heterocycle.

According to one embodiment the substituted or unsubstituted aromatic fused ring systems of the matrix compound of formula (III) or formula (IV) may comprises at least ≥1 to ≤3 or 2 substituted or unsubstituted unsaturated 7-member ring of a heterocycle.

According to one embodiment the compound of formula (III) or formula (IV) may comprises at least ≥1 to ≤6 substituted or unsubstituted aromatic fused ring systems, preferably ≥2 to ≤5 substituted or unsubstituted aromatic fused ring systems, and further preferred 3 or 4 substituted or unsubstituted aromatic fused ring systems, and wherein the aromatic fused ring system comprises substituted or unsubstituted unsaturated 5- to 7-member ring of a heterocycle.

According to one embodiment the compound of formula (III) or formula (IV) may comprises at least ≥1 to ≤6 substituted or unsubstituted aromatic fused ring systems, preferably ≥2 to ≤5 substituted or unsubstituted aromatic fused ring systems, and further preferred 3 or 4 substituted or unsubstituted aromatic fused ring systems, which comprises substituted or unsubstituted heteroaromatic rings, and wherein the aromatic fused ring system comprises substituted or unsubstituted unsaturated 5- to 7-member ring of a heterocycle.

According to one embodiment the compound of formula (III) or formula (IV) may comprises at least ≥1 to ≤6 substituted or unsubstituted aromatic fused ring systems, preferably ≥2 to ≤5 substituted or unsubstituted aromatic fused ring systems, and further preferred 3 or 4 substituted or unsubstituted aromatic fused ring systems, and wherein the aromatic fused ring system comprises at least ≥1 to ≤3 or 2 substituted or unsubstituted unsaturated 5- to 7-member ring of a heterocycle.

According to one embodiment the compound of formula (III) or formula (IV) may comprises at least ≥1 to ≤6 substituted or unsubstituted aromatic fused ring systems, preferably ≥2 to ≤5 substituted or unsubstituted aromatic fused ring systems, and further preferred 3 or 4 substituted or unsubstituted aromatic fused ring systems, which comprises substituted or unsubstituted heteroaromatic rings, and wherein the aromatic fused ring system comprises at least ≥1 to ≤3 or 2 substituted or unsubstituted unsaturated 5- to 7-member ring of a heterocycle.

According to one embodiment the compound of formula (III) or formula (IV) may comprises:

- a substituted or unsubstituted aromatic fused ring systems with at least ≥2 to ≤6, preferably ≥3 to ≤5, or 4 fused aromatic rings selected from the group comprising substituted or unsubstituted non-hetero aromatic rings, substituted or unsubstituted hetero 5-member rings, substituted or unsubstituted 6-member rings and/or substituted or unsubstituted unsaturated 5- to 7-member ring of a heterocycle; or
- an unsubstituted aromatic fused ring systems with at least ≥2 to ≤6, preferably ≥3 to ≤5, or 4 fused aromatic rings selected from the group comprising unsubstituted non-hetero aromatic rings, unsubstituted hetero 5-member rings, unsubstituted 6-member rings and/or unsubstituted unsaturated 5- to 7-member ring of a heterocycle.

It should be noted here that the wording "aromatic fused ring system" may include at least one aromatic ring and at least one substituted or unsubstituted unsaturated 5- to 7-member ring. It should be noted here that the substituted or unsubstituted unsaturated 5- to 7-member ring may not be an aromatic ring.

According to one embodiment the compound of formula (III) or formula (IV) may comprises at least at least ≥1 to ≤6, preferably ≥2 to ≤5, or further preferred 3 or 4 of the substituted or unsubstituted aromatic fused ring systems with:

- at least one unsaturated 5-member ring, and/or
- at least one unsaturated 6-member ring, and/or
- at least one unsaturated 7-member ring; wherein preferably at least one unsaturated 5- and/or at least one unsaturated 7-member ring comprises at least 1 to 3, preferably 1 hetero-atom.

According to one embodiment the compound of formula (III) or formula (IV) may comprises at least at least ≥1 to ≤6, preferably ≥2 to ≤5, or further preferred 3 or 4 of the substituted or unsubstituted aromatic fused ring systems with:

- at least one aromatic 5-member ring, and/or
- at least one aromatic 6-member ring, and/or
- at least one aromatic 7-member ring; wherein preferably at least one aromatic 5- and/or at least one aromatic 7-member ring comprises at least 1 to 3, preferably 1 hetero-atom;
- wherein the substituted or unsubstituted aromatic fused ring system comprises at least ≥1 to ≤3 or 2 substituted or unsubstituted unsaturated 5- to 7-member ring of a heterocycle.

According to one embodiment the compound of formula (III) or formula (IV) may comprises:

- at least ≥6 to ≤12, preferably ≥7 to ≤11, further preferred ≥8 to ≤10 or 9 aromatic rings; and/or
- at least ≥4 to ≤11, preferably ≥5 to ≤10, further preferred ≥6 to ≤9 or in addition preferred 7 or 8 non-hetero aromatic rings, preferably the non-hetero aromatic rings are aromatic $C_6$ rings; and/or
- at least ≥1 to ≤4, preferably 2 or 3 aromatic 5-member-rings, preferably hetero aromatic 5-member-rings; and/or
- at least 1 or 2 unsaturated 5- to 7-member-ring of a heterocycle, preferably at least 1 or 2 unsaturated 7-member-ring of a heterocycle;
- at least ≥6 to ≤12, preferably ≥7 to ≤11, further preferred ≥8 to ≤10 or 9 aromatic rings, wherein therefrom
  - at least ≥4 to ≤11, preferably ≥5 to ≤10, further preferred ≥6 to ≤9 or in addition preferred 7 or 8 are non-hetero aromatic rings, and
  - at least ≥1 to ≤4, preferably 2 or 3 aromatic rings are hetero aromatic rings, wherein the total number of non-hetero aromatic rings and hetero aromatic rings in total does not exceed 12 aromatic rings; and/or
- at least ≥6 to ≤12, preferably ≥7 to ≤11, further preferred ≥8 to ≤10 or 9 aromatic rings, wherein therefrom
  - at least ≥4 to ≤11, preferably ≥5 to ≤10, further preferred ≥6 to ≤9 or in addition preferred 7 or 8 are non-hetero aromatic rings, and
  - at least ≥1 to ≤4, preferably 2 or 3 aromatic rings are hetero aromatic rings, wherein the total number of non-hetero aromatic rings and hetero aromatic rings in total does not exceed 12 aromatic rings; and
    - the hole transport compound or the hole transport compound according to formula I comprises at least ≥1 to ≤4, preferably 2 or 3 aromatic 5-member-rings, preferably hetero aromatic 5-member-rings, and/or
    - the hole transport compound or the hole transport compound according to formula (I) comprises at least 1 or 2 unsaturated 5- to 7-member-ring of a heterocycle, preferably at least 1 or 2 unsaturated 7-member-ring of a heterocycle.

According to one embodiment the compound of formula (III) or formula (IV) may comprises a hetero-atom, which may be selected from the group comprising O, S, N, B or P, preferably the hetero-atom may be selected from the group comprising O, S or N.

According to one embodiment the matrix compound of formula (III) or formula (IV) may comprises at least at least ≥1 to ≤6, preferably ≥2 to ≤5, or further preferred 3 or 4 of the substituted or unsubstituted aromatic fused ring systems with:

- at least one aromatic 5-member ring, and/or
- at least one aromatic 6-member ring, and/or
- at least one aromatic 7-member ring; wherein preferably at least one aromatic 5- and/or at least one aromatic 7-member ring comprises at least 1 to 3, preferably 1 hetero-atom;
  - wherein the substituted or unsubstituted aromatic fused ring system optional comprises at least ≥1 to ≤3 or 2 substituted or unsubstituted unsaturated 5- to 7-member ring of a heterocycle; and wherein the substituted or unsubstituted aromatic fused ring system comprises a hetero-atom, which may be selected from the group comprising O, S, N, B, P or Si, preferably the hetero-atom may be selected from the group comprising O, S or N.

According to one embodiment the compound of formula (III) or formula (IV) may be free of hetero-atoms which are not part of an aromatic ring and/or part of an unsaturated 7-member-ring, preferably the hole transport compound or the hole transport compound according to formula (I) may be free on N-atoms except N-atoms which are part of an aromatic ring or are part of an unsaturated 7-member-ring.

According to one embodiment, the substantially covalent matrix compound comprises at least one naphthyl group, carbazole group, dibenzofurane group, dibenzothiophene group and/or substituted fluorenyl group, wherein the substituents are independently selected from methyl, phenyl or fluorenyl.

According to an embodiment of the organic electronic device, wherein the compound of formula (III) or formula (IV) are selected from K1 to K16:

(K1)

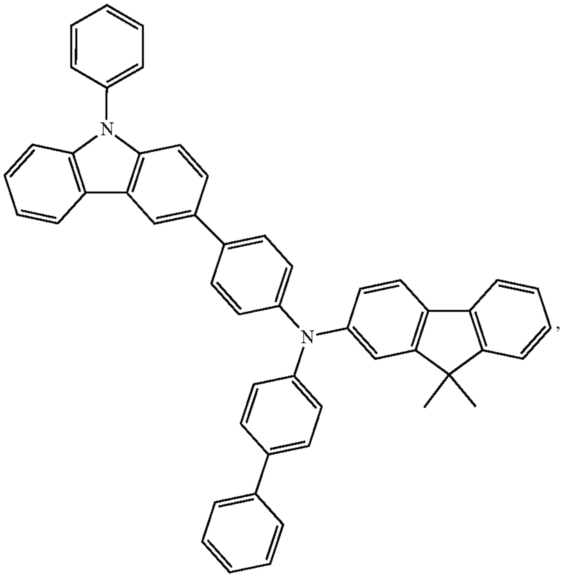

(K2)

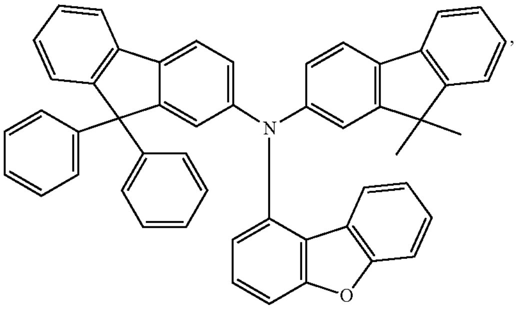

(K3)

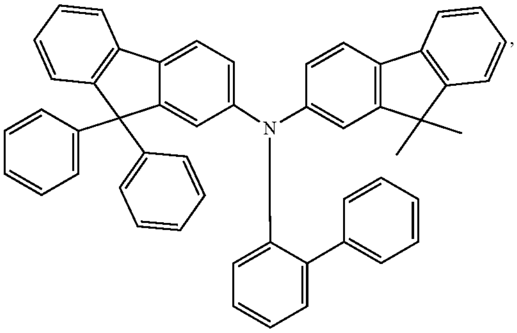

-continued (K4)

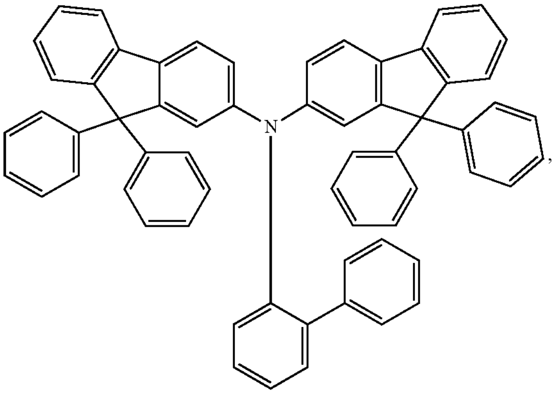

(K5)

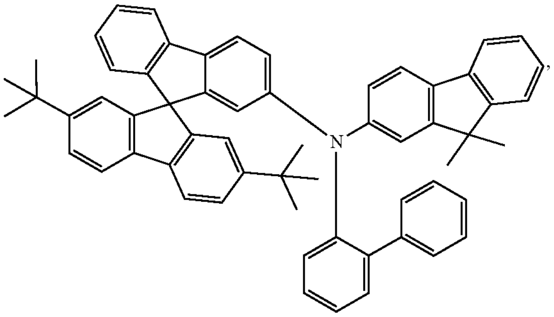

(K6)

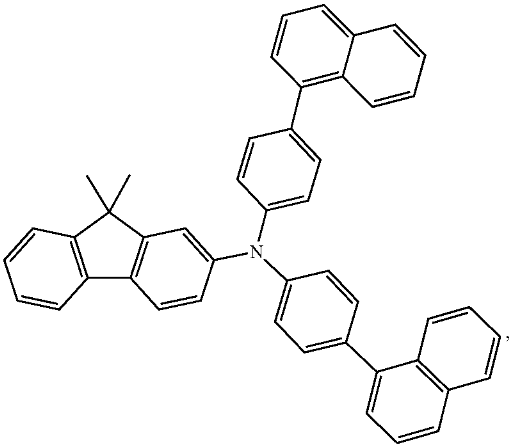

(K7)

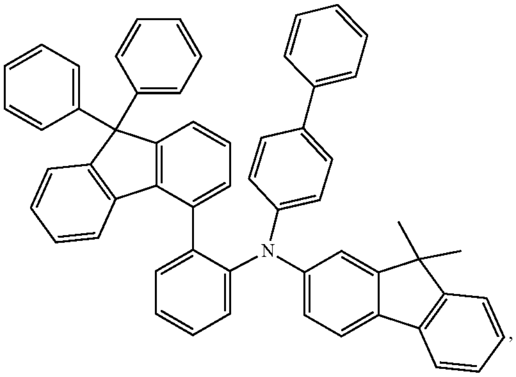

-continued
(K8)
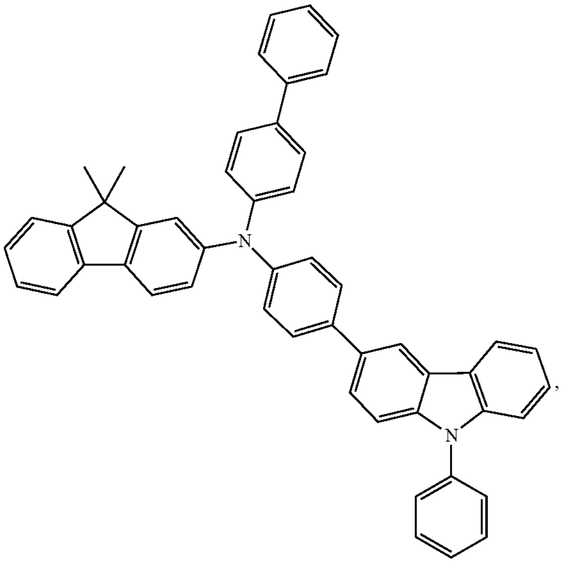
,
(K9)
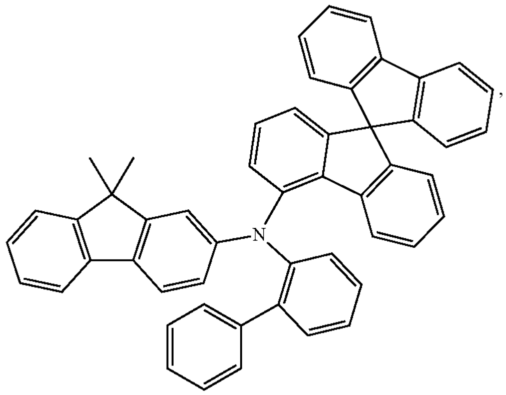
,
(K10)
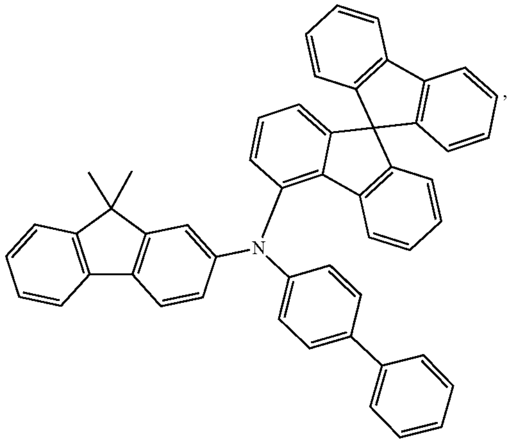
,
-continued
(K11)
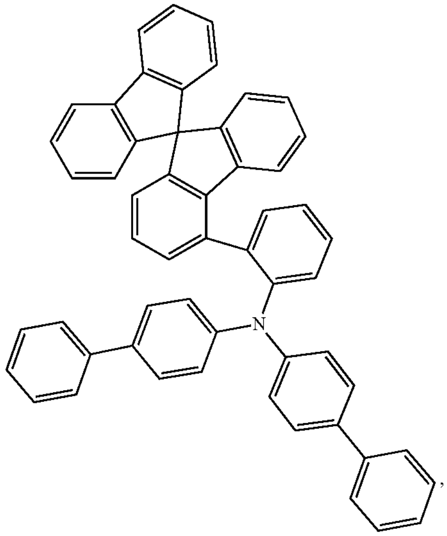
,
(K12)
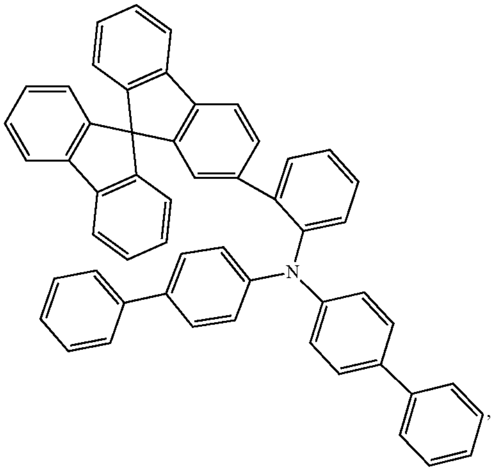
,
(K13)
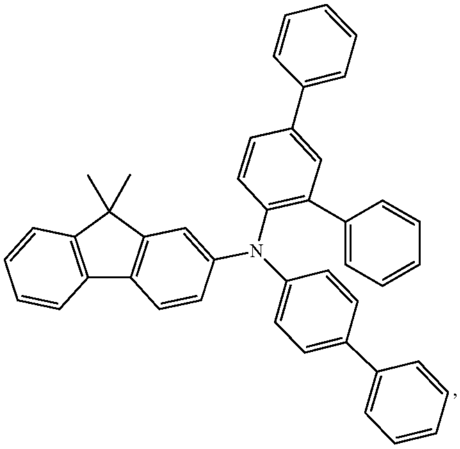
, -continued (K14)

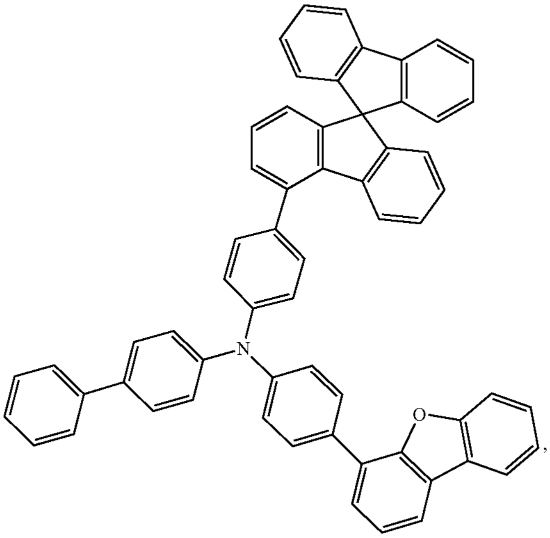

, (K15)

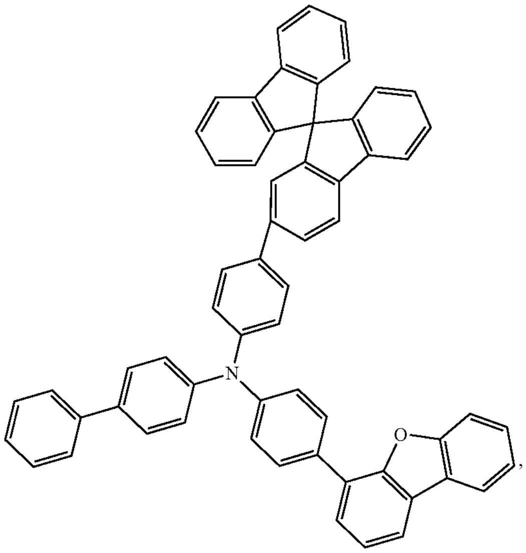

, and (K16)

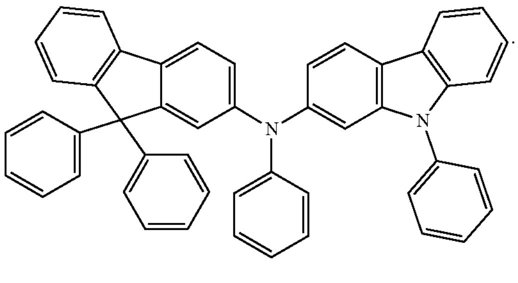

.

The substantially covalent matrix compound may be free of HTM014, HTM081, HTM163, HTM222, EL-301, HTM226, HTM355, HTM133, HTM334, HTM604 and EL-22T. The abbreviations denote the manufacturers' names, for example, of Merck or Lumtec.

Hole Injection Layer

A hole injection layer (HIL) may be formed on the anode layer by vacuum deposition, spin coating, printing, casting, slot-die coating, Langmuir-Blodgett (LB) deposition, or the like. When the HIL is formed using vacuum deposition, the deposition conditions may vary according to the hole transport compound that is used to form the HIL, and the desired structure and thermal properties of the HIL. In general, however, conditions for vacuum deposition may include a deposition temperature of 100° C. to 350° C., a pressure of $10^{-8}$ to $10^{-3}$ Torr (1 Torr equals 133.322 Pa), and a deposition rate of 0.1 to 10 nm/sec.

When the HIL is formed using spin coating or printing, coating conditions may vary according to the hole transport compound that is used to form the HIL, and the desired structure and thermal properties of the HIL. For example, the coating conditions may include a coating speed of about 2000 rpm to about 5000 rpm, and a thermal treatment temperature of about 80° C. to about 200° C. Thermal treatment removes a solvent after the coating is performed.

The HIL may be formed of a metal complex according to formula (I).

The thickness of the HIL may be in the range from about 1 nm to about 15 nm, and for example, from about 2 nm to about 15 nm, alternatively about 2 nm to about 12 nm.

When the thickness of the HIL is within this range, the HIL may have excellent hole injecting characteristics, without a substantial penalty in driving voltage.

According to one embodiment of the present invention, the hole injection layer may comprise:

at least about ≥0.5 wt.-% to about ≤30 wt.-%, preferably about ≥0.5 wt.-% to about ≤20 wt.-%, and more preferred about ≥15 wt.-% to about ≤1 wt.-% of a metal complex according to formula (I), and at least about ≥70 wt.-% to about ≤99.5 wt.-%, preferably about ≥80 wt.-% to about ≤99.5 wt.-%, and more preferred about ≥85 wt.-% to about ≤99 wt.-% of a substantially covalent matrix compound; preferably the wt.-% of the a metal complex according to formula (I) is lower than the wt.-% of the substantially covalent matrix compound; wherein the weight-% of the components are based on the total weight of the hole injection layer.

Preferably, the hole injection layer may be free of ionic liquids, metal phthalocyanine, CuPc, HAT-CN, Pyrazino[2,3-f][1,10]phenanthroline-2,3-dicarbonitrile, $F_4TCNQ$, metal fluoride and/or metal oxides, wherein the metal in the metal oxide is selected from Re and/or Mo. Thereby, the hole injection layer may be deposited under conditions suitable for mass production.

According to an embodiment of the electronic device, wherein the hole injection layer is non-emissive.

It is to be understood that the hole injection layer is not part of the anode layer.

Hole Transport Layer/Hole Injection Layer

According to a further embodiment the organic electronic device further comprises a hole transport layer, wherein the hole transport layer is arranged between the hole injection layer and the at least one emission layer.

In one embodiment of the present invention, the hole injection layer comprises a substantially covalent matrix compound.

In one embodiment of the present invention, the hole transport layer comprises a substantially covalent matrix compound.

In one embodiment of the present invention, the hole transport layer comprises a substantially covalent matrix compound, wherein the substantially covalent matrix compound in the hole injection layer and hole transport layer are selected the same.

Preferably, the matrix compound of the hole injection layer is free of metals and/or ionic bonds.

Further Layers

In accordance with the invention, the electronic device may comprise, besides the layers already mentioned above, further layers. Exemplary embodiments of respective layers are described in the following:

Substrate

The substrate may be any substrate that is commonly used in manufacturing of electronic devices, such as organic light-emitting diodes. If light is to be emitted through the substrate, the substrate shall be a transparent or semitransparent material, for example a glass substrate or a transparent plastic substrate. If light is to be emitted through the top surface, the substrate may be both a transparent as well as a non-transparent material, for example a glass substrate, a plastic substrate, a metal substrate, a silicon substrate or a transistor backplane. Preferably, the substrate is a silicon substrate or transistor backplane.

Anode Layer

The anode layer, also named anode electrode, may be formed by depositing or sputtering a material that is used to form the anode layer. The material used to form the anode layer may be a high work-function material, so as to facilitate hole injection. The anode layer may be a transparent or reflective electrode. Transparent conductive oxides, such as indium tin oxide (ITO), indium zinc oxide (IZO), tin-dioxide (SnO2), aluminum zinc oxide (AlZO) and zinc oxide (ZnO), may be used to form the anode layer. The anode layer may also be formed using metals, typically silver (Ag), gold (Au), or metal alloys.

The anode layer may comprise two or more anode sub-layers.

According to one embodiment, the anode layer comprises a first anode sub-layer and a second anode sub-layer, wherein the first anode sub-layer is arranged closer to the substrate and the second anode sub-layer is arranged closer to the cathode layer.

According to one embodiment, the anode layer may comprise a first anode sub-layer comprising or consisting of Ag or Au and a second anode-sub-layer comprising or consisting of transparent conductive oxide.

According to one embodiment, the anode layer comprises a first anode sub-layer, a second anode sub-layer and a third anode sub-layer, wherein the first anode sub-layer is arranged closer to the substrate and the second anode sub-layer is arranged closer to the cathode layer, and the third anode sub-layer is arranged between the substrate and the first anode sub-layer.

According to one embodiment, the anode layer may comprise a first anode sub-layer comprising or consisting of Ag or Au, a second anode-sub-layer comprising or consisting of transparent conductive oxide and optionally a third anode sub-layer comprising or consisting of transparent conductive oxide. Preferably the first anode sub-layer may comprise or consists of Ag, the second anode-sublayer may comprise or consists of ITO or IZO and the third anode sub-layer may comprises or consists of ITO or IZO.

Preferably the first anode sub-layer may comprise or consists of Ag, the second anode-sublayer may comprise or consists of ITO and the third anode sub-layer may comprise or consist of ITO.

Preferably, the transparent conductive oxide in the second and third anode sub-layer may be selected the same.

According to one embodiment, the anode layer may comprise a first anode sub-layer comprising Ag or Au having a thickness of 100 to 150 nm, a second anode sub-layer comprising or consisting of a transparent conductive oxide having a thickness of 3 to 20 nm and a third anode sub-layer comprising or consisting of a transparent conductive oxide having a thickness of 3 to 20 nm.

Hole Transport Layer

According to one embodiment of the electronic device, wherein the electronic device further comprises a hole transport layer, wherein the hole transport layer is arranged between the hole injection layer and the at least one first emission layer.

The hole transport layer may comprise a substantially covalent matrix compound. According to one embodiment the substantially covalent matrix compound of the hole transport layer may be selected from at least one organic compound. The substantially covalent matrix may consist substantially from covalently bound C, H, O, N, S, which optionally comprise in addition covalently bound B, P, As and/or Se.

According to one embodiment of the electronic device, the hole transport layer comprises a substantially covalent matrix compound, wherein the substantially covalent matrix compound of the hole transport layer may be selected from organic compounds consisting substantially from covalently bound C, H, O, N, S, which optionally comprise in addition covalently bound B, P, As and/or Se.

According to one embodiment, the substantially covalent matrix compound of the hole transport layer may have a molecular weight Mw of ≥400 and ≤2000 g/mol, preferably a molecular weight Mw of ≥450 and ≤1500 g/mol, further preferred a molecular weight Mw of ≥500 and ≤1000 g/mol, in addition preferred a molecular weight Mw of ≥550 and ≤900 g/mol, also preferred a molecular weight Mw of ≥600 and ≤800 g/mol.

Preferably, the substantially covalent matrix compound of the hole injection layer and the substantially covalent matrix compound of the hole transport layer are selected the same.

According to one embodiment of the electronic device, wherein the hole transport layer of the electronic device comprises a substantially covalent matrix compound, preferably the substantially covalent matrix compound in the hole injection layer and hole transport layer are selected the same.

The hole transport layer (HTL) may be formed on the HIL by vacuum deposition, spin coating, slot-die coating, printing, casting, Langmuir-Blodgett (LB) deposition, or the like. When the HTL is formed by vacuum deposition or spin coating, the conditions for deposition and coating may be similar to those for the formation of the HIL. However, the conditions for the vacuum or solution deposition may vary, according to the hole transport compound that is used to form the HTL.

The thickness of the HTL may be in the range of about 5 nm to about 250 nm, preferably, about 10 nm to about 200 nm, further about 20 nm to about 190 nm, further about 40 nm to about 180 nm, further about 60 nm to about 170 nm, further about 80 nm to about 200 nm, further about 100 nm to about 180 nm, further about 110 nm to about 140 nm.

When the thickness of the HTL is within this range, the HTL may have excellent hole transporting characteristics, without a substantial penalty in driving voltage.

Electron Blocking Layer

The function of an electron blocking layer (EBL) is to prevent electrons from being transferred from an emission layer to the hole transport layer and thereby confine electrons to the emission layer. Thereby, efficiency, operating voltage and/or lifetime may be improved. Typically, the electron blocking layer comprises a triarylamine compound.

If the electron blocking layer has a high triplet level, it may also be described as triplet control layer.

The function of the triplet control layer is to reduce quenching of triplets if a phosphorescent green or blue emission layer is used. Thereby, higher efficiency of light emission from a phosphorescent emission layer may be achieved. The triplet control layer may be selected from triarylamine compounds with a triplet level above the triplet level of the phosphorescent emitter in the adjacent emission layer.

The thickness of the electron blocking layer may be selected between 2 and 20 nm.

Photoactive Layer (PAL)

The photoactive layer converts an electrical current into photons or photons into an electrical current. The PAL may be formed on the HTL by vacuum deposition, spin coating, slot-die coating, printing, casting, LB deposition, or the like. When the PAL is formed using vacuum deposition or spin coating, the conditions for deposition and coating may be similar to those for the formation of the HIL. However, the conditions for deposition and coating may vary, according to the compound that is used to form the PAL. It may be provided that the photoactive layer does not comprise the a metal complex according to formula (I). The photoactive layer may be a light-emitting layer or a light-absorbing layer.

Emission Layer (EML)

The at least one first emission layer (EML), also referred to as first emission layer may be formed on the HTL or EBL by vacuum deposition, spin coating, slot-die coating, printing, casting, LB deposition, or the like. When the EML is formed using vacuum deposition or spin coating, the conditions for deposition and coating may be similar to those for the formation of the HIL. However, the conditions for deposition and coating may vary, according to the compound that is used to form the EML.

According to the present invention it is preferred that the electronic device comprises one emission layer that is named "first emission layer". However, the electronic device optionally comprises two emission layers, wherein the first layer is named first emission layer and second layer is named second emission layer.

It may be provided that the at least one emission layer also referred to as first emission layer is free of the matrix compound of the hole injection layer.

It may be provided that the at least one emission layer does not comprise the a metal complex according to formula (I).

The at least one emission layer (EML) may be formed of a combination of a host and an emitter dopant. Example of the host are Alq3, 4,4'-N,N'-dicarbazole-biphenyl (HTC-10), poly(n-vinyl carbazole) (PVK), 9,10-di(naphthalene-2-yl) anthracene (ADN), 4,4',4"-tris(carbazol-9-yl)-triphenylamine(TCTA), 1,3,5-tris(N-phenylbenzimidazole-2-yl)benzene (TPBI), 3-tert-butyl-9,10-di-2-naphthylanthracenee (TBADN), distyrylarylene (DSA) and bis(2-(2-hydroxyphenyl)benzo-thiazolate)zinc (Zn(BTZ)2).

The emitter dopant may be a phosphorescent or fluorescent emitter. Phosphorescent emitters and emitters which emit light via a thermally activated delayed fluorescence (TADF) mechanism may be preferred due to their higher efficiency. The emitter may be a small molecule or a polymer.

Examples of red emitter dopants are PtOEP, Ir(piq)3, and Btp2lr(acac), but are not limited thereto. These compounds are phosphorescent emitters; however, fluorescent red emitter dopants could also be used.

Examples of phosphorescent green emitter dopants are Ir(ppy)3 (ppy=phenylpyridine), Ir(ppy)2(acac), Ir(mpyp)3.

Examples of phosphorescent blue emitter dopants are F2Irpic, $(F2ppy)_2Ir(tmd)$ and Ir(dfppz)3 and ter-fluorene. 4.4'-bis(4-diphenyl amiostyryl)biphenyl (DPA VBi), 2,5,8,11-tetra-tert-butyl perylene (TBPe) are examples of fluorescent blue emitter dopants.

The amount of the emitter dopant may be in the range from about 0.01 to about 50 parts by weight, based on 100 parts by weight of the host. Alternatively, the at least one emission layer may consist of a light-emitting polymer. The EML may have a thickness of about 10 nm to about 100 nm, for example, from about 20 nm to about 60 nm. When the thickness of the EML is within this range, the EML may have excellent light emission, without a substantial penalty in driving voltage.

Hole Blocking Layer (HBL)

A hole blocking layer (HBL) may be formed on the EML, by using vacuum deposition, spin coating, slot-die coating, printing, casting, LB deposition, or the like, in order to prevent the diffusion of holes into the ETL. When the EML comprises a phosphorescent emitter dopant, the HBL may have also a triplet exciton blocking function.

The HBL may also be named auxiliary ETL or a-ETL.

When the HBL is formed using vacuum deposition or spin coating, the conditions for deposition and coating may be similar to those for the formation of the HIL. However, the conditions for deposition and coating may vary, according to the compound that is used to form the HBL. Any compound that is commonly used to form an HBL may be used. Examples of compounds for forming the HBL include oxadiazole derivatives, triazole derivatives, phenanthroline derivatives and triazine derivatives.

The HBL may have a thickness in the range from about 5 nm to about 100 nm, for example, from about 10 nm to about 30 nm. When the thickness of the HBL is within this range, the HBL may have excellent hole-blocking properties, without a substantial penalty in driving voltage.

Electron Transport Layer (ETL)

The electronic device according to the present invention may further comprise an electron transport layer (ETL).

According to another embodiment of the present invention, the electron transport layer may further comprise an azine compound, preferably a triazine compound.

In one embodiment, the electron transport layer may further comprise a dopant selected from an alkali organic complex, preferably LiQ.

The thickness of the ETL may be in the range from about 15 nm to about 50 nm, for example, in the range from about 20 nm to about 40 nm. When the thickness of the EIL is within this range, the ETL may have satisfactory electron-injecting properties, without a substantial penalty in driving voltage.

According to another embodiment of the present invention, the electronic device may further comprise a hole blocking layer and an electron transport layer, wherein the hole blocking layer and the electron transport layer comprise an azine compound. Preferably, the azine compound is a triazine compound.

Electron Injection Layer (EIL)

An optional EIL, which may facilitate injection of electrons from the cathode, may be formed on the ETL, preferably directly on the electron transport layer. Examples of materials for forming the EIL include lithium 8-hydroxyquinolinolate (LiQ), LiF, NaCl, CsF, Li2O, BaO, Ca, Ba, Yb, Mg which are known in the art. Deposition and coating conditions for forming the EIL are similar to those for formation of the HIL, although the deposition and coating conditions may vary, according to the material that is used to form the EIL.

The thickness of the EIL may be in the range from about 0.1 nm to about 10 nm, for example, in the range from about 0.5 nm to about 9 nm. When the thickness of the EIL is within this range, the EIL may have satisfactory electron-injecting properties, without a substantial penalty in driving voltage.

Cathode Layer

The cathode layer is formed on the ETL or optional EIL. The cathode layer may be formed of a metal, an alloy, an electrically conductive compound, or a mixture thereof. The cathode layer may have a low work function. For example, the cathode layer may be formed of lithium (Li), magnesium (Mg), aluminum (Al), aluminum (Al)-lithium (Li), calcium (Ca), barium (Ba), ytterbium (Yb), magnesium (Mg)-indium (In), magnesium (Mg)-silver (Ag), or the like. Alternatively, the cathode layer may be formed of a transparent conductive oxide, such as ITO or IZO.

The thickness of the cathode layer may be in the range from about 5 nm to about 1000 nm, for example, in the range from about 10 nm to about 100 nm. When the thickness of the cathode layer is in the range from about 5 nm to about 50 nm, the cathode layer may be transparent or semitransparent even if formed from a metal or metal alloy.

It is to be understood that the cathode layer is not part of an electron injection layer or the electron transport layer.

Organic Electronic Device

According to another aspect of the present invention an organic electronic device is provided, wherein the organic electronic device comprising a compound of Formula I.

According to one embodiment of the present invention, the organic electronic device is selected from the group comprising a light emitting device, thin film transistor, a battery, a display device or a photovoltaic cell, and preferably a light emitting device, preferably the electronic device is part of a display device or lighting device.

According to one embodiment the organic electronic device comprises a semiconductor material, wherein at least one semiconductor material comprises a compound represented by Formula I.

According to one embodiment the organic electronic device comprises a semiconductor material, wherein at least one semiconductor material comprises a compound represented by Formula I, and wherein the organic electronic device is a light emitting device, thin film transistor, a battery, a display device or a photovoltaic cell, and preferably a light emitting device, preferably the electronic device is part of a display device or lighting device.

Method of Manufacturing

According to another aspect, there is provided a method of manufacturing an electronic device, the method using:

- at least one deposition source, preferably two deposition sources and more preferred at least three deposition sources.

The methods for deposition that may be suitable comprise:

- deposition via vacuum thermal evaporation;
- deposition via solution processing, preferably the processing may be selected from spin-coating, printing, casting; and/or
- slot-die coating.

According to various embodiments, there is provided a method using:

- a first deposition source to release the matrix compound, and
- a second deposition source to release the a metal complex according to formula (I), also named metal complex.

The method comprising the steps of forming the hole injection layer; whereby for an electronic device:

- the hole injection layer is formed by releasing the matrix compound according to the invention from the first deposition source and the a metal complex according to formula (I), also named metal complex, from the second deposition source.

Ink Formulation

According to another aspect of the present invention an ink formulation is provided, wherein the ink formulation comprises at least one compound of Formula I.

According to one embodiment the ink formulation comprises a solvent. The solvent of the ink formulation may be selected from anisole and/or benzonitrile, preferably it is a mixture of anisole and benzonitrile.

According to one embodiment the mixture of anisole and benzonitrile is of 5:1 to 1:5, 4:1 to 1:4, 3:1 to 1:3, 2:1 to 1:2 or 1:1; preferred is a mixture of anisole and benzonitrile of 5:1.

Compound of Formula (V)

According to another aspect of the invention is provided a compound represented by Formula (V):

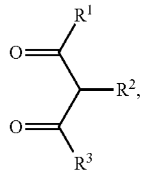

(V)

wherein $R^1$ is selected from formula D69

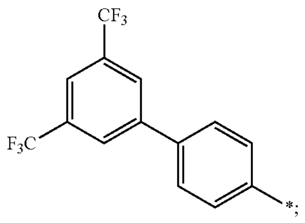

(D69)

$R^2$ is selected from CN, $C_1$ to $C_4$ alkyl, partially or perfluorinated $C_1$ to $C_4$ alkyl, or F;

$R^3$ is independently selected from substituted $C_1$ to $C_{12}$ alkyl, wherein at least one substituent is selected from F, CN, substituted or unsubstituted $C_1$ to $C_{12}$ alkyl, partially or fully fluorinated $C_1$ to $C_{12}$ alkyl, substituted or unsubstituted $C_6$ to $C_{18}$ aryl, and substituted or unsubstituted $C_2$ to $C_{18}$ heteroaryl, wherein the substituents of the substituted or unsubstituted $C_1$ to $C_{12}$ alkyl, substituted or unsubstituted $C_6$ to $C_{18}$ aryl, and substituted or unsubstituted $C_2$ to $C_{18}$ heteroaryl are selected from F, CN, $C_1$ to $C_6$ alkyl, $CF_3$.

The compounds of formula (V) can be used as ligands for metal complexes which may be used in organic electronic devices.

$R^2$ is preferably selected from CN, $CH_3$, $CF_3$, $C_2F_5$, $C_3F_7$ or F, preferably CN, $CH_3$, $CF_3$, $C_2F_5$ or $C_3F_7$; more preferred CN, $CH_3$ or $CF_3$.

Preferably, compound of formula (V) is selected from formulas L1 to L8:

(L1)

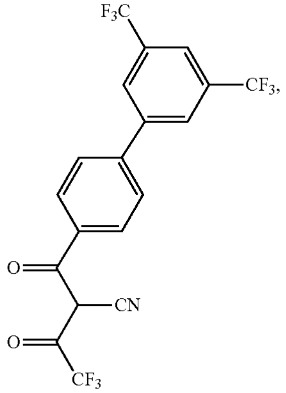

(L2)

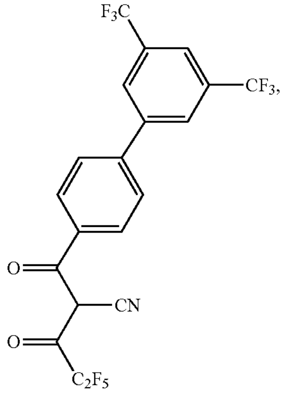

(L3)

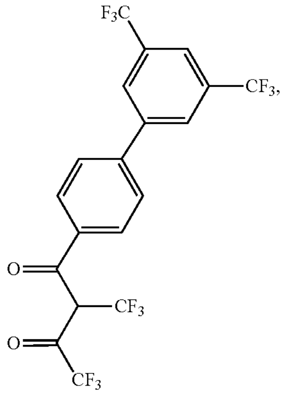

(L4)

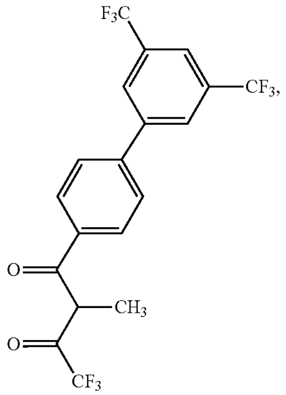

-continued (L5)

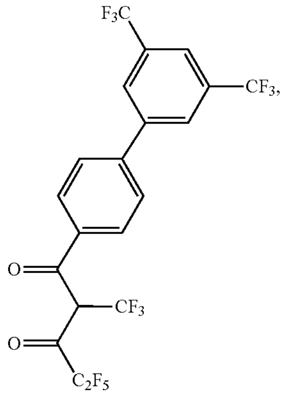

(L6)

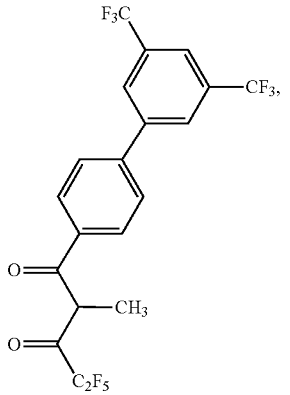

(L7)

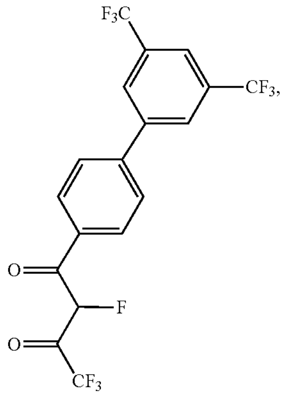

(L8)

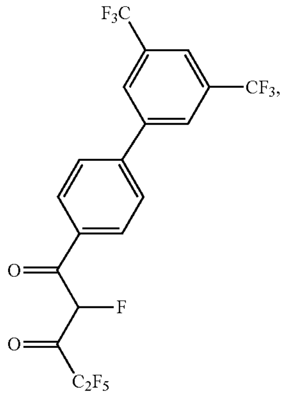

more preferred compound of formula (V) is selected from formulas L1 to L6.

Hereinafter, the embodiments are illustrated in more detail with reference to examples. However, the present disclosure is not limited to the following examples. Reference will now be made in detail to the exemplary aspects.

DESCRIPTION OF THE DRAWINGS

The aforementioned components, as well as the claimed components and the components to be used in accordance with the invention in the described embodiments, are not subject to any special exceptions with respect to their size, shape, material selection and technical concept such that the selection criteria known in the pertinent field can be applied without limitations.

Additional details, characteristics and advantages of the object of the invention are disclosed in the dependent claims and the following description of the respective figures which in an exemplary fashion show preferred embodiment according to the invention. Any embodiment does not necessarily represent the full scope of the invention, however, and reference is made therefore to the claims and herein for interpreting the scope of the invention. It is to be understood that both the foregoing general description and the following detailed description are exemplary and explanatory only and are intended to provide further explanation of the present invention as claimed.

FIG. 1 is a schematic sectional view of an organic electronic device 101, according to an exemplary embodiment of the present invention. The organic electronic device 101 includes a substrate (110), an anode layer (120), a hole injection layer comprising a metal complex according to formula (I) (130), a photoactive layer (PAL) (151) and a cathode layer (190).

FIG. 2 is a schematic sectional view of an organic light-emitting diode (OLED) 100, according to an exemplary embodiment of the present invention. The OLED 100 includes a substrate (110), an anode layer (120), a hole injection layer comprising a metal complex according to formula (I) (130), an emission layer (EML) (150) and a cathode layer (190).

FIG. 3 is a schematic sectional view of an organic light-emitting diode (OLED) 100, according to an exemplary embodiment of the present invention. The OLED 100 includes a substrate (110), an anode layer (120), a hole injection layer comprising a metal complex according to formula (I) (130), a hole transport layer (HTL) (140), an emission layer (EML) (150), an electron transport layer (ETL) (160) and a cathode layer (190).

FIG. 4 is a schematic sectional view of an organic light-emitting diode (OLED) 100, according to an exemplary embodiment of the present invention. The OLED 100 includes a substrate (110), an anode layer (120), a hole injection layer comprising a metal complex according to formula (I) (130), a hole transport layer (HTL) (140), an electron blocking layer (EBL) (145), an emission layer (EML) (150), a hole blocking layer (HBL) (155), an electron transport layer (ETL) (160), an optional electron injection layer (EIL) (180), and a cathode layer (190).

FIG. 5 is a schematic sectional view of an organic light-emitting diode (OLED) 100, according to an exemplary embodiment of the present invention. The OLED 100 includes a substrate (110), an anode layer (120) that comprises a first anode sub-layer (121) and a second anode sub-layer (122), a hole injection layer comprising a metal complex according to formula (I) (130), a hole transport layer (HTL) (140), an electron blocking layer (EBL) (145), an emission layer (EML) (150), a hole blocking layer (EBL) (155), an electron transport layer (ETL) (160) and a cathode layer (190).

FIG. 6 is a schematic sectional view of an organic light-emitting diode (OLED) 100, according to an exemplary embodiment of the present invention. The OLED 100 includes a substrate (110), an anode layer (120) that comprises a first anode sub-layer (121), a second anode sub-layer (122) and a third anode sub-layer (123), a hole injection layer comprising a metal complex according to formula (I) (130), a hole transport layer (HTL) (140), an electron blocking layer (EBL) (145), an emission layer (EML) (150), a hole blocking layer (EBL) (155), an electron transport layer (ETL) (160) and a cathode layer (190). The layers are disposed exactly in the order as mentioned before.

Figure 1:
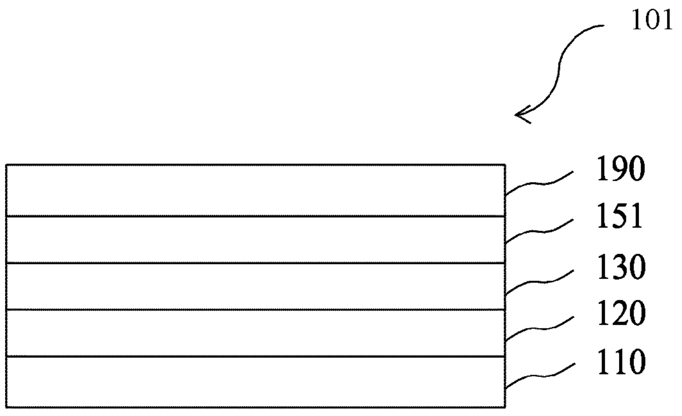
FIG. 1 is a schematic sectional view of an organic electronic device, according to an exemplary embodiment of the present invention.

In the description above the method of manufacture an organic electronic device 101 of the present invention is for example started with a substrate (110) onto which an anode layer (120) is formed, on the anode layer (120), a hole injection layer comprising a metal complex according to formula (I) (130), a photoactive layer (151) and a cathode electrode 190 are formed, exactly in that order or exactly the other way around.

In the description above the method of manufacture an OLED of the present invention is started with a substrate (110) onto which an anode layer (120) is formed, on the anode layer (120), a hole injection layer comprising a metal complex according to formula (I) (130), optional a hole transport layer (140), optional an electron blocking layer (145), an emission layer (150), optional a hole blocking layer (155), optional an electron transport layer (160), optional an electron injection layer (180), and a cathode electrode 190 are formed, exactly in that order or exactly the other way around.

The semiconductor layer comprising a metal complex according to formula (I) (130) can be a hole injection layer.

Figure 2:
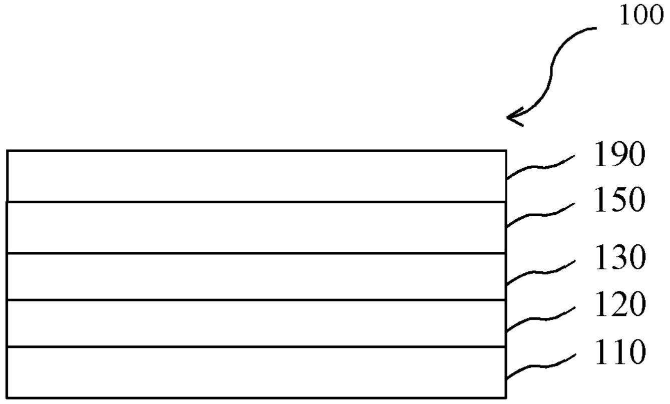
FIG. 2 is a schematic sectional view of an organic light-emitting diode (OLED), according to an exemplary embodiment of the present invention.
Figure 3:
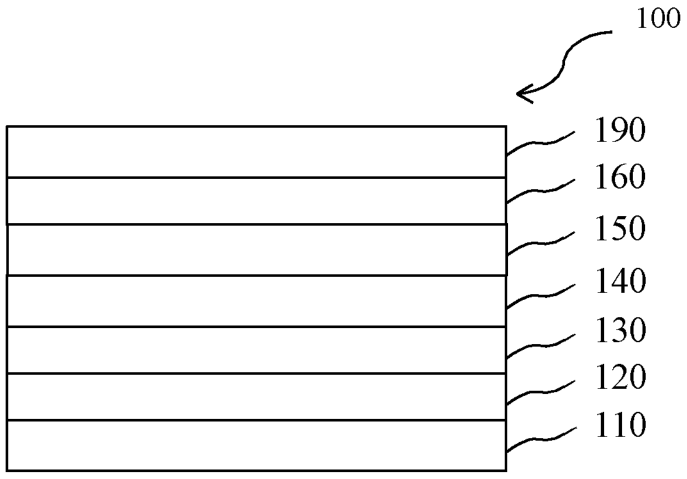
FIG. 3 is a schematic sectional view of an organic light-emitting diode (OLED), according to an exemplary embodiment of the present invention.
Figure 4:
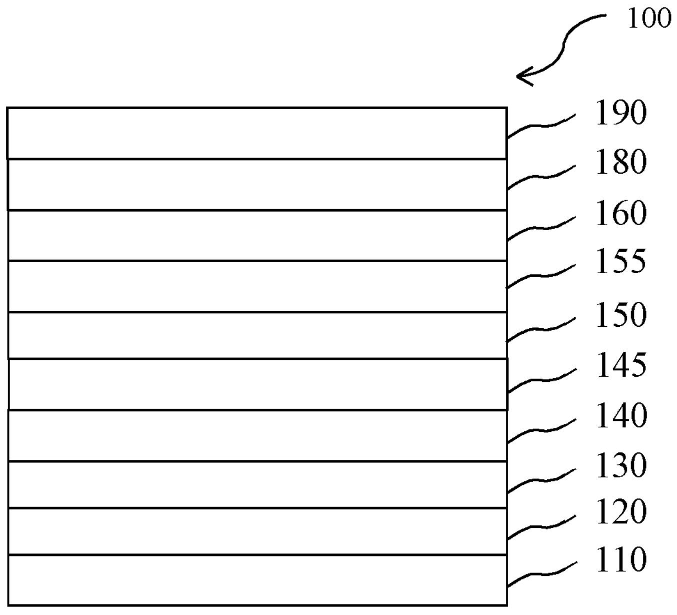
FIG. 4 is a schematic sectional view of an organic light-emitting diode (OLED), according to an exemplary embodiment of the present invention.
Figure 5:
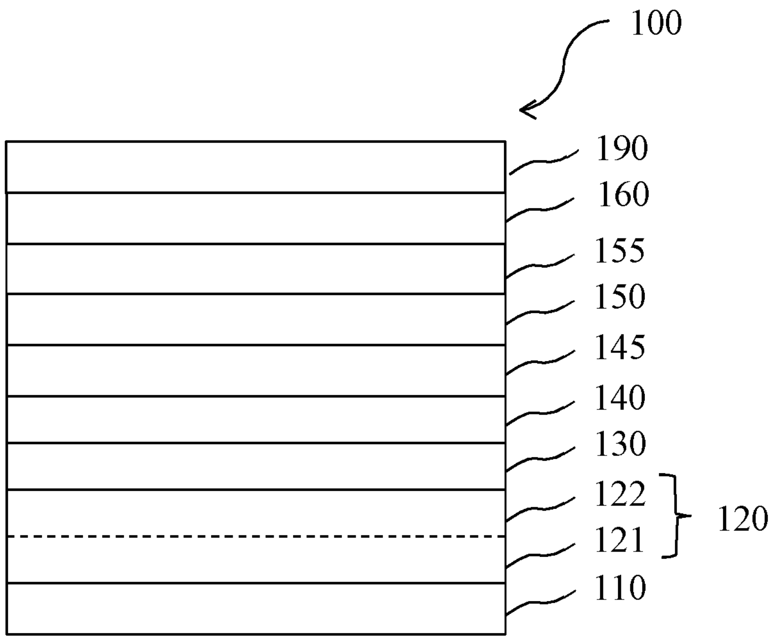
FIG. 5 is a schematic sectional view of an organic light-emitting diode (OLED), according to an exemplary embodiment of the present invention.
Figure 6:
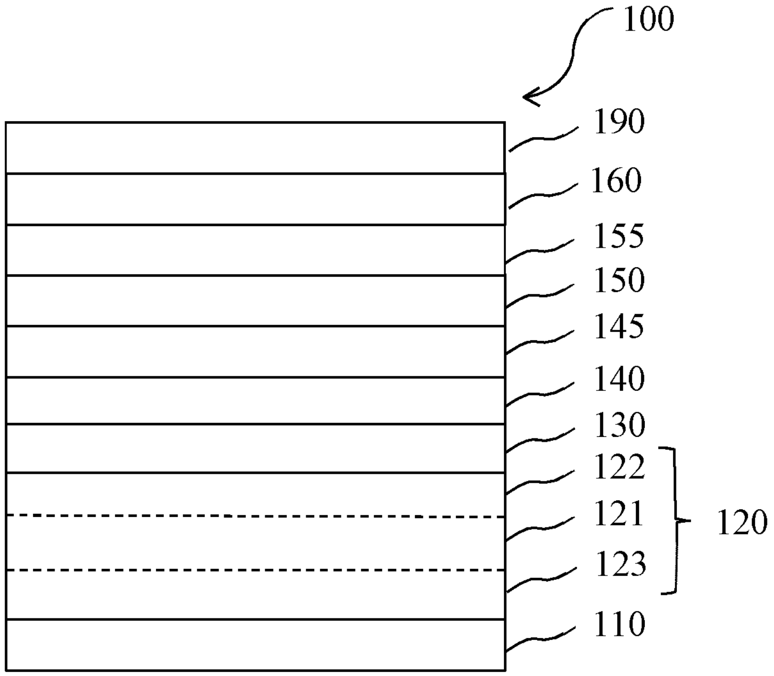
FIG. 6 is a schematic sectional view of an organic light-emitting diode (OLED), according to an exemplary embodiment of the present invention.

While not shown in FIG. 1, FIG. 2, FIG. 3, FIG. 4, FIG. 5 and FIG. 6, a capping layer and/or a sealing layer may further be formed on the cathode electrodes 190, in order to seal the OLEDs 100. In addition, various other modifications may be applied thereto.

Hereinafter, one or more exemplary embodiments of the present invention will be described in detail with, reference to the following examples. However, these examples are not intended to limit the purpose and scope of the one or more exemplary embodiments of the present invention.

LUMO Levels of Compounds of Formula (I)

The LUMO levels of the compounds of formula (I) are calculated with the program package TURBOMOLE V6.5 (TURBOMOLE GmbH, Litzenhardtstrasse 19, 76135 Karlsruhe, Germany).

The energies of the LUMO are obtained from a geometry optimization at the TPSSh/Def2-SVP level of the theory with inclusion of solvent effects via the COSMO (COnductor-like Screening MOdel) model with a dielectric constant (ε) set to be equal to 3. For M=Hf, the basis set Def-SV(P) was used instead. All the calculations were performed with TURBOMOLE. If more than one conformation is viable, the conformation with the lowest total energy is selected. If more than one spin state is viable, the spin state with the lowest total energy is selected.

HOMO and LUMO Levels of the Matrix Compound, Compound of Formula (III) or a Compound of Formula (IV)

The HOMO and LUMO levels of the matrix compound, compound of formula (III) or a compound of formula (IV) are calculated with the program package TURBOMOLE V6.5 (TURBOMOLE GmbH, Litzenhardtstrasse 19, 76135 Karlsruhe, Germany). The optimized geometries and the HOMO and LUMO energy levels of the molecular structures are determined by applying the hybrid functional B3LYP with a 6-31G* basis set in the gas phase. If more than one conformation is viable, the conformation with the lowest total energy is selected. If calculated by this method, the HOMO level of N2,N2,N2',N2',N7,N7,N7',N7'-octakis(4-methoxyphenyl)-9,9'-spirobi[fluorene]-2,2',7,7'-tetraamine is −4.27 eV.

Melting Point $T_m$

The melting point $T_m$ is determined as peak temperatures from the DSC curves of the above TGA-DSC measurement or from separate DSC measurements (Mettler Toledo DSC822e, heating of samples from room temperature to completeness of melting with heating rate 10 K/min under a stream of pure nitrogen. Sample amounts of 4 to 6 mg are placed in a 40 μL Mettler Toledo aluminum pan with lid, a <1 mm hole is pierced into the lid).

Decomposition Temperature $T_{dec}$

The decomposition temperature $T_{dec}$ is measured by loading a sample of 9 to 11 mg into a Mettler Toledo 100 μL aluminum pan without lid under nitrogen in a Mettler Toledo TGA-DSC 1 machine. The following heating program was used: 25° C. isothermal for 3 min; 25° C. to 600° C. with 10 K/min. The decomposition temperature was determined based on the onset of the decomposition in TGA.

Sublimation Temperature

Under nitrogen in a glovebox, 0.5 to 5 g compound are loaded into the evaporation source of a sublimation apparatus. The sublimation apparatus consist of an inner glass tube consisting of bulbs with a diameter of 3 cm which are placed inside a glass tube with a diameter of 3.5 cm. The sublimation apparatus is placed inside a tube oven (Creaphys DSU 05/2.1). The sublimation apparatus is evacuated via a membrane pump (Pfeiffer Vacuum MVP 055-3C) and a turbo pump (Pfeiffer Vacuum THM071 YP). The pressure is measured between the sublimation apparatus and the turbo pump using a pressure gauge (Pfeiffer Vacuum PKR 251). When the pressure has been reduced to 10−5 mbar, the temperature is increased in increments of 10 to 30 K till the compound starts to be deposited in the harvesting zone of the sublimation apparatus. The temperature is further increased in increments of 10 to 30 K till a sublimation rate is achieved where the compound in the source is visibly depleted over 30 min to 1 hour and a substantial amount of compound has accumulated in the harvesting zone. The sublimation temperature, also named Tsubl, is the temperature inside the sublimation apparatus at which the compound is deposited in the harvesting zone at a visible rate and is measured in degree Celsius.

Rate Onset Temperature

The rate onset temperature (TRO) is determined by loading 100 mg compound into a VTE source. As VTE source a point source for organic materials may be used as supplied by Kurt J. Lesker Company (www.lesker.com) or CreaPhys GmbH (http://www.creaphys.com). The VTE source is heated at a constant rate of 15 K/min at a pressure of less than 10−5 mbar and the temperature inside the source measured with a thermocouple. Evaporation of the compound is detected with a QCM detector which detects deposition of the compound on the quartz crystal of the detector. The deposition rate on the quartz crystal is measured in Angstrom per second. To determine the rate onset temperature, the deposition rate is plotted against the VTE source temperature. The rate onset is the temperature at which noticeable deposition on the QCM detector occurs. For accurate results, the VTE source is heated and cooled three time and only results from the second and third run are used to determine the rate onset temperature.

To achieve good control over the evaporation rate of an organic compound, the rate onset temperature may be in the range of 200 to 255° C. If the rate onset temperature is below 200° C. the evaporation may be too rapid and therefore difficult to control. If the rate onset temperature is above 255° C. the evaporation rate may be too low which may result in low tact time and decomposition of the organic compound in VTE source may occur due to prolonged exposure to elevated temperatures.

The rate onset temperature is an indirect measure of the volatility of a compound. The higher the rate onset temperature the lower is the volatility of a compound.

General Method for Preparation of the Ink Formulation

To prepare the ink formulation, under inert atmosphere the compounds were weighed into vials. Then, the solvent was added. The mixture was stirred at 60° C. for 10 min. After cooling to room temperature, an aliquot of benzonitrile solutions was added to the anisole solution to obtain a solution with a ratio of 5:1 of anisole to benzonitrile solution. The resulting solution was stirred again for at least 10 min at room temperature. The resulting ink formulation had a solid content of 3 wt.-%.

EXPERIMENTAL DATA

Synthesis Examples

Compounds of formula (I) may be prepared by known methods or as described below.

Synthesis of 1,3-bis(3,5-bis(trifluoromethyl)phenyl)propane-1,3-dione

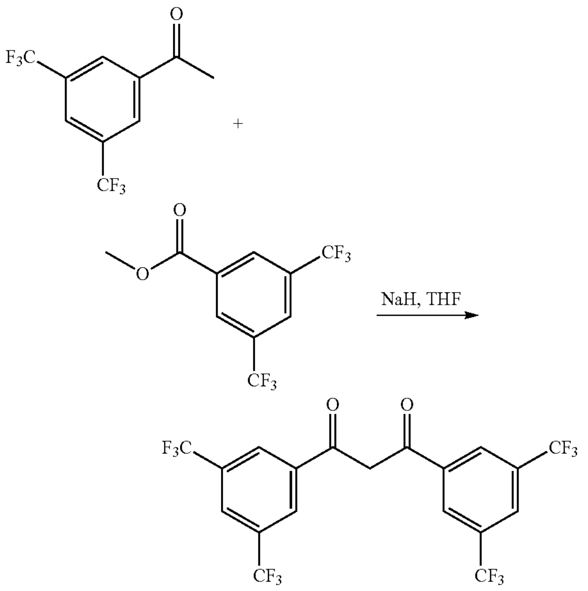

To a suspension of NaH (2.34 g, 100 mmol) in 100 ml THF was added dropwise 1-(3,5-bis(trifluoromethyl)phenyl)ethan-1-one (10 g, 39 mmol) and methyl 3,5-bis(trifluoromethyl)benzoate (11.7 g, 43 mmol) dissolved together in 50 ml THF. The resulting mixture was refluxed for 30 h. The reaction mixture was cooled to RT and ice-cold 10% HCl (200 ml) was added during rapidly stirring. $Et_2O$ was added (250 ml) and organic phase was separated, washed with water and dried over $Na_2SO_4$, concentrated. Crude product was triturated in hexane with traces of $Et_2O$ for 3 h, filtered, washed with hexane and dried. Yield 13.4 g (69%).

Synthesis of 2-(3,5-bis(trifluoromethyl)benzoyl)-3-(3,5-bis(trifluoromethyl)phenyl)-3-oxopropanenitrile

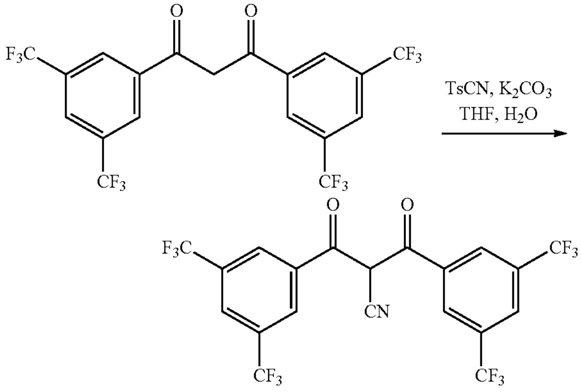

To a solution of 17.37 g (35 mmol) of 1,3-bis(3,5-bis(trifluoromethyl)phenyl)propane-1,3-dione and $K_2CO_3$ (7.26 g, 52.5 mmol) in THF-water was added p-Tolylsulfonylcyanid (9.51 g, 52.5 mmol) in one portion and the resulting mixture was stirred at RT for 3 h. The reaction mixture was cooled to 0° C., acidified with aq. 2M HCl, and extracted 2×500 ml of ethyl acetate. The combined organic phases were dried over MgSO4 and concentrated. Crude product was triturated in mixture of 100 ml hexane and 10 ml ethyl acetate for 1 h. Solid precipitate was filtered and washed with hexane. Filtrate was purified by chromatography on silica gel (DCM/Ethyl acetate/Hexane). Fractions with product were concentrated followed by acidic extraction (aq. 2M HCl/ethyl acetate). The combined organic phases were dried over MgSO4 and concentrated. Product was triturated in 20% $Et_2O$ in hexane for 2 h, solid was filtered, washed with hexane, and dried. Yield 9.52 g (52%).

Synthesis of bis(((Z)-1,3-bis(3,5-bis(trifluoromethyl)phenyl)-2-cyano-3-oxoprop-1-en-1-yl)oxy) copper (MC-1)

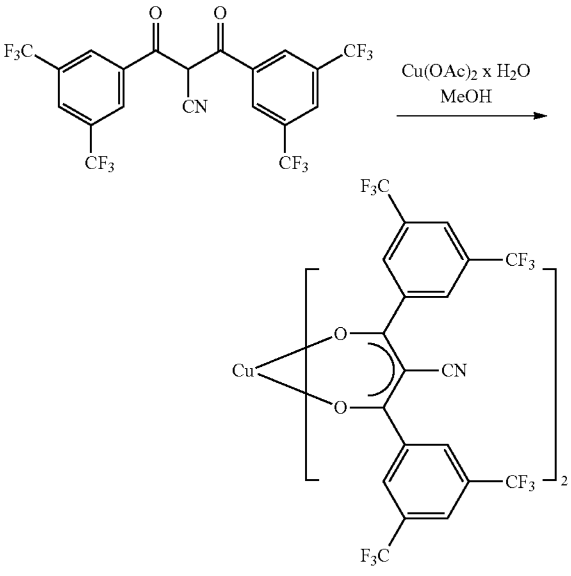

2.42 g (4.64 mmol) of 2-(3,5-bis(trifluoromethyl)benzoyl)-3-(3,5-bis(trifluoromethyl)phenyl)-3-oxopropanenitrile were dissolved in 40 ml methanol and solution of 0.46 g (2.32 mmol) copper(II) acetate monohydrate in 30 ml methanol and 20 ml water was added. The mixture was stirred at room temperature overnight. The precipitate was filtered off, washed with water and dried in high vacuum. 2.29 g (89%) product was obtained as a green powder.

Synthesis of 2-(3',5'-bis(trifluoromethyl)-[1,1'-biphenyl]-4-carbonyl)-4,4,5,5,5-pentafluoro-3-oxopentanenitrile

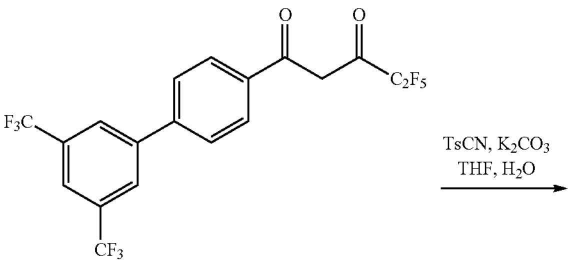

-continued

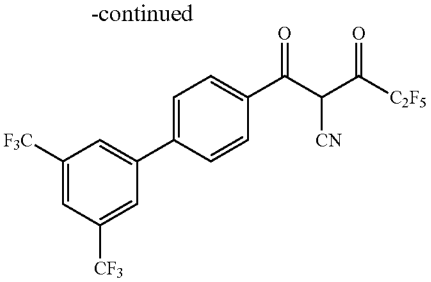

To a solution of 16.7 g (35 mmol) of 1-(3',5'-bis(trifluoromethyl)-[1,1'-biphenyl]-4-yl)-4,4,5,5,5-pentafluoropentane-1,3-dione and $K_2CO_3$ (7.26 g, 52.5 mmol) in THF-water was added p-Tolylsulfonylcyanid (9.51 g, 52.5 mmol) in one portion and the resulting mixture was stirred at RT for 20 h. THF was removed and 300 ml water and 300 ml DCM were added and stirred in ice/water bath for 30 min. White solid was filtered and washed with 2×300 ml water and 2×300 ml DCM and dried. Crude material was suspended in 100 ml DCM and 60 ml 1M HCl for 30 min, Layers were separated. Organic phase was washed with 30 ml of 1M HCl. Combined aq. phases were washed with 100 ml DCM. Combined organic phases were washed with 100 ml water, dried over $MgSO_4$ and concentrated at 40° C. 100 ml hexane was added and stirred with 5 ml DCM in ice/water bath for 1 h. Solid was filtered, washed with cold hexane and dried. 14.27 g (yield 81%).

Synthesis of bis(((Z)-1-(3',5'-bis(trifluoromethyl)-[1,1'-biphenyl]-4-yl)-2-cyano-4,4,5,5,5-pentafluoro-3-oxopent-1-en-1-yl)oxy)copper (MC-2)

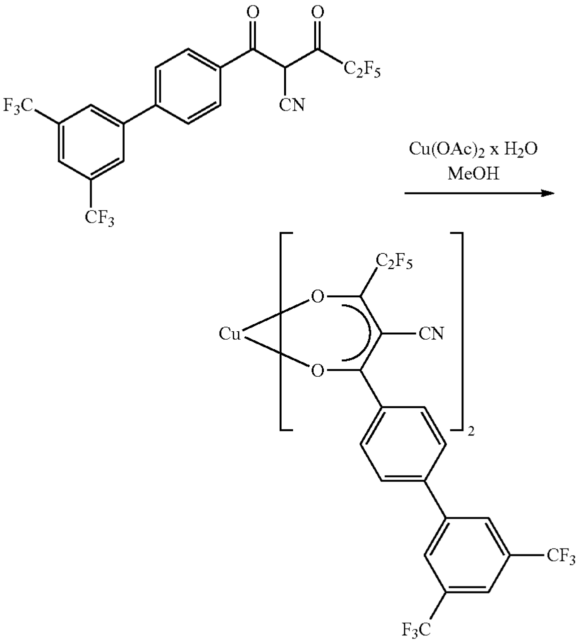

5.0 g (9.94mmol) of 2-(3',5'-bis(trifluoromethyl)-[1,1'-biphenyl]-4-carbonyl)-4,4,5,5,5-pentafluoro-3-oxopentanenitrile were dissolved in 50 ml methanol and 0.99 g (4.97mmol) copper(II) acetate monohydrate and 20 ml water were added. The mixture was stirred at room temperature overnight. The precipitate was filtered off, washed with water and dried in high vacuum. The crude product was crystallized from chloroform/ethyl acetate to obtain 3.60 g (68%) product as a green solid.

Synthesis of N-methoxy-N-methyl-2-(trifluoromethyl)isonicotinamide

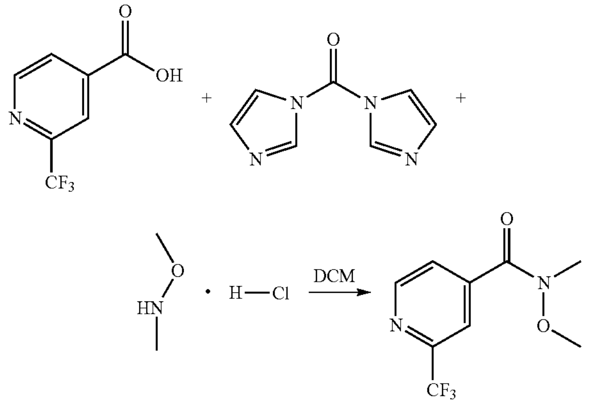

Flask was charged with 2-(trifluoromethyl)isonicotinic acid (20.1 g, 100 mmol), dichloromethane (100 ml) and CDI (19.4 g, 120 mmol) was added within 10 min. RM (reaction mixture) was stirred at r.t. for 1.5 h. Then, N,O-dimethyl hydroxylamine hydrochloride (14.6 g, 150mmol) was added and reaction mixture was stirred at r.t. for 17 h (overnight). Reaction was quenched with 1 M sol. of NaOH (50 mL) and extracted with dichloromethane (2×100 mL). Combined organic layers were washed with water, brine and solvent was evaporated in vacuo to give colorless oil (20.5 g, yield 87%).

Synthesis of 1-(2-(trifluoromethyl)pyridin-4-yl)propan-1-one

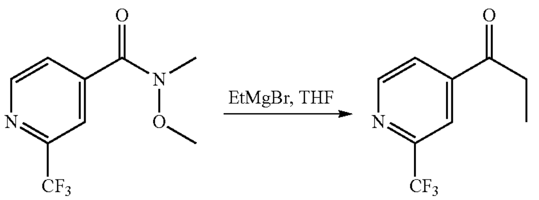 [SMILES: CON(C)C(=O)c1ccnc(C(F)(F)F)c1 ; CCC(=O)c1ccnc(C(F)(F)F)c1]

Flask was charged with N-methoxy-N-methyl-2-(trifluoromethyl)isonicotinamide (20.3 g, 87 mmol), evacuated and filled with Ar. THF was added and RM was cooled to −79° C. Then, EtMgBr (3M in THF, 130 mmol)) was added dropwise within 15 min. The reaction mixture was stirred at −79° C. for 1 h and then 0° C. for 2 h. Upon completion, the reaction mixture was poured into sol. of $NH_4Cl$ and extracted with $Et_2O$. Obtained red oil was purified by column chromatography (hexane-ethyl acetate) to give product as yellow liquid (13.2, yield 74%).

Synthesis of 2-methyl-1,3-bis(2-(trifluoromethyl)pyridin-4-yl)propane-1,3-dione

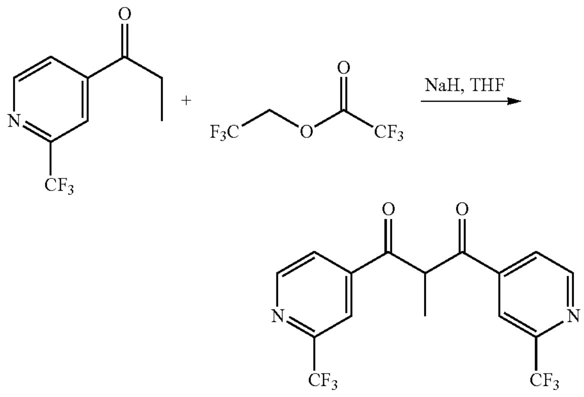

A flask was charged with 1-(2-(trifluoromethyl)pyridin-4-yl)propan-1-one (10.2 g, 50 mmol), evacuated and filled with Ar. THF was added, reaction mixture was cooled to 0° C. and NaH (2.4 g, 100 mmol) was added. Reaction mixture was stirred for 30 min. and 2,2,2-trifluoroethyl trifluoroacetate (5.9 g, 30 mmol) was added dropwise within 20 min and mixture was stirred at 0° C. for 30 min. Upon completion reaction was quenched at 0° C. by diluted HCl and extracted with $Et_2O$, combined organic layers were washed with water, brine, dried over $Na_2SO_4$ and solvent was evaporated in vacuo. The residue was purified by column chromatography (Hexane, ethyl acetate). Obtained yellow solid was triturated with 20 mL of $Et_2O$, filtrated off and washed with cold $Et_2O$. Colorless product was obtained 4.42 g (47%).

Synthesis of bis(((Z)-2-methyl-3-oxo-1,3-bis(2-(trifluoromethyl)pyridin-4-yl)prop-1-en-1-yl)oxy)copper (MC-3)

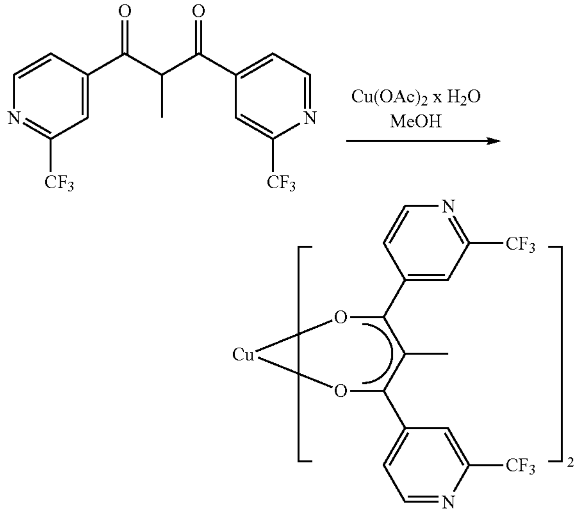

2.50 g (6.64 mmol) of 2-methyl-1,3-bis(2-(trifluoromethyl)pyridin-4-yl)propane-1,3-dione were dissolved in 25ml methanol and 0.66 g (3.32mmol) copper (II) acetate monohydrate and 10 ml water were added. The mixture was stirred at room temperature overnight. The precipitate was filtered off, washed with water and dried in high vacuum. The crude product was stirred in 200 mL hot ethyl acetate, filtered off and dried in high vacuum to obtain 1.97 g (73%) product as a green solid.

Further compounds according to the invention may be prepared by the methods described above or by methods known in the art.

General Procedure for Fabrication of OLEDs

General Procedure for Fabrication of Organic Electronic Devices Comprising a Semiconductor Layer Comprising a Metal Complex and a Matrix Compound wherein the Semiconductor Layer is Deposited in Vacuum For inventive examples 1-1 to 1-7 and comparative examples 1-1 to 1-4 in Table 2 a glass substrate with an anode layer comprising a first anode sub-layer of 120 nm Ag, a second anode sub-layer of 8 nm ITO and a third anode sub-layer of 10 nm ITO was cut to a size of 50 mm×50 mm×0.7 mm, ultrasonically washed with water for 60 minutes and then with isopropanol for 20 minutes. The liquid film was removed in a nitrogen stream, followed by plasma treatment to prepare the anode layer. The plasma treatment was performed in an atmosphere comprising 97.6 vol.-% nitrogen and 2.4 vol.-% oxygen.

Then, the metal complex and the matrix compound were co-deposited in vacuum on the anode layer, to form a hole injection layer (HIL) having a thickness of 10 nm. The composition of the hole injection layer can be seen in Table 2. The formulae of the metal complexes can be seen in Table 1.

Then, the matrix compound was vacuum deposited on the HIL, to form a HTL having a thickness of 123 nm. The compound of formula (II) in the HTL is selected the same as the matrix compound in the HIL. The matrix compound can be seen in Table 2.

Then N-(4-(dibenzo[b,d]furan-4-yl)phenyl)-N-(4-(9-phenyl-9H-fluoren-9-yl)phenyl)-[1,1'-biphenyl]-4-amine (CAS 1824678-59-2) was vacuum deposited on the HTL, to form an electron blocking layer (EBL) having a thickness of 5 nm.

Then 97 vol.-% H09 as EML host and 3 vol.-% BD200 (Sun Fine Chemicals, Korea) as fluorescent blue emitter dopant were deposited on the EBL, to form a blue-emitting first emission layer (EML) with a thickness of 20 nm.

Then a hole blocking layer was formed with a thickness of 5 nm by depositing 2-(3'-(9,9-dimethyl-9H-fluoren-2-yl)-[1,1'-biphenyl]-3-yl)-4,6-diphenyl-1,3,5-triazine on the emission layer EML.

Then the electron transporting layer having a thickness of 31 nm was formed on the hole blocking layer by depositing 50 wt.-% 4'-(4-(4-(4,6-diphenyl-1,3,5-triazin-2-yl)phenyl)naphthalen-1-yl)-[1,1'-biphenyl]-4-carbonitrile and 50 wt.-% of LiQ.

Then Ag:Mg (90:10 vol.-%) was evaporated at a rate of 0.01 to 1 Å/s at $10^{-7}$ mbar to form a cathode layer with a thickness of 13 nm on the electron transporting layer.

Then, K1 was deposited on the cathode layer to form a capping layer with a thickness of 75 nm.

The OLED stack is protected from ambient conditions by encapsulation of the device with a glass slide. Thereby, a cavity is formed, which includes a getter material for further protection.

General Method for Preparation of the Ink Formulation

To prepare the ink formulation, under inert atmosphere the compounds were weighed into vials. Then, the solvent was added. The mixture was stirred at 60° C. for 10 min. After cooling to room temperature, an aliquot of benzonitrile solutions was added to the anisole solution to obtain a solution with a ratio of 5:1 of anisole to benzonitrile solution. The resulting solution was stirred again for at least 10 min at room temperature. The resulting ink formulation had a solid content of 3 wt.-%.

Ink Formulation for Inventive Example 2-1

The ink formulation for example 2-1 has the following composition: 10 wt.-% MC-2: K1 in anisole:benzonitrile (5:1). To prepare the ink, solutions of 15 mg MC-2 in 0.8 ml benzonitrile and 139 mg K1 in 4.2 ml anisole were prepared as described above. 0.8 ml benzonitrile solution was added to the anisole solution and stirred as described above.

Ink Formulation for Inventive Example 2-2

The ink formulation for example 2-2 has the following composition: 10 wt.-% MC-3: K1 in anisole:benzonitrile (5:1). To prepare the ink, solutions of 15 mg MC-3 in 0.8 ml benzonitrile and 139 mg K1 in 4.2 ml anisole were prepared as described above. 0.8 ml benzonitrile solution was added to the anisole solution and stirred as described above.

General Procedure for Fabrication of Electronic Devices Comprising a Semiconductor Layer Comprising a Metal Complex and a Matrix Compound wherein the Semiconductor Layer is Deposited from Solution For bottom-emission OLEDs, see Examples 2-1 and 2-2 in Table 3, a 15 $\Omega/cm^2$ glass substrate with 90 nm ITO (available from Corning Co.) with the dimensions 150 mm×150 mm×0.7 mm was ultrasonically washed with isopropyl alcohol for 5 minutes and then with pure water for 5 minutes and dried at elevated temperature.

To form the hole injection layer having a thickness of 45 nm on the anode layer, the substrate is placed on a spin-coater with ITO side facing upwards and fixed with vacuum. 5 ml of ink formulation is applied with a syringe with filter (PTFE—0.45 μm) on the substrate. Spin-coating parameter are 850 rpm (3 sec ramp-up from zero to maximum speed) for 30 sec. The resulting film is dried at 60° C. for 1 minute on a hotplate. Next step is the cleaning of the substrate around the active area (to ensure a good encapsulation process after evaporation). An additional bake-out at 100° C. for 10 minutes on a hotplate is done. The composition of the hole injection layer can be seen in Table 3. The formulae of the metal complexes can be seen in Table 1.

Then, the substrate is transferred to a vacuum chamber.

Then, Biphenyl-4-yl(9,9-diphenyl-9H-fluoren-2-yl)-[4-(9-phenyl-9H-carbazol-3-yl)phenyl]-amine was vacuum deposited on the HIL, to form a first HTL having a thickness of 89 nm.

Then N,N-di([1,1'-biphenyl]-4-yl)-3'-(9H-carbazol-9-yl)-[1,1'-biphenyl]-4-amine (CAS 1464822-27-2) was vacuum deposited on the HTL, to form an electron blocking layer (EBL) having a thickness of 5 nm.

Then 97 vol.-% H09 (Sun Fine Chemicals, Korea) as EML host and 3 vol.-% BD200 (Sun Fine Chemicals, Korea) as fluorescent blue dopant were deposited on the EBL, to form a first blue-emitting emission layer (EML) with a thickness of 20 nm.

Then a hole blocking layer is formed with a thickness of 5 nm by depositing 2-(3'-(9,9-dimethyl-9H-fluoren-2-yl)-[1, 1'-biphenyl]-3-yl)-4,6-diphenyl-1,3,5-triazine on the emission layer.

Then, the electron transporting layer having a thickness of 31 nm is formed on the hole blocking layer by depositing 4'-(4-(4-(4,6-diphenyl-1,3,5-triazin-2-yl)phenyl)naphthalen-1-yl)-[1,1'-biphenyl]-4-carbonitrile and LiQ in a ratio of 50:50 vol.-%.

Then, an electron injection layer is formed having a thickness of 2 nm by depositing Yb onto the electron transport layer.

Then, Al is evaporated at a rate of 0.01 to 1 Å/s at 10−7 mbar to form a cathode layer with a thickness of 100 nm onto the electron injection layer.

The OLED stack is protected from ambient conditions by encapsulation of the device with a glass slide. Thereby, a cavity is formed, which includes a getter material for further protection.

To assess the performance of the inventive examples compared to the prior art, the current efficiency is measured at 20° C. The current-voltage characteristic is determined using a Keithley 2635 source measure unit, by sourcing a voltage in V and measuring the current in mA flowing through the device under test. The voltage applied to the device is varied in steps of 0.1V in the range between 0V and 10V. Likewise, the luminance-voltage characteristics and CIE coordinates are determined by measuring the luminance in cd/m$^2$ using an Instrument Systems CAS-140CT array spectrometer (calibrated by Deutsche Akkreditierungsstelle (DAkkS)) for each of the voltage values. The cd/A efficiency at 10 mA/cm$^2$ is determined by interpolating the luminance-voltage and current-voltage characteristics, respectively.

In bottom emission devices, the emission is predominately Lambertian and quantified in percent external quantum efficiency (EQE). The light is emitted through the anode layer. To determine the efficiency EQE in % the light output of the device is measured using a calibrated photodiode at 10 mA/cm2.

In top emission devices, the emission is forward directed through the cathode layer, non-Lambertian and also highly dependent on the mirco-cavity. Therefore, the efficiency EQE will be higher compared to bottom emission devices. To determine the efficiency EQE in % the light output of the device is measured using a calibrated photodiode at 10 mA/cm$^2$.

Lifetime LT of the device is measured at ambient conditions (20° C.) and 30 mA/cm$^2$, using a Keithley 2400 source meter, and recorded in hours.

The brightness of the device is measured using a calibrated photo diode. The lifetime LT is defined as the time till the brightness of the device is reduced to 97% of its initial value.

To determine the voltage stability over time U (100 h)-(1 h), a current density of at 30 mA/cm$^2$ was applied to the device. The operating voltage was measured after 1 hour and after 100 hours, followed by calculation of the voltage stability for the time period of 1 hour to 100 hours. A low value for U (100 h)-(1 h) denotes a low increase in operating voltage over time and thereby improved voltage stability.

Technical Effect of the invention

In Table 1a are shown LUMO levels of compounds of formula (I) and comparative compound CC-7.

TABLE 1a

| Compound of formula (I) | | | |
|---|---|---|---|
| Example | Name | Chemical formula | LUMO (eV) |
| Comparative compound 7 | CC-7 | 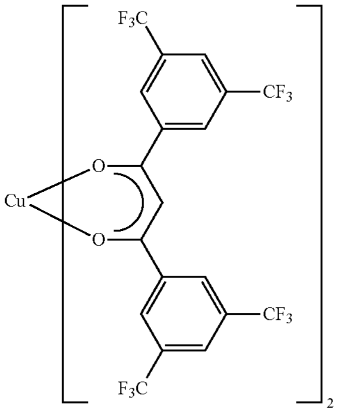 | −3.92 (β) |

TABLE 1a-continued
| Compound of formula (I) | | | |
|---|---|---|---|
| Example | Name | Chemical formula | LUMO (eV) |
| Inventive compound 1 | MC-1 | 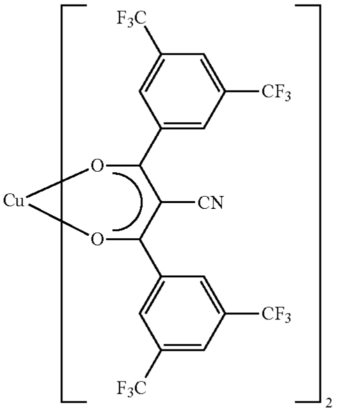 | −4.55 (β) |
| Inventive compound 2 | MC-2 | 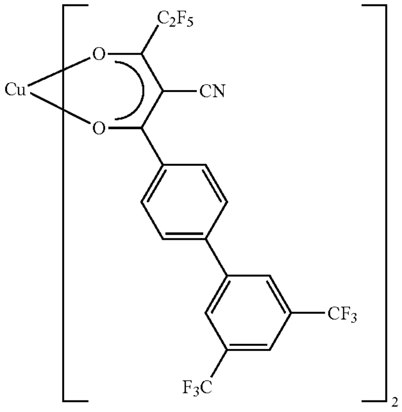 | −4.68 (β) |
| Inventive compound 3 | MC-3 | 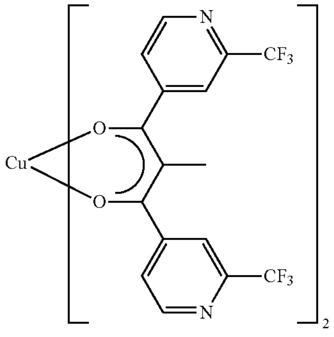 | −3.92 (β) |

TABLE 1a-continued
| Compound of formula (I) | | | |
|---|---|---|---|
| Example | Name | Chemical formula | LUMO (eV) |
| Inventive compound 4 | MC-4 | 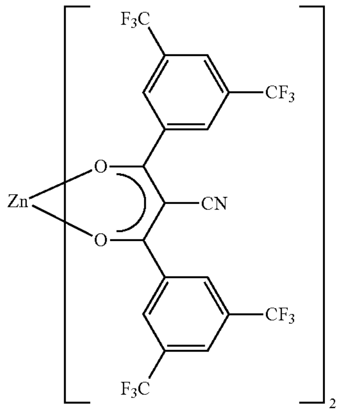 | −3.47 |
| Inventive compound 5 | MC-5 | 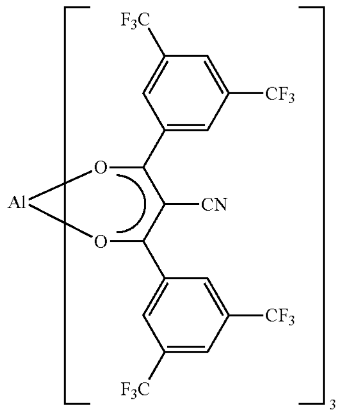 | −3.89 |
| Inventive compound 6 | MC-6 | 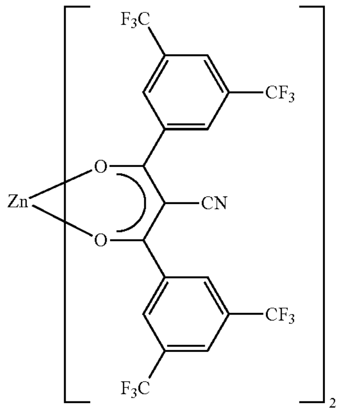 | −3.96 |

TABLE 1a-continued
| Compound of formula (I) | | | |
|---|---|---|---|
| Example | Name | Chemical formula | LUMO (eV) |
| Inventive compound 7 | MC-7 | 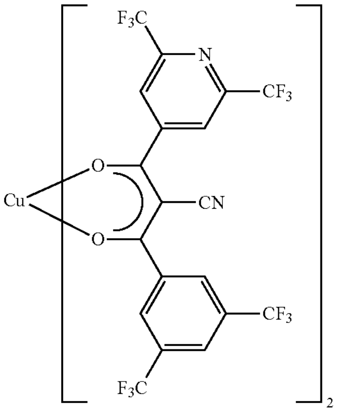 | −4.78 (β) |
| Inventive compound 8 | MC-8 | 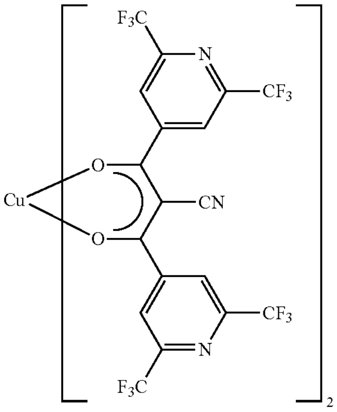 | −5.03 (β) |
| Inventive compound 9 | MC-9 | 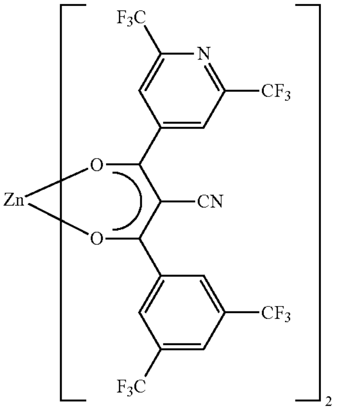 | −3.76 |

TABLE 1a-continued
| Compound of formula (I) | | | |
|---|---|---|---|
| Example | Name | Chemical formula | LUMO (eV) |
| Inventive compound 10 | MC-10 | 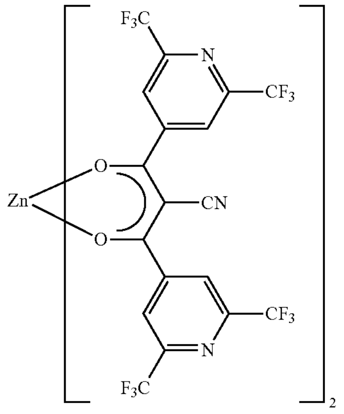 | −4.02 |
| Inventive compound 11 | MC-11 | 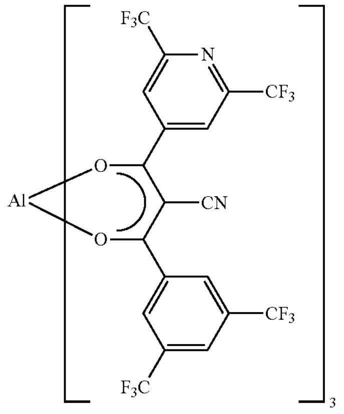 | −4.23 |
| Inventive compound 12 | MC-12 | 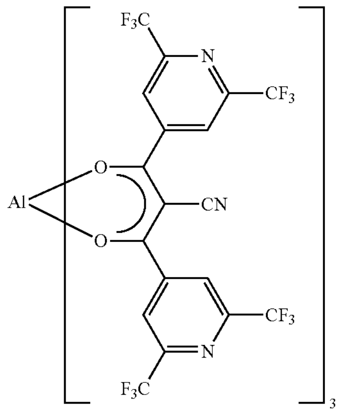 | −4.57 |

TABLE 1a-continued

| Compound of formula (I) | | | |
|---|---|---|---|
| Example | Name | Chemical formula | LUMO (eV) |
| Inventive compound 13 | MC-13 | 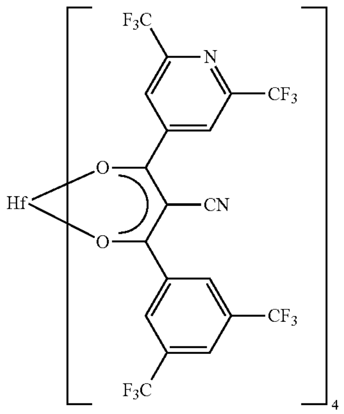 | −4.33 |
| Inventive compound 14 | MC-14 | 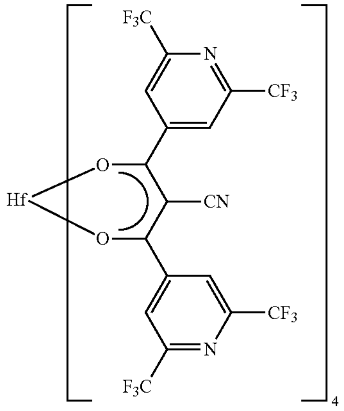 | −4.61 |

As can be seen in Table 1a, the LUMO levels of compounds of formula (I) are in a range similar to comparative compound CC-7, see MC-3 to MC-5 and MC-9, or further away from vacuum level compared to comparative compound CC-7, see MC-1, MC-2, MC-6 to MC-8 and MC-10 to MC-14.

Without being bound by theory, a LUMO level≤−3.9 eV may enable particularly efficient injection into adjacent layers comprising compounds with a HOMO level further away from vacuum level. In Table 1b are shown physical properties for inventive compounds 1 to 3 and comparative compounds 1 to 7.

As can be seen in Table 1b, thermal properties ($T_m$, $T_{dec}$, $T_{subl}$, $T_{RO}$) and/or the solubility in benzonitrile are improved over comparative examples.

Improved thermal properties may result in improved performance of organic electronic devices prepared via vacuum thermal evaporation.

Improved solubility in benzonitrile may result in improved manufacturing and/or performance of organic electronic devices prepared via deposition from solution.

In Table 2 are shown data for top emission organic electronic devices fabricated by co-deposition from vacuum of metal complex and matrix compound.

In comparative examples 1-1 to 1-4, two metal complexes known in the art are tested at two different doping concentrations.

As can be seen in Table 2, in comparative examples 1-1 to 1-4 the operating voltage is between 3.67 and 3.78 V, the external quantum efficiency EQE is between 12.9 and 13.91% and the voltage stability over time is between 0.85 and 1.28 V.

In inventive example 1-1, the semiconductor layer comprises a compound of formula (I) MC-1. MC-1 comprises a group $R^2$ selected from CN. As can be seen in Table 2, the EQE is improved to 14.32% and operating voltage stability over time is improved to 0.46 V.

In inventive examples 1-2, the semiconductor layer comprises 15 vol.-% MC-1. As can be seen in Table 2, EQE and operating voltage stability over time remain improved over comparative examples 1-1 to 1-4.

In inventive examples 1-3 to 1-7, the semiconductor layer comprises compounds of formula (1) at a range of doping concentrations and matrix compounds with a range of HOMO levels. As can be seen in Table 2, EQE and operating voltage stability over time are improved over comparative examples 1-1 to 1-4.

In Table 3 are shown data for bottom emission organic electronic devices fabricated by co-deposition from solution of compound of formula (I) and a matrix compound.

As can be seen in Table 3, good performance of organic electronic devices is obtained.

A high efficiency and/or improved operating voltage stability over time are important for the performance and long-term stability of organic electronic devices.

TABLE 1

Properties of comparative compounds 1 to 7 and compounds of Formula (I)

| Example | Name | Formula | Tm [° C.] | Tdec [° C.] | Sublimation temperature Tsubl [° C.] | Rate onset temperature $T_{RO}$ [° C.] | Solubility in benzonitrile [mg/ml at 20° C.] |
|---|---|---|---|---|---|---|---|
| Comparative compound 1 | CC-1 | Cu(acac)2 | 284 (dec) | >280 | 110-120 | <100 | N.D.[1)] |
| Comparative compound 2 | CC-2 | Cu(tfac)2 | 201 | >185 | 95-100 | <100 | N.D. |
| Comparative compound 3 | CC-3 | Bi(tfac)3 | 131 | >100 | decomposition | <100 | N.D. |
| Comparative compound 4 | CC-4 | Bi(hfac)3 | N.D. | N.D. | decomposition | <100 | N.D. |
| Comparative compound 5 | CC-5 | Bi(fod)3 | Not obs. | >200 | 120 | <100 | N.D. |
| Comparative compound 6 | CC-6 | $La(fod)_3$ | Not obs. | >260 | 170 | 101 | N.D. |
| Comparative compound 7 | CC-7 | 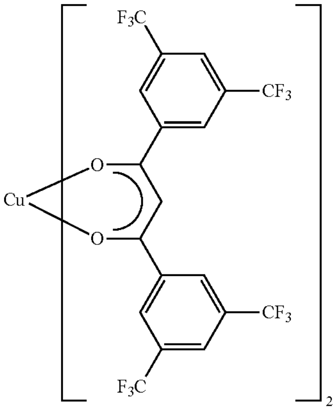 | 223 | >300 | 245 | 170 | <<10 |
| Inventive compound 1 | MC-1 | 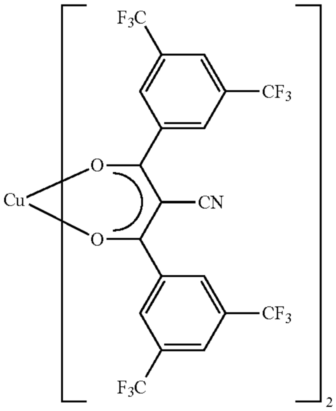 | 312 | >319 | 261 | 204 | N.D. |
| Inventive compound 2 | MC-2 | 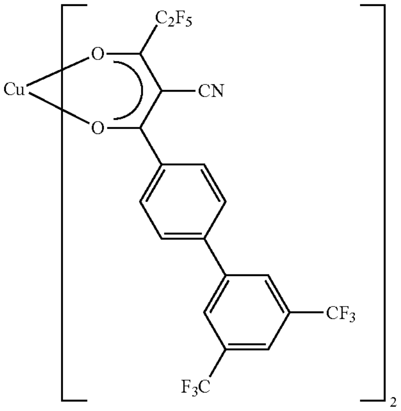 | 256 | >330 | decomposition | N.D. | >10 |

TABLE 1-continued

Properties of comparative compounds 1 to 7 and compounds of Formula (I)

| Example | Name | Formula | Tm [° C.] | Tdec [° C.] | Sublimation temperature Tsubl [° C.] | Rate onset temperature $T_{RO}$ [° C.] | Solubility in benzonitrile [mg/ml at 20° C.] |
|---|---|---|---|---|---|---|---|
| Inventive compound 3 | MC-3 | 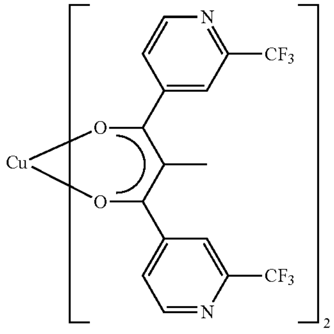 | 302 | >300 | decomposition | N.D. | 10 mg/ml[2)] |

[1)]N.D. = not determined.
[2)]at 60° C.

TABLE 2

Performance of an organic electronic device comprising a metal complex prepared via vacuum thermal evaporation

| | Metal complex | Percentage metal complex in semiconductor layer [vol.-%] | Matrix compound | HOMO level of matrix compound [eV] | Percentage matrix compound in semiconductor layer [vol.-%] | U at 10 $mA/cm^2$ [V] | EQE at 10 $mA/cm^2$ [%] | U(100 h) − U(1 h) (30 $mA/cm^2$) [V] |
|---|---|---|---|---|---|---|---|---|
| Comparative example 1-1 | CC-6 | 5 | K1 | −4.68 | 95 | 3.67 | 12.99 | 0.85 |
| Comparative example 1-2 | CC-7 | 6 | K1 | −4.68 | 94 | 3.8 | 13.91 | 1.24 |
| Comparative example 1-3 | CC-6 | 9 | K1 | −4.68 | 91 | 3.65 | 12.90 | 0.89 |
| Comparative example 1-4 | CC-7 | 10 | K1 | −4.68 | 90 | 3.78 | 13.81 | 1.28 |
| Inventive example 1-1 | MC-1 | 10 | K1 | −4.68 | 90 | 3.75 | 14.32 | 0.46 |
| Inventive example 1-2 | MC-1 | 15 | K1 | −4.68 | 85 | 3.73 | 14.36 | 0.47 |
| Inventive example 1-3 | MC-1 | 18 | K16 | −4.73 | 82 | 3.81 | 15.42 | 0.07 |
| Inventive example 1-4 | MC-1 | 22 | K16 | −4.73 | 78 | 3.8 | 15.44 | 0.06 |
| Inventive example 1-5 | MC-1 | 15 | K2 | −4.85 | 85 | 3.75 | 14.73 | 0.06 |
| Inventive example 1-6 | MC-1 | 21 | K2 | −4.85 | 79 | 3.74 | 14.72 | 0.03 |
| Inventive example 1-7 | MC-1 | 25 | K2 | −4.85 | 75 | 3.73 | 14.71 | 0.02 |

TABLE 3

Performance of an device comprising a metal complex prepared via deposition from solution

| | Metal complex | Percentage metal complex in semiconductor layer [vol.-%] | Matrix compound | Percentage matrix compound in semiconductor layer [vol.-%] | U at 10 $mA/cm^2$ [V] | EQE at 10 $mA/cm^2$ [%] |
|---|---|---|---|---|---|---|
| Inventive example 2-1 | MC-2 | 10 | K1 | 90 | 3.83 | 13.06 |
| Inventive example 2-2 | MC-3 | 10 | K1 | 90 | 3.85 | 13.41 |

The particular combinations of elements and features in the above detailed embodiments are exemplary only; the interchanging and substitution of these teachings with other teachings in this and the patents/applications incorporated by reference are also expressly contemplated. As those skilled in the art will recognize, variations, modifications, and other implementations of what is described herein can occur to those of ordinary skill in the art without departing from the spirit and the scope of the invention as claimed. Accordingly, the foregoing description is by way of example only and is not intended as limiting. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. The invention's scope is defined in the following claims and the equivalents thereto. Furthermore, reference signs used in the description and claims do not limit the scope of the invention as claimed.

The invention claimed is:

1. A compound of Formula (I):

(I)

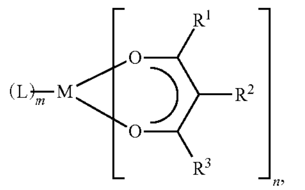

wherein

M is Cu, Zn, Al, Hf;

L is a charge-neutral ligand, which coordinates to the metal M;

n is an integer selected from 2, 3 or 4, which corresponds to the oxidation number of M;

m is an integer selected from 0 to 2;

$R^1$ is independently selected from substituted or unsubstituted $C_6$ to $C_{24}$ aryl and substituted or unsubstituted $C_2$ to $C_{24}$ heteroaryl group comprising at least 6 ring-forming atoms, wherein when $R_1$ is the substituted $C_6$ to $C_{24}$ aryl or the substituted $C_2$ to $C_{24}$ heteroaryl group, at least one substituent is selected from F, CN, substituted or unsubstituted $C_1$ to $C_{12}$ alkyl, partially or fully fluorinated $C_1$ to $C_{12}$ alkyl, substituted or unsubstituted $C_6$ to $C_{18}$ aryl, and substituted or unsubstituted $C_2$ to $C_{18}$ heteroaryl, wherein the substituents of the substituted $C_1$ to $C_{12}$ alkyl, substituted $C_6$ to $C_{18}$ aryl, and substituted $C_2$ to $C_{18}$ heteroaryl are selected from halogen, F, CN, $C_1$ to $C_6$ alkyl, $CF_3$; wherein at least one substituent is selected from partially or fully fluorinated $C_1$ to $C_{12}$ alkyl, or CN;

$R^2$ is selected from CN, $C_1$ to $C_4$ alkyl, partially or perfluorinated $C_1$ to $C_4$ alkyl, or F;

$R^3$ is independently selected from substituted $C_1$ to $C_{12}$ alkyl, substituted or unsubstituted $C_6$ to $C_{24}$ aryl, and substituted or unsubstituted $C_2$ to $C_{24}$ heteroaryl group comprising at least 6 ring-forming atoms, wherein when $R_3$ is the substituted $C_1$ to $C_{12}$ alkyl, the substituted $C_6$ to $C_{24}$ aryl, or the substituted $C_2$ to $C_{24}$ heteroaryl group, at least one substituent is selected from F, CN, substituted or unsubstituted $C_1$ to $C_{12}$ alkyl, partially or fully fluorinated $C_1$ to $C_{12}$ alkyl, substituted or unsubstituted $C_6$ to $C_{18}$ aryl, and substituted or unsubstituted $C_2$ to $C_{18}$ heteroaryl, wherein the substituents of the substituted $C_1$ to $C_{12}$ alkyl, substituted $C_6$ to $C_{18}$ aryl, and substituted $C_2$ to $C_{18}$ heteroaryl are selected from F, CN, $C_1$ to $C_6$ alkyl, $CF_3$;

wherein the following compounds are excluded M=Cu, n=2, m=0, and $R^1$=4-(trifluoromethyl)phenyl, $R^2$=CN, $R^3$=benzyl; and M=Cu, n=2, m=0, and $R^1$=pentafluorophenyl, $R^2$=CN, $R^3$=benzyl.

2. The compound represented by Formula (I) according to claim 1, wherein the compounds A1 to A12 are excluded:

(A1)

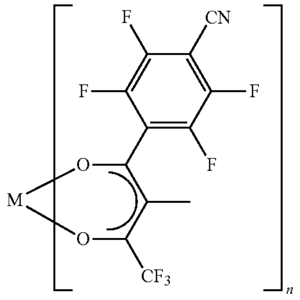

, (A2)

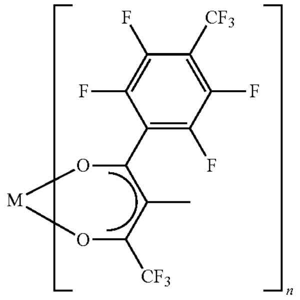

, (A3)

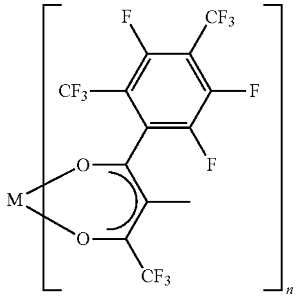

,

-continued (A4)

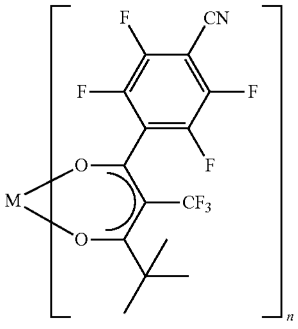

, (A5)

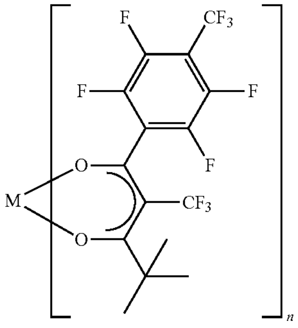

, (A6)

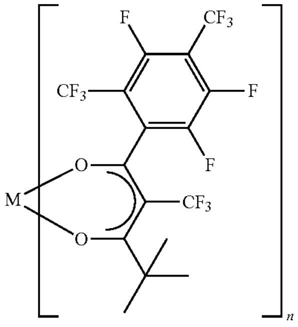

, (A7)

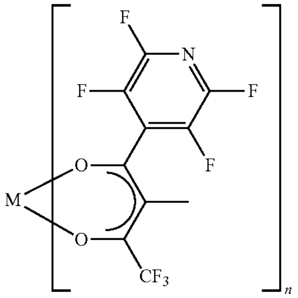

, (A8)

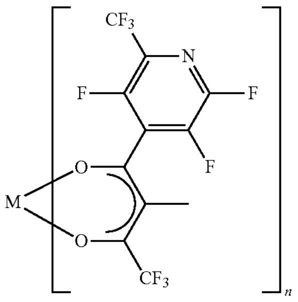

,

-continued (A9)

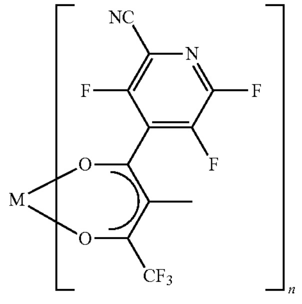

, (A10)

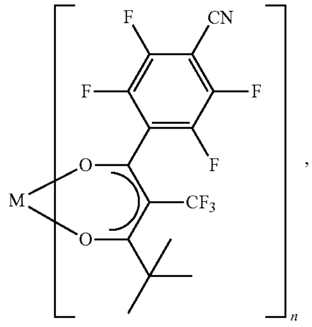

, (A11)

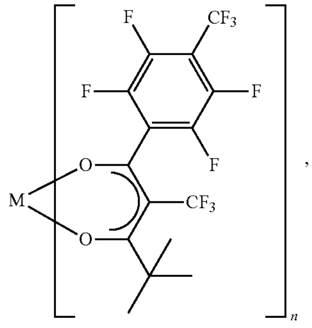

, (A12)

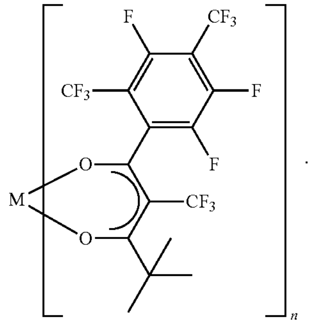

.

3. The compound represented by Formula (I) according to claim 1, wherein $R^2$ is selected from CN, $CH_3$, $CF_3$, $C_2F_5$, $C_3F_7$ or F.

4. The compound represented by Formula (I) according to claim 1, wherein a $R^1$ and/or $R^3$ is selected from a substituted $C_6$ to $C_{24}$ aryl or substituted $C_2$ to $C_{24}$ heteroaryl group, wherein at least one substituent or at least two substituents of the substituted $C_6$ to $C_{24}$ aryl or substituted $C_2$ to $C_{24}$ heteroaryl group is selected from CN or partially or fully fluorinated $C_1$ to $C_{12}$ alkyl, partially or fully fluorinated $C_1$ to $C_4$ alkyl.

5. The compound represented by Formula (I) according to claim 1, wherein the compound of formula (I) comprises a group selected from the group comprising at least one $CF_3$ group, at least two $CF_3$ groups, at least three $CF_3$ groups, at least four $CF_3$ groups, at least two $CF_3$ groups, at least one $C_2F_5$, at least two $CF_3$ groups, at least one group selected from CN, F or $CH_3$.

6. The compound represented by Formula (I) according to claim 1, wherein at least one of $R^1$ and $R^3$ is selected from the group comprising a substituted or unsubstituted $C_6$ to $C_{24}$ aryl, a substituted $C_2$ to $C_{24}$ heteroaryl group comprising at least 6 ring-forming atoms, a group of the following Formulas D1 to D71:

(D1)

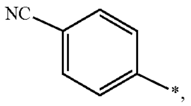

(D2)

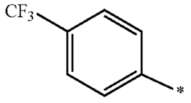

(D3)

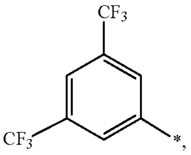

(D4)

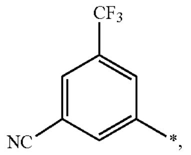

(D5)

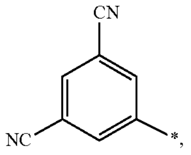

(D6)

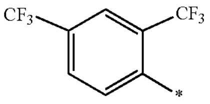

(D7)

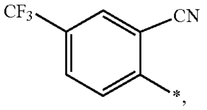

(D8)

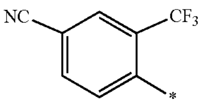

(D9)

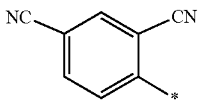

-continued (D10)

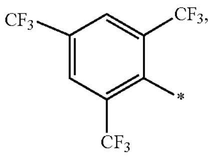

(D11)

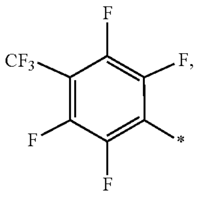

(D12)

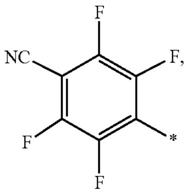

(D13)

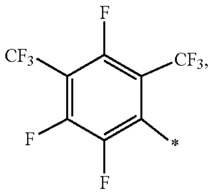

(D14)

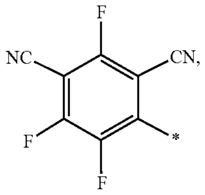

(D15)

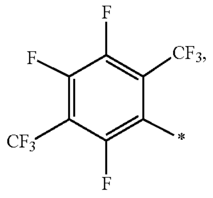

(D16)

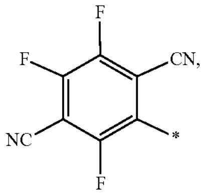

(D17)

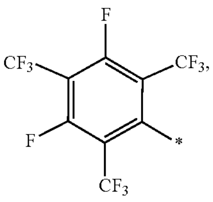

-continued
(D18)
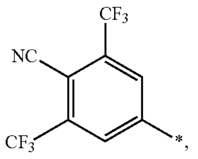
(D19)
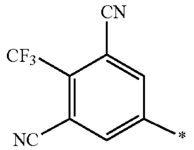
(D20)
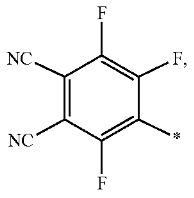
(D21)
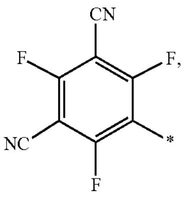
(D22)
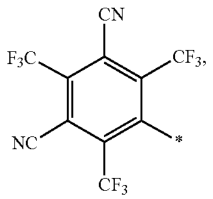
(D23)
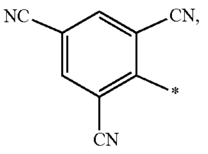
(D24)
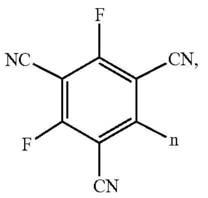
(D25)
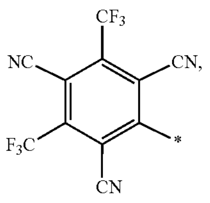
-continued
(D26)
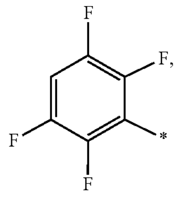
(D27)
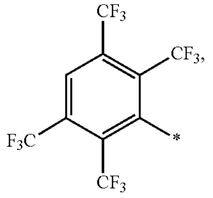
(D28)
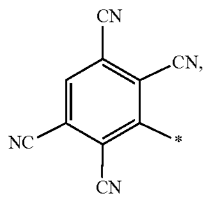
(D29)
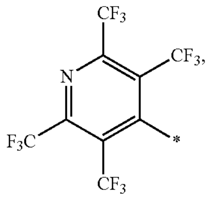
(D30)
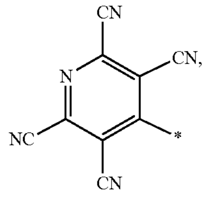
(D31)
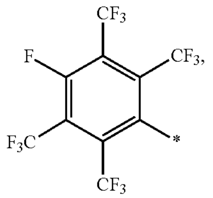
(D32)
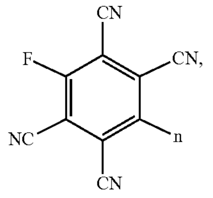
(D33)
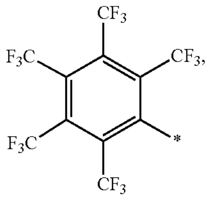

(D34)
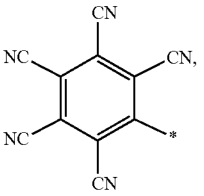
(D35)
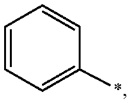
(D36)
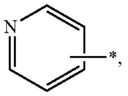
(D37)
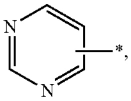
(D38)
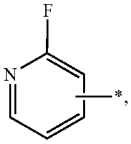
(D39)
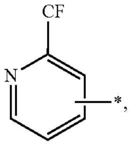
(D40)
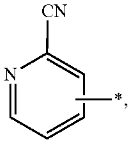
(D41)
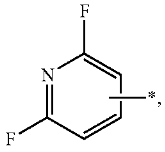
(D42)
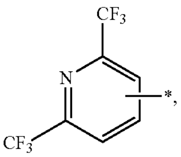
(D43)
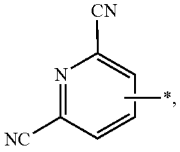
(D44)
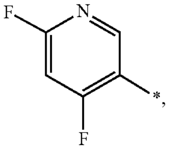
(D45)
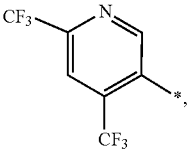
(D46)
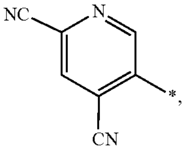
(D47)
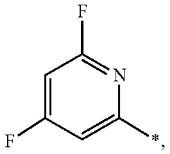
(D48)
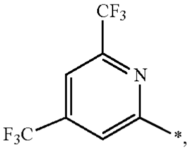
(D49)
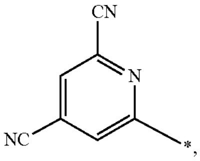
(D50)
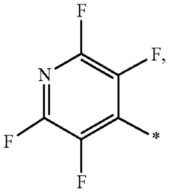
(D51)
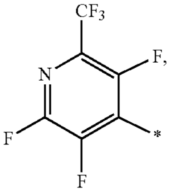
(D52)
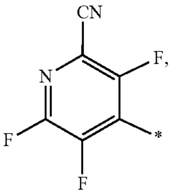

-continued
(D53)
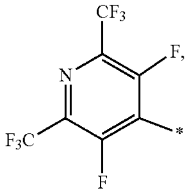
(D54)
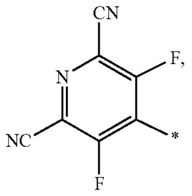
(D56)
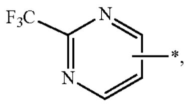
(D57)
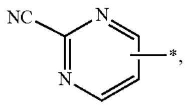
(D58)
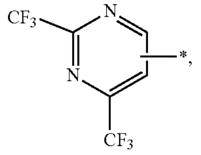
(D59)
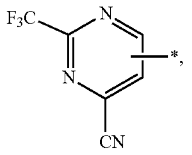
(D60)
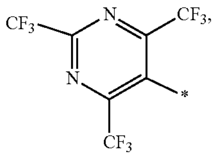
(D61)
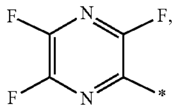
(D62)
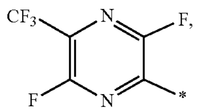
(D63)
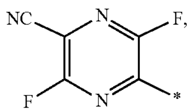
-continued
(D64)
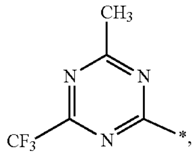
(D65)
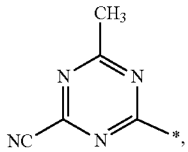
(D67)
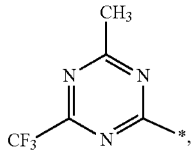
(D68)
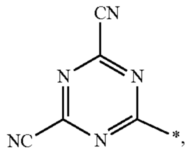
(D69)
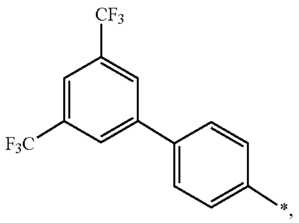
(D70)
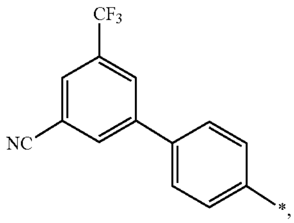
(D71)
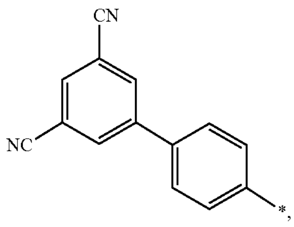
wherein the "*" denotes the binding position.

7. The compound represented by Formula (I) according to claim 1, wherein the compound represented by Formula I is selected from the following Formulas E1 to E20:
(E1)
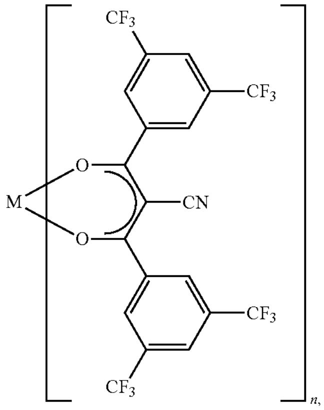
(E2)
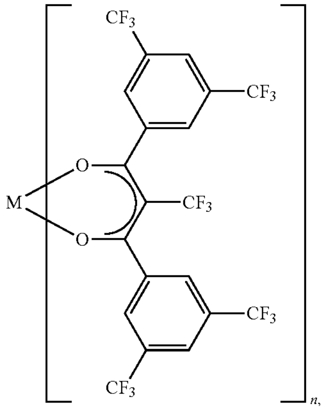
(E3)
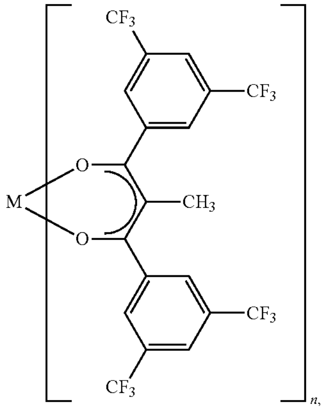
-continued
(E4)
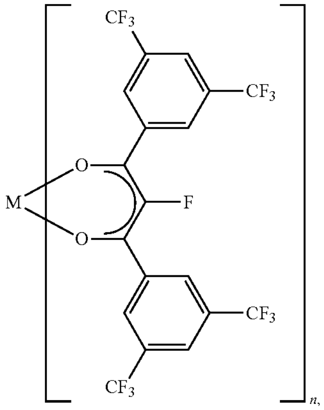
(E5)
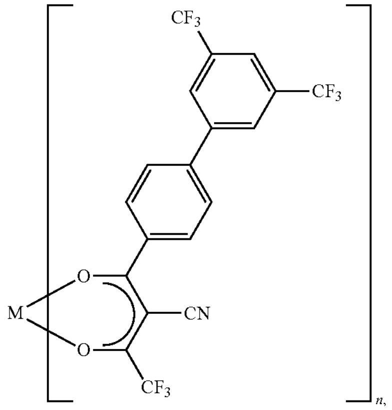
(E6)
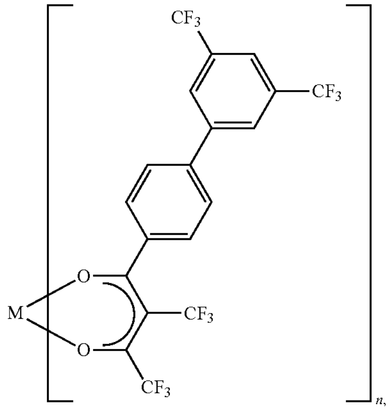
(E7)
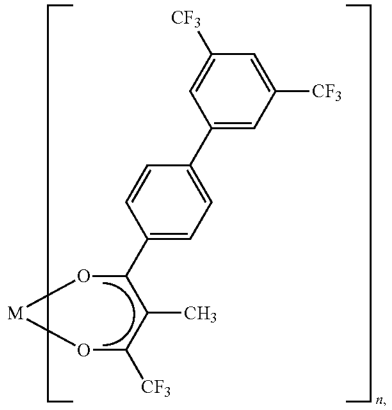

-continued
(E8)
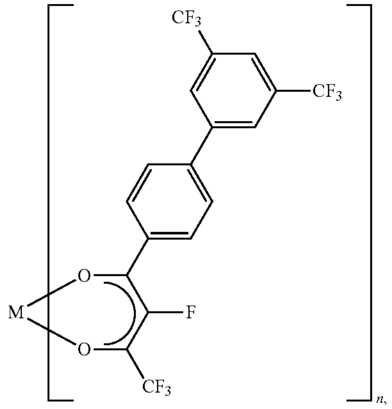
(E9)
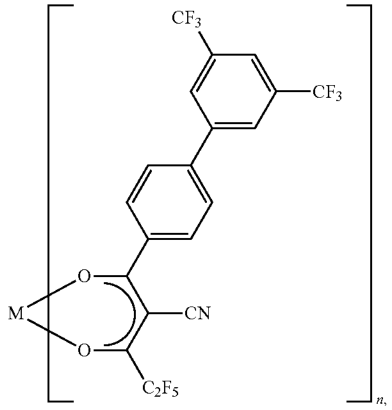
(E10)
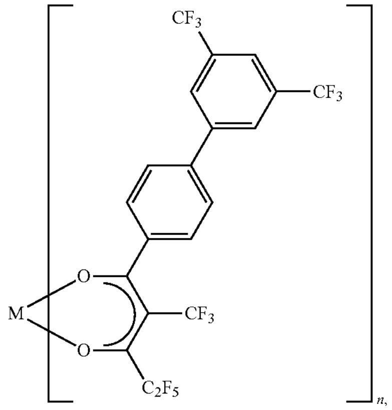
(E11)
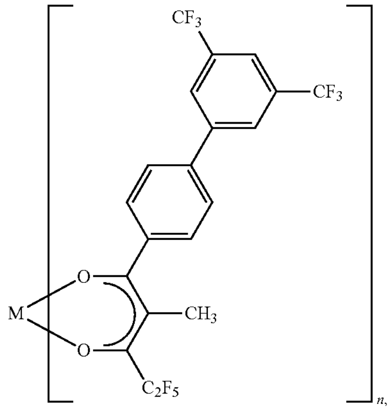
-continued
(E12)
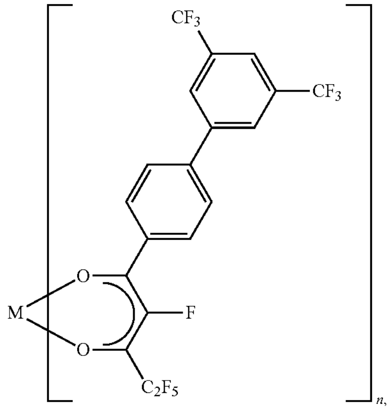
(E13)
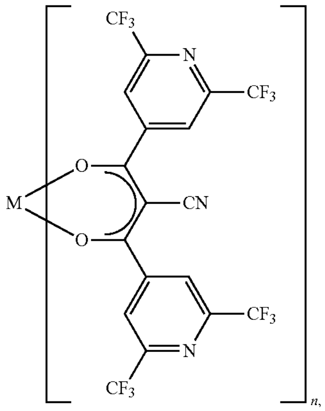
(E14)
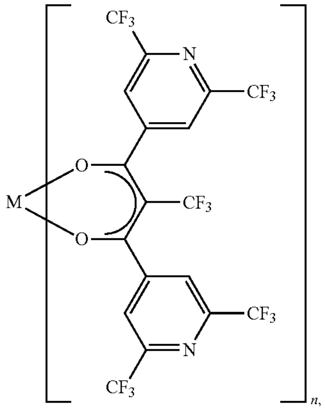
(E15)
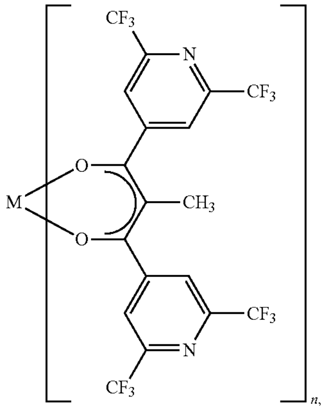

-continued
(E16)
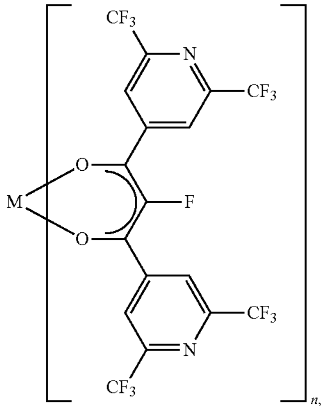
(E17)
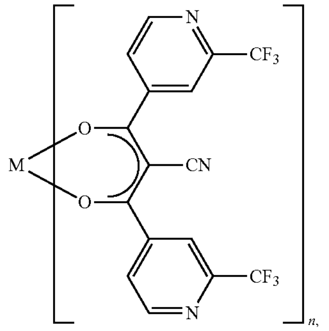
(E18)
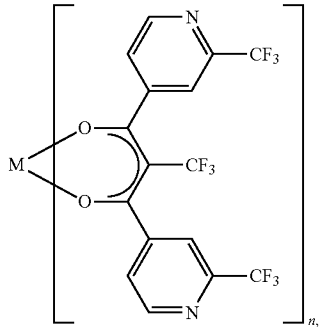
(E19)
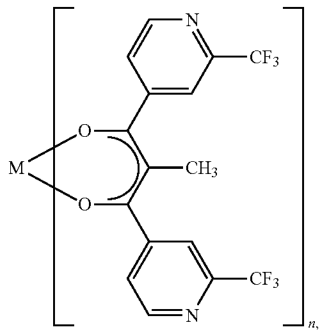
-continued
(E20)
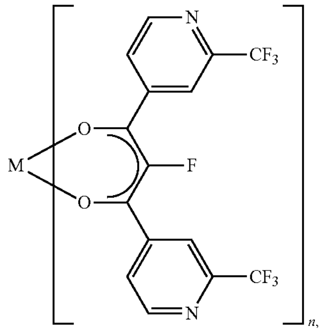
8. The compound represented by Formula (I) according to claim 7, wherein M is Al(III).
9. The compound represented by Formula (I) according to claim 7, wherein M is Cu(II).
10. The compound represented by Formula (I) according to claim 1, wherein the compound represented by Formula I is selected from the following Formulas G1 to G8:
(G1)
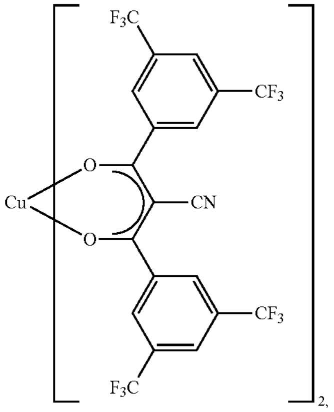
(G2)
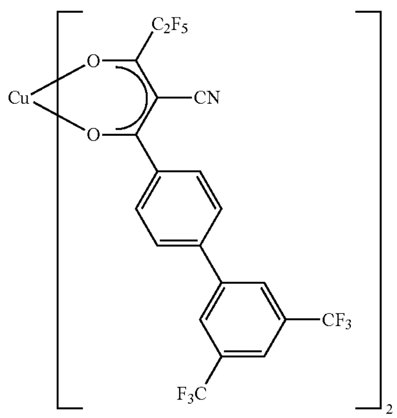

-continued (G3)

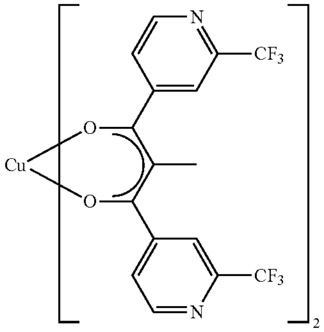

(G4)

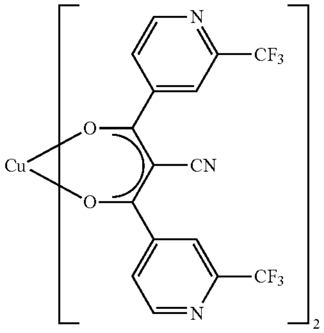

(G5)

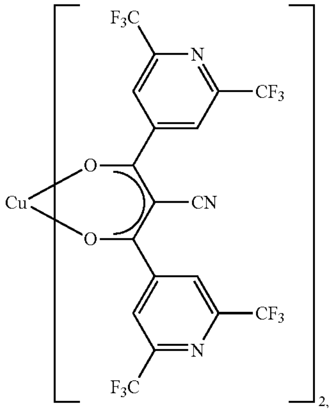

(G6)

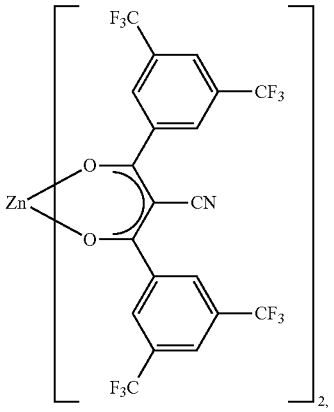

-continued (G7)

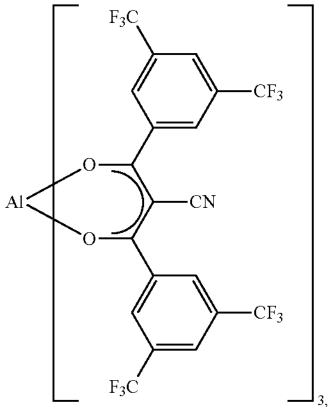

(G8)

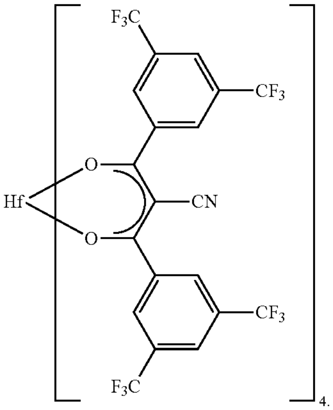

11. The compound represented by Formula (I) according to claim 1, wherein L is selected from the group comprising $H_2O$, $C_2$ to $C_{40}$ mono- or multi-dentate ethers and $C_2$ to $C_{40}$ thioethers, $C_2$ to $C_{40}$ amines, $C_2$ to $C_{40}$ phosphine, $C_2$ to $C_{20}$ alkyl nitrile, $C_2$ to $C_{40}$ aryl nitrile, a compound according to Formula (II);

(II)

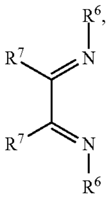

wherein $R^6$ and $R^7$ are independently selected from $C_1$ to $C_{20}$ alkyl, $C_1$ to $C_{20}$ heteroalkyl, $C_6$ to $C_{20}$ aryl, heteroaryl with 5 to 20 ring-forming atoms, halogenated or perhalogenated $C_1$ to $C_{20}$ alkyl, halogenated or perhalogenated $C_1$ to $C_{20}$ heteroalkyl, halogenated or perhalogenated $C_6$ to $C_{20}$ aryl, halogenated or perhalogenated heteroaryl with 5 to 20 ring-forming atoms, at least one $R^6$ and $R^7$ are bridged and form a 5 to 20 member ring, two $R^6$ are bridged and form a 5 to 40 member ring, two $R^7$ are bridged and form a 5 to 40 member ring, two $R^6$ are bridged and form a 5 to 40 member ring comprising an unsubstituted or $C_1$ to $C_{12}$ substituted phenanthroline, two $R^6$ are bridged and form a 5 to 40 member ring comprising an unsubstituted or $C_1$ to $C_{12}$ substituted phenanthroline.

12. The compound represented by Formula (I) according to claim 1, wherein n=2 or 3.

13. The compound represented by Formula (I) according to claim 1, wherein m is an integer selected from 0 or 1.

14. The compound represented by Formula (I) according to claim 1, wherein at least one of $R^1$ and $R^3$ are selected from a substituted $C_2$ to $C_{24}$ heteroaryl group comprising at least 6 ring-forming atoms, wherein the $C_2$ to $C_{24}$ heteroaryl group comprising at least 6 ring-forming atoms is selected from pyridyl, pyrimidinyl, pyrazinyl, triazinyl.

15. A semiconductor material comprising at least one compound of Formula (I) according to claim 1.

16. A semiconductor material according to claim 15, wherein the semiconductor material comprises in addition a matrix material selected from the group of at least one covalent matrix compound or of at least one substantially covalent matrix compound.

17. An organic electronic device comprising a semiconductor material according to claim 15, wherein the organic electronic device is selected from devices comprising a light emitting device, thin film transistor, a battery, a display device, a photovoltaic cell, part of a display device or lighting device.

18. An organic electronic device comprising a compound selected from the group of Formula (I) according to claim 1, wherein the organic electronic device is selected from devices comrising a light emitting device, thin film transistor, a battery, a display device, a photovoltaic cell, a part of a display device or lighting device.

* * * * *